US009762360B2

(12) United States Patent
Limberg

(10) Patent No.: US 9,762,360 B2
(45) Date of Patent: Sep. 12, 2017

(54) DIGITAL TELEVISION BROADCASTING SYSTEM USING CODED ORTHOGONAL FREQUENCY-DIVISION MODULATION WITH MULTILEVEL LOW-DENSITY-PARITY-CHECK CODING

(71) Applicant: Allen LeRoy Limberg, Port Charlotte, FL (US)

(72) Inventor: Allen LeRoy Limberg, Port Charlotte, FL (US)

(*) Notice: Subject to any disclaimer, the term of this patent is extended or adjusted under 35 U.S.C. 154(b) by 29 days.

(21) Appl. No.: 14/867,930

(22) Filed: Sep. 28, 2015

(65) Prior Publication Data

US 2016/0087649 A1    Mar. 24, 2016

Related U.S. Application Data

(63) Continuation-in-part of application No. 14/299,546, filed on Jun. 9, 2014, now abandoned.

(51) Int. Cl.
*H04L 5/00* (2006.01)
*H04N 21/61* (2011.01)
(Continued)

(52) U.S. Cl.
CPC ....... *H04L 5/0007* (2013.01); *H03M 13/1165* (2013.01); *H03M 13/255* (2013.01); *H03M 13/356* (2013.01); *H03M 13/6362* (2013.01); *H04L 1/0041* (2013.01); *H04L 1/0045* (2013.01); *H04L 1/0057* (2013.01); *H04L 1/0058* (2013.01); *H04L 27/04* (2013.01);
(Continued)

(58) Field of Classification Search
CPC .......... H03M 13/1128; H03M 13/152; H03M 13/6538; H03M 13/1154; H04N 21/2383; H04N 21/6112; H04L 27/2627; H04L 27/2647; H04L 1/0057; H04L 1/0045; H04L 5/0007; H04L 1/0041; H04L 27/04; H04L 27/2655
See application file for complete search history.

(56) References Cited

U.S. PATENT DOCUMENTS 7,764,323 B2 * 7/2010 Choi ............... H03M 13/27
348/723
2005/0149842 A1 * 7/2005 Kyung ............ H03M 13/1102
714/800
(Continued)

*Primary Examiner* — Kenneth Lam

(57) ABSTRACT

In transmitter apparatus for a digital television broadcasting system, internet-protocol (IP) packets of digital television information are subjected to multilevel coding (MLC) before being Gray-mapped to quadrature-amplitude-modulation (QAM) constellations. The constituent codes of the MLC comprise respective low-density parity-check (LDPC) inner coding. Preferably, the LDPC inner coding is LDPC convolutional coding. The QAM constellations are used in coded orthogonal frequency-division modulation (COFDM) of plural carrier waves up-converted to a radio-frequency broadcast television channel. In receiver apparatus for the digital television broadcasting system the results of de-mapping QAM constellations recovered from demodulating the COFDM carrier waves are de-interleaved, and the LDPC constituent codes of the MLC are independently decoded in parallel with decoding results time-interleaved to recover the IP packets of digital television information.

21 Claims, 50 Drawing Sheets

(51) Int. Cl.
  *H04L 1/00*      (2006.01)
  *H04L 27/04*     (2006.01)
  *H04L 27/26*     (2006.01)
  *H04N 21/2383*   (2011.01)
  *H03M 13/25*     (2006.01)
  *H03M 13/35*     (2006.01)
  *H03M 13/00*     (2006.01)
  *H03M 13/15*     (2006.01)
  *H03M 13/11*     (2006.01)
  *H04L 27/36*     (2006.01)
  *H03M 13/09*     (2006.01)

(52) U.S. Cl.
  CPC ...... *H04L 27/2627* (2013.01); *H04L 27/2647* (2013.01); *H04N 21/2383* (2013.01); *H04N 21/6112* (2013.01); *H03M 13/09* (2013.01); *H03M 13/1154* (2013.01); *H03M 13/152* (2013.01); *H04L 27/2655* (2013.01); *H04L 27/36* (2013.01)

(56) References Cited

U.S. PATENT DOCUMENTS

| | | | |
|---|---|---|---|
| 2008/0063079 A1* | 3/2008 | Zhongjun | H04H 20/106 375/240.21 |
| 2008/0130769 A1* | 6/2008 | Papadopoulos | H04B 7/022 375/260 |
| 2010/0192047 A1* | 7/2010 | Murakami | H03M 13/1111 714/786 |
| 2011/0135039 A1* | 6/2011 | Limberg | H04L 25/03057 375/340 |
| 2012/0063533 A1* | 3/2012 | Fonseka | H04L 1/0051 375/295 |
| 2013/0028269 A1* | 1/2013 | Limberg | H04L 1/0066 370/474 |
| 2013/0028271 A1* | 1/2013 | Limberg | H04N 21/6112 370/479 |
| 2013/0028336 A1* | 1/2013 | Limberg | H04N 21/2383 375/240.27 |
| 2014/0119458 A1* | 5/2014 | Limberg | H04N 19/89 375/240.27 |

* cited by examiner

PER PRIOR ART

| S1 | P2 TYPE SIGNALING | DESCRIPTION |
|---|---|---|
| 000 | T2_SISO, ONE-TIME OR FINAL TRANSMISSION | The Preamble is a T2-base preamble. The P2 part is transmitted in its SISO format. |
| 001 | T2_MISO, ONE-TIME OR FINAL TRANSMISSION | The Preamble is a T2-base preamble. The P2 part is transmitted in its MISO format. |
| 010 | T2_LITE_SISO, ONE-TIME OR FINAL TRANSMISSION | The Preamble is a preamble of a T2-Lite signal. The P2 part is transmitted in its SISO format. |
| 011 | T2_LITE_MISO, ONE-TIME OR FINAL TRANSMISSION | The Preamble is a preamble of a T2-Lite signal. The P2 part is transmitted in its MISO format. |
| 111 | T2_SISO, INITIAL TRANSMISSION | The Preamble is a T2-base preamble. The P2 part is transmitted in its SISO format. |
| 110 | T2_MISO, INITIAL TRANSMISSION | The Preamble is a T2-base preamble. The P2 part is transmitted in its MISO format. |
| 101 | T2_LITE_SISO, INITIAL TRANSMISSION | The Preamble is a preamble of a T2-Lite signal. The P2 part is transmitted in its SISO format. |
| 100 | T2_LITE_MISO, INITIAL TRANSMISSION | The Preamble is a preamble of a T2-Lite signal. The P2 part is transmitted in its MISO format. |

Fig. 6

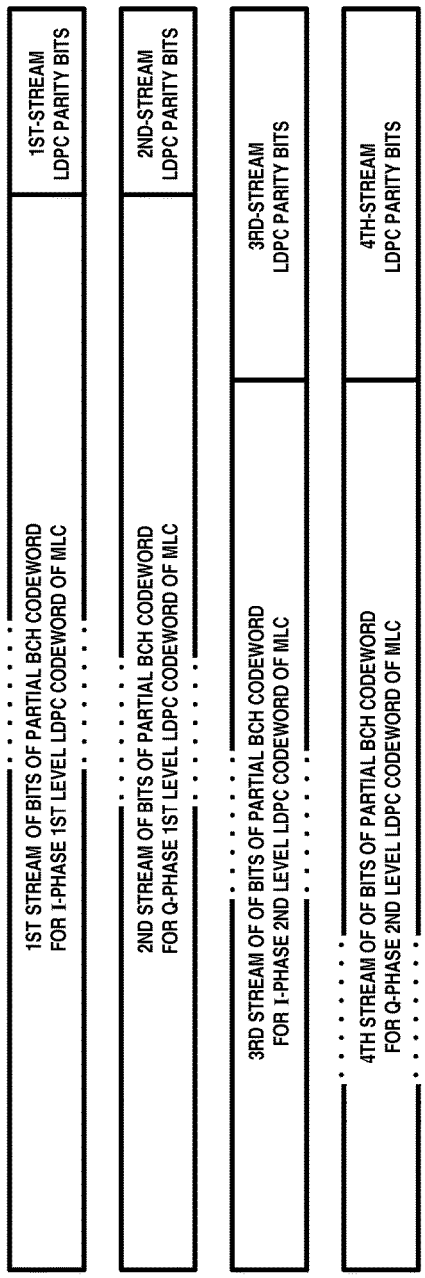
Fig. 9 Contents of 4 Streams of MLC for 16QAM
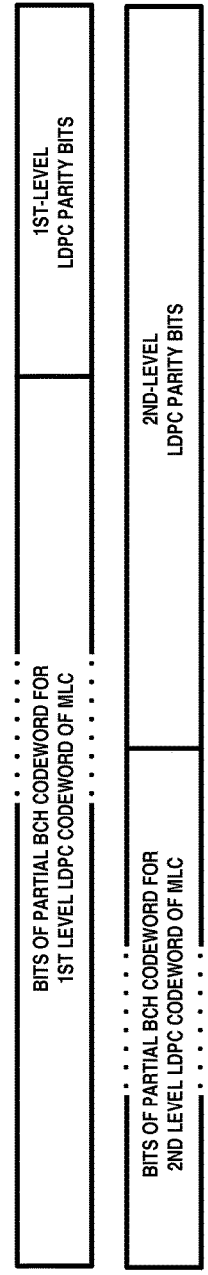
Fig. 10 Contents of 2 levels of MLC for 16QAM

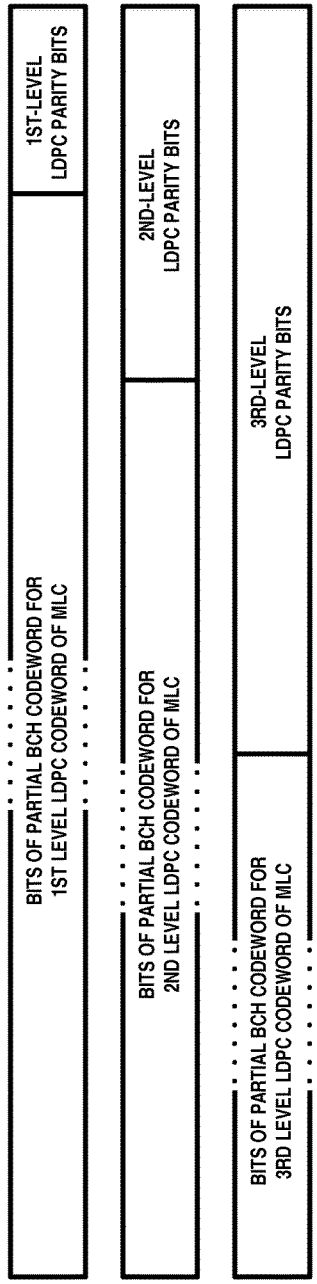
Fig. 13 Contents of 3 levels of MLC for 64QAM
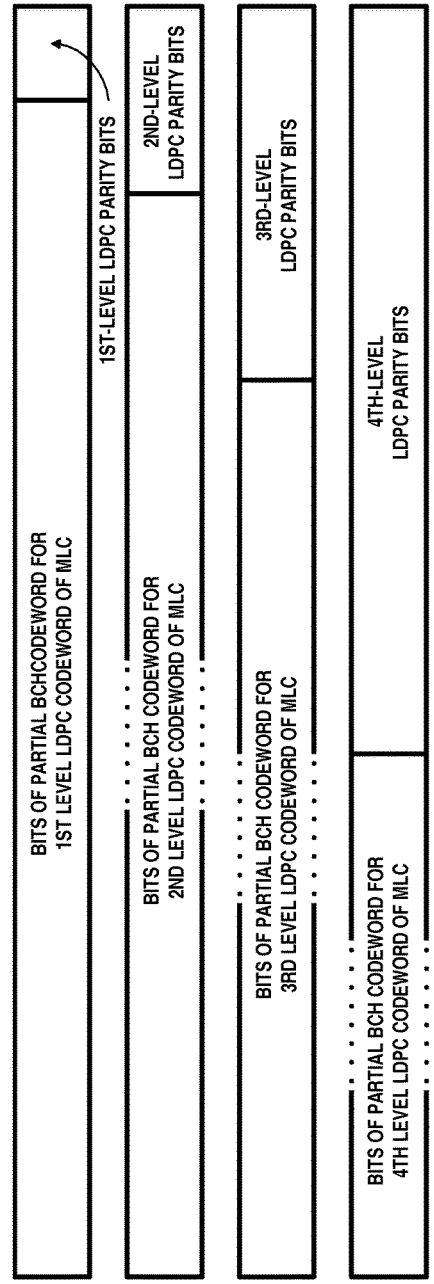
Fig. 14 Contents of 4 levels of MLC for 256QAM Fig. 16 Contents of 6 streams of MLC for 64QAM Fig. 18 Contents of 8 streams of MLC for 256QAM

Fig. 21

Fig. 22 Contents of 7 streams of MLC for 128QAM

Fig. 24 Contents of 9 streams of MLC for 512QAM

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 13 500 | 16 200 | 5/6 | 2 700 |
| 1ST-Q | 13 500 | 16 200 | 5/6 | 2 700 |
| 2ND-I | 10 800 | 16 200 | 2/3 | 5 400 |
| 2ND-Q | 10 800 | 16 200 | 2/3 | 5 400 |
| TOTAL | 48 600 | 64 800 | 3/4 AVG. | 16 200 |

Fig. 42  CONSTITUENT LDPC CODES FOR FIG. 33 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 14 850 | 16 200 | 11/12 | 1 350 |
| 1ST-Q | 14 850 | 16 200 | 11/12 | 1 350 |
| 2ND-I | 13 500 | 16 200 | 5/6 | 2 700 |
| 2ND-Q | 13 500 | 16 200 | 5/6 | 2 700 |
| TOTAL | 56 700 | 64 800 | 7/8 AVG. | 8 100 |

Fig. 43  CONSTITUENT LDPC CODES FOR FIG. 33 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 15 300 | 16 200 | 17/18 | 900 |
| 1ST-Q | 15 300 | 16 200 | 17/18 | 900 |
| 2ND-I | 14 400 | 16 200 | 8/9 | 1 800 |
| 2ND-Q | 14 400 | 16 200 | 8/9 | 1 800 |
| TOTAL | 59 400 | 64 800 | 0.917 AVG. | 5 400 |

Fig. 44  CONSTITUENT LDPC CODES FOR FIG. 33 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 9 450 | 10 800 | 7/8 | 1 350 |
| 1ST-Q | 9 450 | 10 800 | 7/8 | 1 350 |
| 2ND-I | 8 100 | 10 800 | 3/4 | 2 700 |
| 2ND-Q | 8 100 | 10 800 | 3/4 | 2 700 |
| 3RD-I | 5 400 | 10 800 | 1/2 | 5 400 |
| 3RD-Q | 5 400 | 10 800 | 1/2 | 5 400 |
| TOTAL | 45 900 | 64 800 | 0.708 AVG. | 18 900 |

Fig. 45  CONSTITUENT LDPC CODES FOR FIG. 35 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 9 900 | 10 800 | 11/12 | 900 |
| 1ST-Q | 9 900 | 10 800 | 11/12 | 900 |
| 2ND-I | 9 000 | 10 800 | 5/6 | 1 800 |
| 2ND-Q | 9 000 | 10 800 | 5/6 | 1 800 |
| 3RD-I | 7 200 | 10 800 | 2/3 | 3 600 |
| 3RD-Q | 7 200 | 10 800 | 2/3 | 3 600 |
| TOTAL | 52 200 | 64 800 | 0.806 AVG. | 12 600 |

Fig. 46  CONSTITUENT LDPC CODES FOR FIG. 35 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 10 350 | 10 800 | 23/24 | 450 |
| 1ST-Q | 10 350 | 10 800 | 23/24 | 450 |
| 2ND-I | 9 900 | 10 800 | 11/12 | 900 |
| 2ND-Q | 9 900 | 10 800 | 11/12 | 900 |
| 3RD-I | 9 000 | 10 800 | 5/6 | 1 800 |
| 3RD-Q | 9 000 | 10 800 | 5/6 | 1 800 |
| TOTAL | 58 500 | 64 800 | 0.903 AVG. | 6 300 |

Fig. 47  CONSTITUENT LDPC CODES FOR FIG. 35 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I&Q | 7 710 | 9 252 | 5/6 | 1 542 |
| 2ND-I | 7 710 | 9 252 | 5/6 | 1 542 |
| 2ND-Q | 7 710 | 9 252 | 5/6 | 1 542 |
| 3RD-I | 6 939 | 9 252 | 3/4 | 2 313 |
| 3RD-Q | 6 939 | 9 252 | 3/4 | 2 313 |
| 4TH-I | 4 626 | 9 252 | 1/2 | 4 626 |
| 4TH-Q | 4 626 | 9 252 | 1/2 | 4 626 |
| TOTAL | 46 260 | 64 764 | 0.714 AVG. | 18 504 |

Fig. 48 CONSTITUENT LDPC CODES FOR FIG. 37 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I&Q | 8 481 | 9 252 | 11/12 | 771 |
| 2ND-I | 8 481 | 9 252 | 11/12 | 771 |
| 2ND-Q | 8 481 | 9 252 | 11/12 | 771 |
| 3RD-I | 7 710 | 9 252 | 5/6 | 1 542 |
| 3RD-Q | 7 710 | 9 252 | 5/6 | 1 542 |
| 4TH-I | 6 168 | 9 252 | 2/3 | 3 084 |
| 4TH-Q | 6 168 | 9 252 | 2/3 | 3 084 |
| TOTAL | 53 199 | 64 764 | 0.821 AVG. | 11 565 |

Fig. 49 CONSTITUENT LDPC CODES FOR FIG. 37 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I&Q | 8 738 | 9 252 | 17/18 | 514 |
| 2ND-I | 8 738 | 9 252 | 17/18 | 514 |
| 2ND-Q | 8 738 | 9 252 | 17/18 | 514 |
| 3RD-I | 8 481 | 9 252 | 11/12 | 771 |
| 3RD-Q | 8 481 | 9 252 | 11/12 | 771 |
| 4TH-I | 7 710 | 9 252 | 5/6 | 1 542 |
| 4TH-Q | 7 710 | 9 252 | 5/6 | 1 542 |
| TOTAL | 58 596 | 64 764 | 0.905 AVG. | 5 625 |

Fig. 50  CONSTITUENT LDPC CODES FOR FIG. 37 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 7 425 | 8 100 | 11/12 | 675 |
| 1ST-Q | 7 425 | 8 100 | 11/12 | 675 |
| 2ND-I | 6 750 | 8 100 | 5/6 | 1 350 |
| 2ND-Q | 6 750 | 8 100 | 5/6 | 1 350 |
| 3RD-I | 5 400 | 8 100 | 2/3 | 2 700 |
| 3RD-Q | 5 400 | 8 100 | 2/3 | 2 700 |
| 4TH-I | 2 700 | 8 100 | 1/3 | 5 400 |
| 4TH-Q | 2 700 | 8 100 | 1/3 | 5 400 |
| TOTAL | 44 550 | 64 800 | 0.688 AVG. | 20 250 |

Fig. 51  CONSTITUENT LDPC CODES FOR FIG. 38 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 7 425 | 8 100 | 11/12 | 675 |
| 1ST-Q | 7 425 | 8 100 | 11/12 | 675 |
| 2ND-I | 6 750 | 8 100 | 5/6 | 1 350 |
| 2ND-Q | 6 750 | 8 100 | 5/6 | 1 350 |
| 3RD-I | 6 075 | 8 100 | 3/4 | 2025 |
| 3RD-Q | 6 075 | 8 100 | 3/4 | 2 025 |
| 4TH-I | 4 050 | 8 100 | 1/2 | 4 050 |
| 4TH-Q | 4 050 | 8 100 | 1/2 | 4 050 |
| TOTAL | 48 600 | 64 800 | 3/4 AVG. | 16 200 |

Fig. 52 CONSTITUENT LDPC CODES FOR FIG. 38 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I | 7 695 | 8 100 | 19/20 | 405 |
| 1ST-Q | 7 695 | 8 100 | 19/20 | 405 |
| 2ND-I | 7 425 | 8 100 | 11/12 | 675 |
| 2ND-Q | 7 425 | 8 100 | 11/12 | 675 |
| 3RD-I | 6 750 | 8 100 | 5/6 | 1 350 |
| 3RD-Q | 6 750 | 8 100 | 5/6 | 1 350 |
| 4TH-I | 5 400 | 8 100 | 2/3 | 2 700 |
| 4TH-Q | 5 400 | 8 100 | 2/3 | 2 700 |
| TOTAL | 54 540 | 64 800 | 0.841 AVG. | 10 260 |

Fig. 53 CONSTITUENT LDPC CODES FOR FIG. 38 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I&Q | 6 600 | 7 200 | 11/12 | 600 |
| 2ND-I | 6 600 | 7 200 | 11/12 | 600 |
| 2ND-Q | 6 600 | 7 200 | 11/12 | 600 |
| 3RD-I | 6 000 | 7 200 | 5/6 | 1 200 |
| 3RD-Q | 6 000 | 7 200 | 5/6 | 1 200 |
| 4TH-I | 4 800 | 7 200 | 2/3 | 2 400 |
| 4TH-Q | 4 800 | 7 200 | 2/3 | 2 400 |
| 5TH-I | 2 400 | 7 200 | 1/3 | 4 800 |
| 5TH-Q | 2 400 | 7 200 | 1/3 | 4 800 |
| TOTAL | 46 200 | 64 800 | 0.712 AVG. | 18 600 |

Fig. 54  CONSTITUENT LDPC CODES FOR FIG. 40 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I&Q | 6 900 | 7 200 | 23/24 | 300 |
| 2ND-I | 6 900 | 7 200 | 23/24 | 300 |
| 2ND-Q | 6 900 | 7 200 | 23/24 | 300 |
| 3RD-I | 6 300 | 7 200 | 7/8 | 900 |
| 3RD-Q | 6 300 | 7 200 | 7/8 | 900 |
| 4TH-I | 5 400 | 7 200 | 3/4 | 1 800 |
| 4TH-Q | 5 400 | 7 200 | 3/4 | 1 800 |
| 5TH-I | 3 600 | 7 200 | 1/2 | 3 600 |
| 5TH-Q | 3 600 | 7 200 | 1/2 | 3 600 |
| TOTAL | 51 300 | 64 800 | 0.791 AVG. | 13 500 |

Fig. 55  CONSTITUENT LDPC CODES FOR FIG. 40 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST-I&Q | 6 900 | 7 200 | 23/24 | 300 |
| 2ND-I | 6 900 | 7 200 | 23/24 | 300 |
| 2ND-Q | 6 900 | 7 200 | 23/24 | 300 |
| 3RD-I | 6 600 | 7 200 | 11/12 | 600 |
| 3RD-Q | 6 600 | 7 200 | 11/12 | 600 |
| 4TH-I | 6 000 | 7 200 | 5/6 | 1 200 |
| 4TH-Q | 6 000 | 7 200 | 5/6 | 1 200 |
| 5TH-I | 4 800 | 7 200 | 2/3 | 2 400 |
| 5TH-Q | 4 800 | 7 200 | 2/3 | 2 400 |
| TOTAL | 55 500 | 64 800 | 0.856 AVG. | 19 300 |

Fig. 56  CONSTITUENT LDPC CODES FOR FIG. 40 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 19 080 | 32 400 | 5/6 | 5 400 |
| 2ND | 16 920 | 32 400 | 2/3 | 10 800 |
| TOTAL | 48 600 | 64 800 | 3/4 AVG. | 16 200 |

Fig. 57  CONSTITUENT LDPC CODES FOR FIG. 34 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 29 700 | 32 400 | 11/12 | 2 700 |
| 2ND | 27 000 | 32 400 | 5/6 | 5 400 |
| TOTAL | 56 700 | 64 800 | 7/8 AVG. | 8 100 |

Fig. 58  CONSTITUENT LDPC CODES FOR FIG. 34 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 18 900 | 21 600 | 7/8 | 2 700 |
| 2ND | 16 200 | 21 600 | 3/4 | 5400 |
| 3RD | 10 800 | 21 600 | 1/2 | 10 800 |
| TOTAL | 45 900 | 64 800 | 0.708 AVG. | 18 900 |

Fig. 59 CONSTITUENT LDPC CODES FOR FIG. 36 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 19 800 | 21 600 | 11/12 | 1800 |
| 2ND | 18 000 | 21 600 | 5/6 | 3600 |
| 3RD | 14 400 | 21 600 | 2/3 | 7 200 |
| TOTAL | 52 200 | 64 800 | 0.806 AVG. | 12 600 |

Fig. 60 CONSTITUENT LDPC CODES FOR FIG. 36 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 20 700 | 21 600 | 23/24 | 900 |
| 2ND | 19 800 | 21 600 | 11/12 | 1 800 |
| 3RD | 18 000 | 21 600 | 5/6 | 3 600 |
| TOTAL | 58 500 | 64 800 | 0.903 AVG. | 6 300 |

Fig. 61 CONSTITUENT LDPC CODES FOR FIG. 36 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 14 850 | 16 200 | 11/12 | 1 350 |
| 2ND | 13 500 | 16 200 | 5/6 | 2 700 |
| 3RD | 10 800 | 16 200 | 2/3 | 5 400 |
| 4TH | 5 400 | 16 200 | 1/3 | 10 800 |
| TOTAL | 44 550 | 64 800 | 0.688 AVG. | 20 250 |

Fig. 62 CONSTITUENT LDPC CODES FOR FIG. 39 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 14 850 | 16 200 | 11/12 | 1 350 |
| 2ND | 14 175 | 16 200 | 7/8 | 2 025 |
| 3RD | 12 150 | 16 200 | 3/4 | 4 050 |
| 4TH | 8 100 | 16 200 | 1/2 | 8 100 |
| TOTAL | 49 275 | 64 800 | 0.760 AVG. | 15 525 |

Fig. 63 CONSTITUENT LDPC CODES FOR FIG. 39 DECODERS

| LEVEL OF LDPC CODING | BITS FROM BCH CODE BLOCK | BITS IN LDPC CODE BLOCK | LDPC CODE RATE | LDPC PARITY BITS IN LDPC CODE BLOCK |
|---|---|---|---|---|
| 1ST | 15 525 | 16 200 | 23/24 | 675 |
| 2ND | 14 850 | 16 200 | 11/12 | 1 350 |
| 3RD | 13 500 | 16 200 | 5/6 | 2 700 |
| 4TH | 10 800 | 16 200 | 2/3 | 5 400 |
| TOTAL | 54 675 | 64 800 | 0.844 AVG. | 10 125 |

Fig. 64 CONSTITUENT LDPC CODES FOR FIG. 39 DECODERS

DIGITAL TELEVISION BROADCASTING SYSTEM USING CODED ORTHOGONAL FREQUENCY-DIVISION MODULATION WITH MULTILEVEL LOW-DENSITY-PARITY-CHECK CODING

This is a continuation-in-part of U.S. patent application Ser. No. 14/299,546 filed Jun. 9, 2014 claiming priority from U.S. provisional Pat. App. Ser. No. 61/833,009 filed Jun. 10, 2013.

FIELD OF THE INVENTION

Various aspects of the invention relate to systems of over-the-air broadcasting of orthogonal frequency-division modulation (OFDM) digital television (DTV) signals.

BACKGROUND OF THE INVENTION

DTV broadcasting in the United States of America has been done in accordance with broadcasting standards formulated by an industry consortium called the Advanced Television Systems Committee (ATSC), which standards have prescribed the use of a vestigial-sideband amplitude-modulated single carrier in each radio-frequency (RF) channel allocated for broadcasting DTV signals. Consideration is being given to replacing those DTV broadcasting standards with a new standard that prescribes coded orthogonal frequency-division multiplexed (COFDM) plural carriers in each RF channel allocated for broadcasting DTV signals. This new standard may, for example, resemble the DVB-T2 broadcasting standard developed for use in Europe.

COFDM is typically generated by data randomizing digital data to insure that subsequent encoding of forward-error-correction (FEC) coding receives sufficient density of logic ONEs to operate efficiently. Then, the resulting FEC coding is subjected to some form of bit interleaving, and the bits of the interleaved FEC coding are mapped to quadrature-amplitude-modulation (QAM) symbol constellations to implement a form of bit-interleaved coded modulation (BICM). The real-axis and imaginary-axis spatial coordinates of the QAM constellations are parsed into orthogonal frequency-division multiplex (OFDM) symbols, which modulate a single carrier wave at high rate using quadrature-amplitude-modulation (QAM). The resulting modulated carrier wave is then transformed in a fast inverse discrete Fourier transform (I-DFT) procedure to generate a multiplicity of baseband OFDM carriers. These baseband OFDM carriers are converted upward in frequency to generate radio-frequency (RF) carrier waves uniformly distributed within the frequency spectrum of the RF channel, each of which RF carriers is modulated at low symbol rate.

The DVB-T2 standard for DTV broadcasting prescribes Bose-Chaudhuri-Hocquenghem (BCH) coding concatenated with subsequent low-density parity-check (LPDC) coding as FEC coding. This coding is favored because of its relatively low redundancy as compared to turbo coding that provides similar performance in the presence of additive white Gaussian noise (AWGN). The concatenated BCH-LDPC coding prescribed in the DVB-T2 standard is reported to allow better performance in the presence of AWGN to be achieved using 256QAM constellations than could be achieved using 16QAM constellations per the earlier DVB-T standard for over-the-air DTV broadcasting. The bits of the LDPC coding are block interleaved using a column-twist or matrix type of interleaving in which successive bits of LDPC coding are arranged in columns for subsequent row-by-row utilization for mapping to lattice points within successive QAM constellations. The FEC frames of LDPC coding extend over very large numbers of bits, a normal FEC frame being composed of 64,800 bits and a short FEC frame used for transmissions to mobile receivers being composed of 16,200 bits.

The mapping of LDPC coding to square QAM constellations is Gray mapping, in which plural-bit code segments that are mapped by adjacent portions of the constellation differ in only a single bit. This reduces the bit errors caused by AWGN when de-mapping is done in the DTV receiver. However, soft de-mapping of the square QAM constellations in the DTV receiver recovers the successive bits of LDPC coding with varying respective levels of confidence that they are correct. Those bits of the de-mapping results with lower respective levels of confidence that they are correct are more likely adversely to affect the capability of LDPC decoding to recover the BCH-coded data as originally transmitted, than are those bits of the de-mapping results with higher respective levels of confidence that they are correct. The ratio of parity bits to systematic bits in the LDPC coding is determined by the desire to correct the bits having the lowest respective levels of confidence that they are correct when the Shannon limit is approached during AWGN reception conditions.

The LDPC coding prescribed in the DVB-T2 DTV broadcasting standard does not employ multilevel coding (MLC), a concept introduced by H. Imai and S. Hirakawa in their paper "A new multilevel coding method using error correcting codes" appearing on pages 371-377 in the May 1977 issue of *IEEE Transactions on Information Theory*, Vol. 23, No. 3. The key idea in MLC is that the bits of binary FEC coding are mapped to M-ary modulation symbol constellations for transmission. Decoding is expedited by FEC coding the bits mapped to different points in M-ary modulation symbol constellations independently of each other, which permits parallel independent decoding (PID).

A paper titled "Design of low-density parity-check codes for bandwidth efficient modulation" and authored by Jilei Hou, Paul H. Siegel, Laurence B. Milstein and Henry D. Pfister that appeared on pages 24-26 of the conference publication of *IEEE ITW* 2001 held Sep. 2-7, 2001 in Cairns, Australia is of interest. The authors reported they were able to achieve asymptotic performance very close to the capacity of an AWGN channel using multilevel coding employing irregular LDPC coding optimized for each code level. The Hou et alii *ITW* 2001 paper describes multilevel LDPC coding with different-rate LDPC codes for different levels, with the different-rate LDPC codes having codewords all of the same length. The *ITW* 2001 paper describes the mapping of the multilevel LDPC coding to 4PAM and 8PSK modulation symbol constellations. This paper and subsequent ones by other authors recognized that the use of Gray mapping and PID at each level separately with optimally chosen constituent codes offers performance approaching the Shannon limit on theoretical capacity of an AWGN channel.

LDPC coding of the different levels into which the information bit stream is split was proposed and described by I. B. Djordjevic and B. Vasic in their paper "Multilevel coding in M-ary DPSK/differential QAM high-speed optical transmission with direct detection" appearing on pages 420-428 of *Journal of Lightwave Technology*, Vol. 24, No. 1, January 2006. An MLC scheme of data transmission using different constituent LDPC coding for each level was described by R. Y. S. Tee, O. Alamri, S. X. Ng and L. Hanzo in their paper "Block-Coded Sphere-Packing-Aided Multilevel Coding" appearing on pages 4173-4178 of *IEEE International Conference on Communications*, June 2007.

The above-cited references do not describe multilevel coding being applied to Gray-mapped quadrature amplitude modulation (QAM) of a plurality OFDM carrier waves. Uniform QAM provides a two-dimensional form of digital modulation in which the in-phase and quadrature-phase components of the complex amplitude modulation of each of the OFDM carrier waves can be independently coded and Gray mapped. Separate levels of MLC coding are provided for each of the bit positions in the labeling of points in the lattice defined by the different amplitudes and phases of the QAM symbol constellations. When Gray mapped appropriately, square QAM symbol constellations have an important property not known to have been fully previously exploited. The likelihood of corruption by random noise in each of the bits in the plural-bit labels of points in the square QAM symbol constellation that specify positioning in real-axis direction corresponds to the likelihood of corruption by random noise in one of the bits of the plural-bit labels of points in the QAM symbol constellation that specify positioning in imaginary-axis direction. The inventor found this significant because each such pair of bits that essentially are equally likely to be corrupted by random noise can be conveyed in the same level of multilevel LDPC coding. This halves the number of constituent codes in the multilevel LDPC coding and reduces the number of different coding algorithms transmitter requires for generating the constituent LDPC codewords in the multilevel LDPC coding. There is a corresponding reduction in the number of different decoding algorithms required for decoding the constituent LDPC codewords of the multilevel LDPC coding in receiver apparatus.

If the DTV transmitter selects systematic data bits to constituent codestreams of the MLC packet-by-packet, rather than bit-by-bit, the amounts of quite accurate timing needed in DTV transmitter and in DTV receiver apparatus are reduced. All the systematic data bits for each codeword of constituent coding are selected in original sequential order from a supply of all systematic data bits for all multilevel coding.

SUMMARY OF THE INVENTION

Overall, the invention is directed to COFDM transmission systems using multilevel LDPC coding (LDPC-MLC) using different constituent LDPC coding for each level. The LDPC coding for each level is low-density parity-check block (LDPCB) coding in some of these COFDM transmission systems and is low-density parity-check convolutional (LDPCC) coding in preferred other ones of these COFDM transmission systems. The systematic data bits are split into consecutive data packets of various sizes for respective constituent LDPC coding at respective code rates for each level of the LDPC-MLC. Preferably, these procedures are performed so all constituent LDPC codewords each consist of a prescribed number of respective bits, which facilitates mapping those codewords to QAM symbol constellations. Aspects of the overall invention are embodied in COFDM transmitter for implementing this novel preferred form of LDPC-MLC, interleaving bits of the constituent LDPC codewords for being mapped to QAM of the OFDM carrier waves. Other aspects of the invention are embodied in COFDM receiver apparatus comprising a de-mapper for QAM constellations and bit de-interleaving followed by a plurality of decoders for respective constituent LDPC codes of multilevel LDPC coding.

The number of constituent LDPC codes in multilevel LDPC coding associated with Gray-mapped square QAM symbol constellations is halved in certain embodiments of the invention. The number of constituent LDPC codes in multilevel LDPC coding associated with close-to-Gray-mapped cruciform QAM symbol constellations is substantially reduced in other embodiments of this COFDM receiver apparatus. These reductions are achieved by not using separate constituent LDPC codes for the in-phase and quadrature-phase coordinates of a QAM symbol that exhibit similar likelihood of error due to random noise, but rather having those coordinates share a single constituent LDPC code.

Using low-density parity-check convolutional (LDPCC) coding in multilevel coding (MLC) for COFDM transmission systems tends to reduce substantially the number of different codes needed to implement a variety of different QAM symbol types. This is because LDPCC codes of given redundancy rate are easily generated in arbitrary lengths needed for MLC of different QAM symbol types. A DTV receiver can decode various lengths of LDPCC codes of given redundancy rate using sliding-window techniques. This advantageously reduces the number of decoding algorithms a DTV receiver needs for decoding the various MLC of different types of QAM symbols.

BRIEF DESCRIPTION OF THE DRAWINGS

FIG. 6 is a table tabulating an S1 field to specify preamble format in P1 signaling data that modify the P1 signaling data used in DVB-T2, which modification enables the DTV transmitter to signal the DTV receiver as to whether an initial transmission is being transmitted or a final transmission is being transmitted.

FIG. 9 is a diagram showing the relative numbers of LDPC parity bits in four concurrent LDPC codewords in respective ones of the four constituent codestreams of LDPC-MLC generated by the FIG. 7 apparatus.

FIG. 10 is a diagram showing the relative numbers of LDPC parity bits in respective ones of the two constituent codestreams of LDPC-MLC generated by the FIG. 8 apparatus.

FIG. 13 is a diagram showing the relative numbers of LDPC parity bits in the three constituent codestreams of LDPC-MLC generated by the FIG. 11 apparatus.

FIG. 14 is a diagram showing the relative numbers of LDPC parity bits in the four constituent codestreams of LDPC-MLC generated by the FIG. 12 apparatus.

FIG. 21 is a map of 7-bit symbols to a cruciform 128QAM symbol constellation based on a square 64QAM constellation core and provided with additional four arms or tabs extending from respective sides of that square 64QAM constellation core.

Each of FIGS. 42, 43 and 44 is a table of characteristics of constituent LDPC codes in a respective complex two-level LDPC-MLC in a 64,800-bit FEC Frame de-mapped from 16QAM symbol constellations in a COFDM signal.

Each of FIGS. 45, 46 and 47 is a table of characteristics of constituent LDPC codes in a respective complex three-level LDPC-MLC in a 64,800-bit FEC Frame de-mapped from 64QAM symbol constellations in a COFDM signal.

Each of FIGS. 48, 49 and 50 is a table of characteristics of constituent LDPC codes in a respective complex four-level LDPC-MLC in a 64,800-bit FEC Frame de-mapped from 128QAM symbol constellations in a COFDM signal.

Each of FIGS. 51, 52 and 53 is a table of characteristics of constituent LDPC codes in a respective complex four-level LDPC-MLC in a 64,800-bit FEC Frame de-mapped from 256QAM symbol constellations in a COFDM signal.

Each of FIGS. 54, 55 and 56 is a table of characteristics of constituent LDPC codes in a respective complex five-level LDPC-MLC in a 64,800-bit FEC Frame de-mapped from 512QAM symbol constellations in a COFDM signal.

Each of FIGS. 57 and 58 is a table of characteristics of constituent LDPC codes in a respective two-level LDPC-MLC in a 64,800-bit FEC Frame de-mapped from 16QAM symbol constellations in a COFDM signal.

Each of FIGS. 59, 60 and 61 is a table of characteristics of constituent LDPC codes in a respective three-level LDPC-MLC in a 64,800-bit FEC Frame de-mapped from 64QAM symbol constellations in a COFDM signal.

Each of FIGS. 62, 63 and 64 is a table of characteristics of constituent LDPC codes in a respective four-level LDPC-MLC in a 64,800-bit FEC Frame de-mapped from 256QAM symbol constellations in a COFDM signal.

Figure 28:
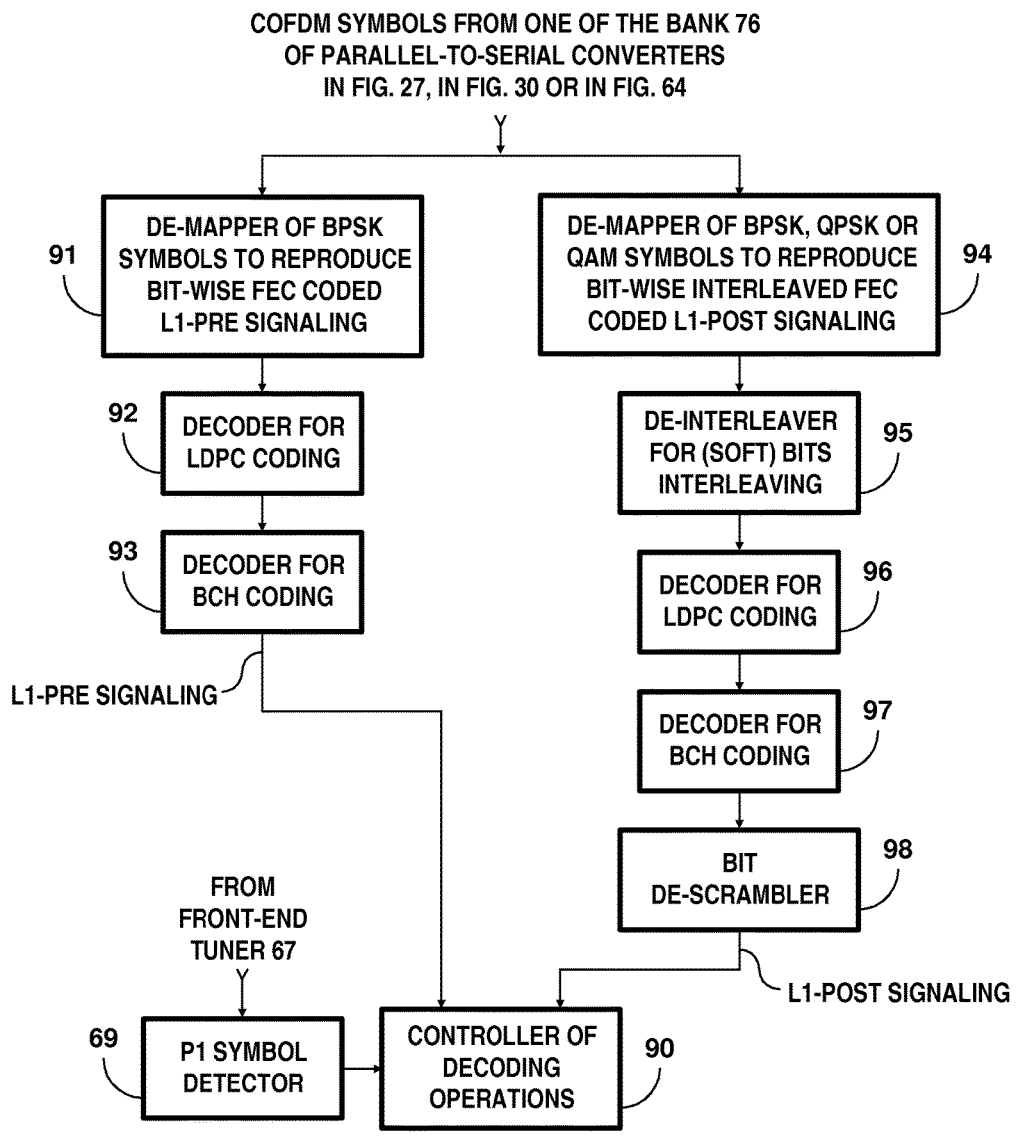
Figure 65:
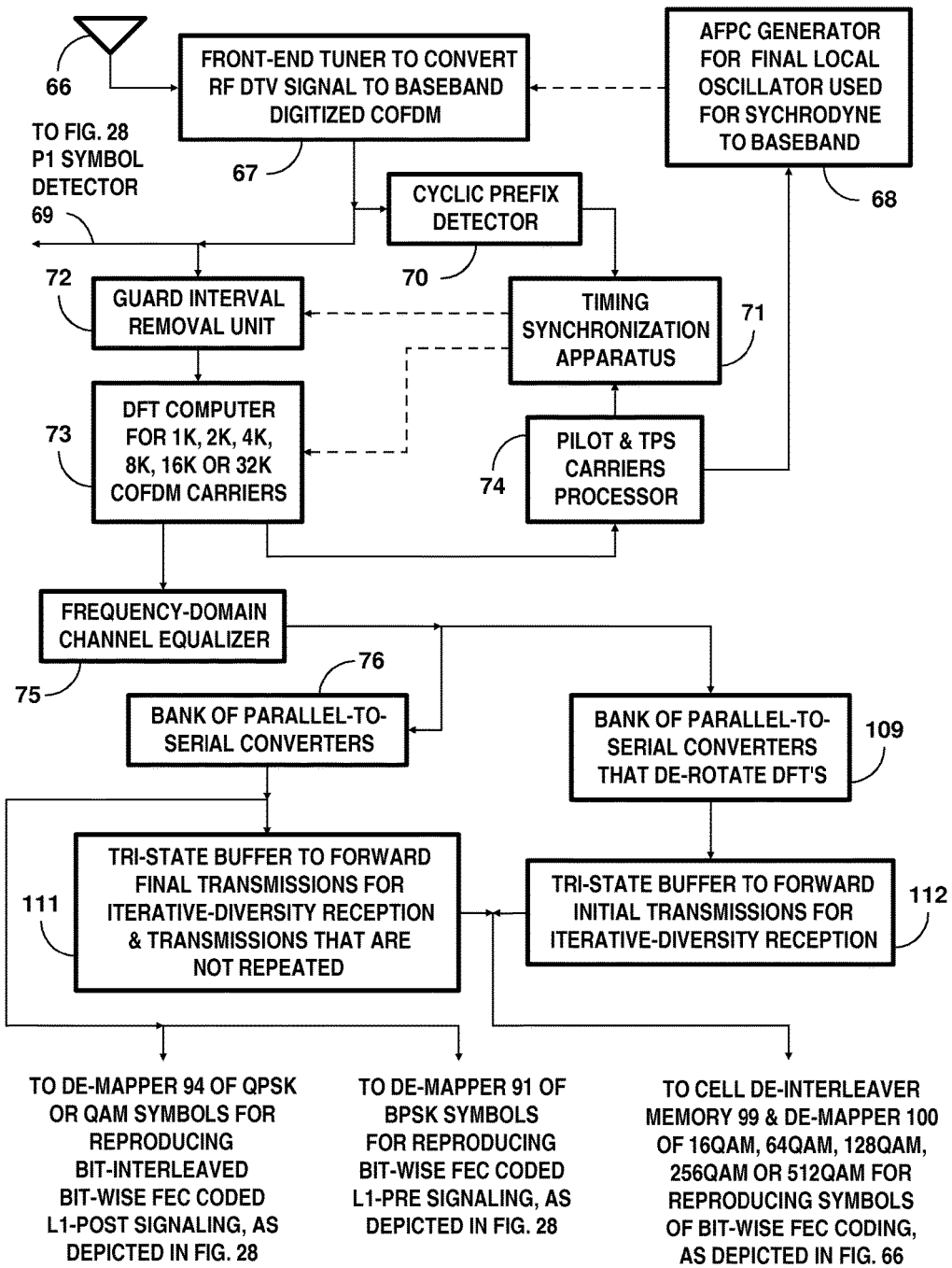
Figure 66:
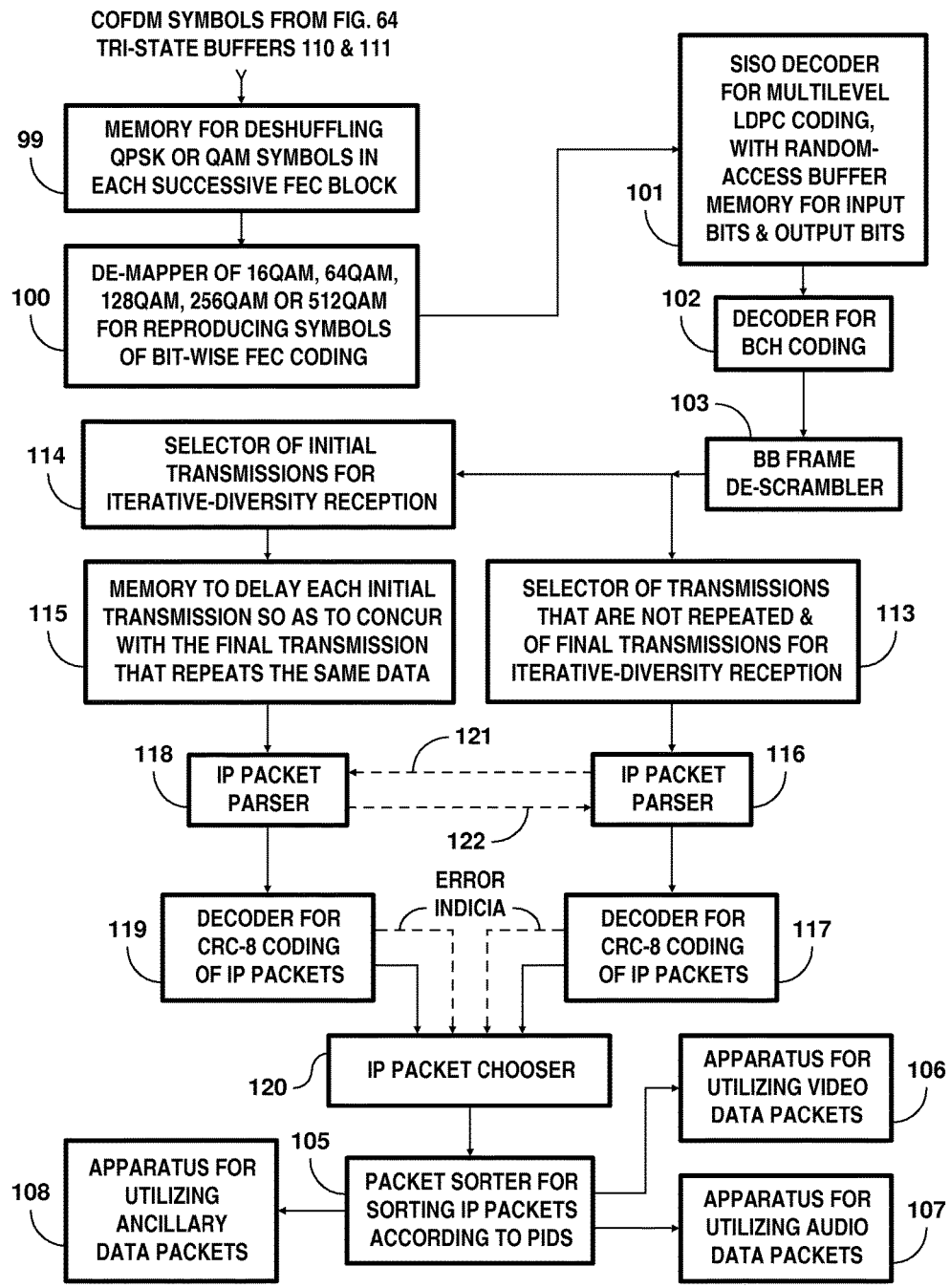

FIGS. 65, 28 and 66 together form a schematic diagram of COFDM receiver apparatus configured for iterative-diversity reception of COFDM signals, which receiver apparatus is configured in accordance with the invention and chooses correct internet-protocol packets from initial transmissions of COFDM signals and from final transmissions of COFDM signals.

DETAILED DESCRIPTION

Figure 1:
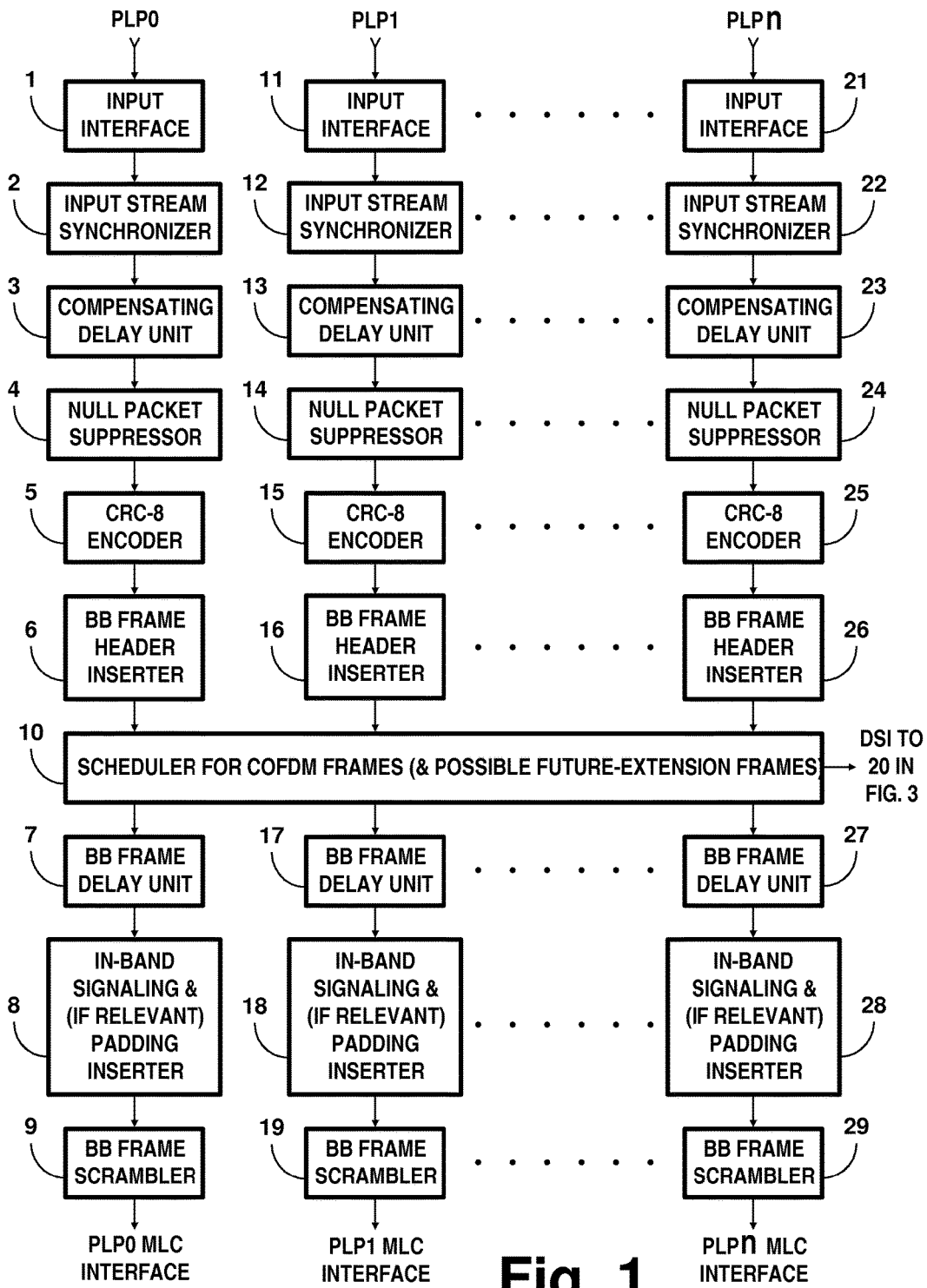
FIGS. 1, 2, 3 and 4 together form a schematic diagram of COFDM transmitter embodying aspects of the invention, which transmitter twice transmits the same coded DTV signal.
Figure 2:
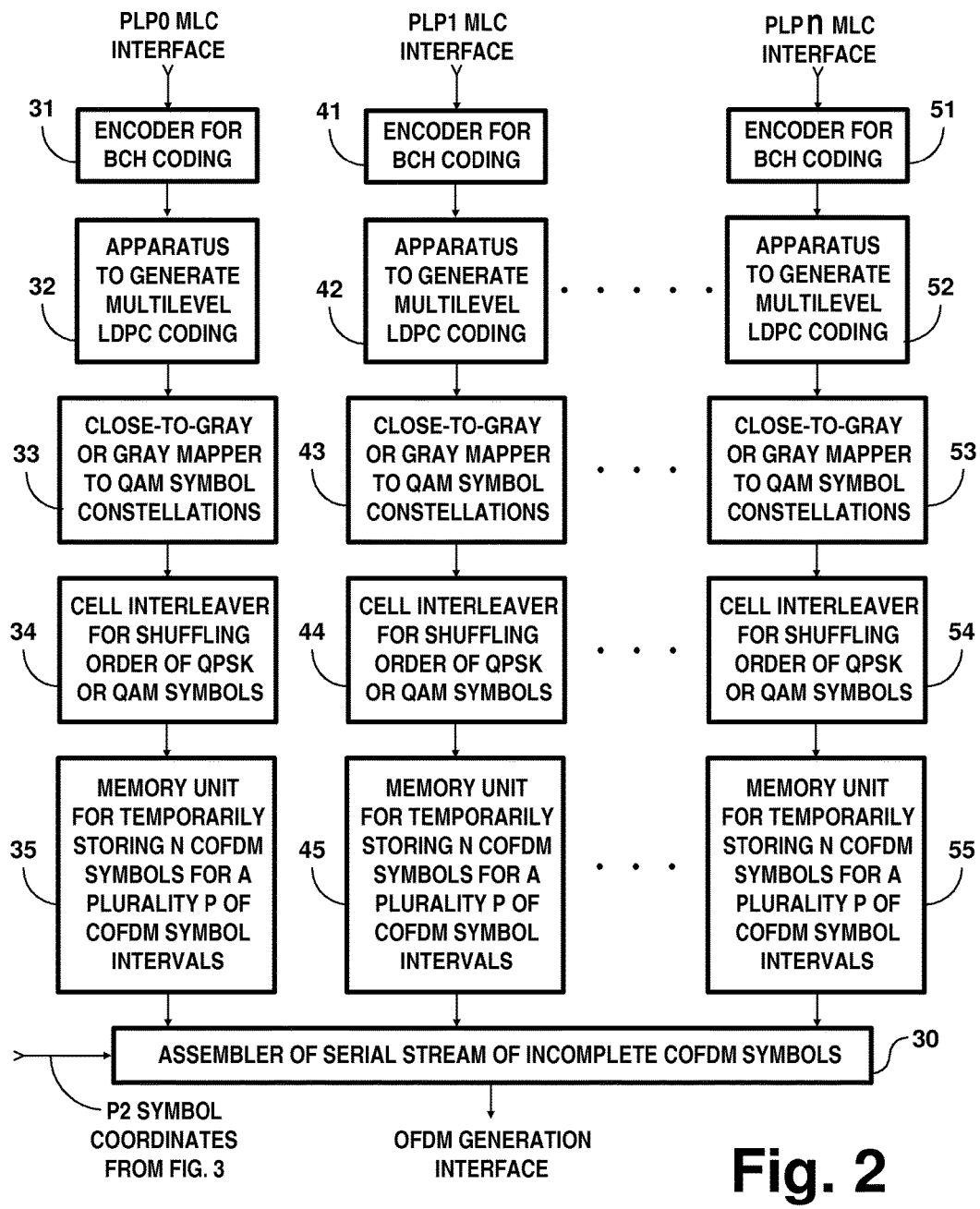
Figure 3:
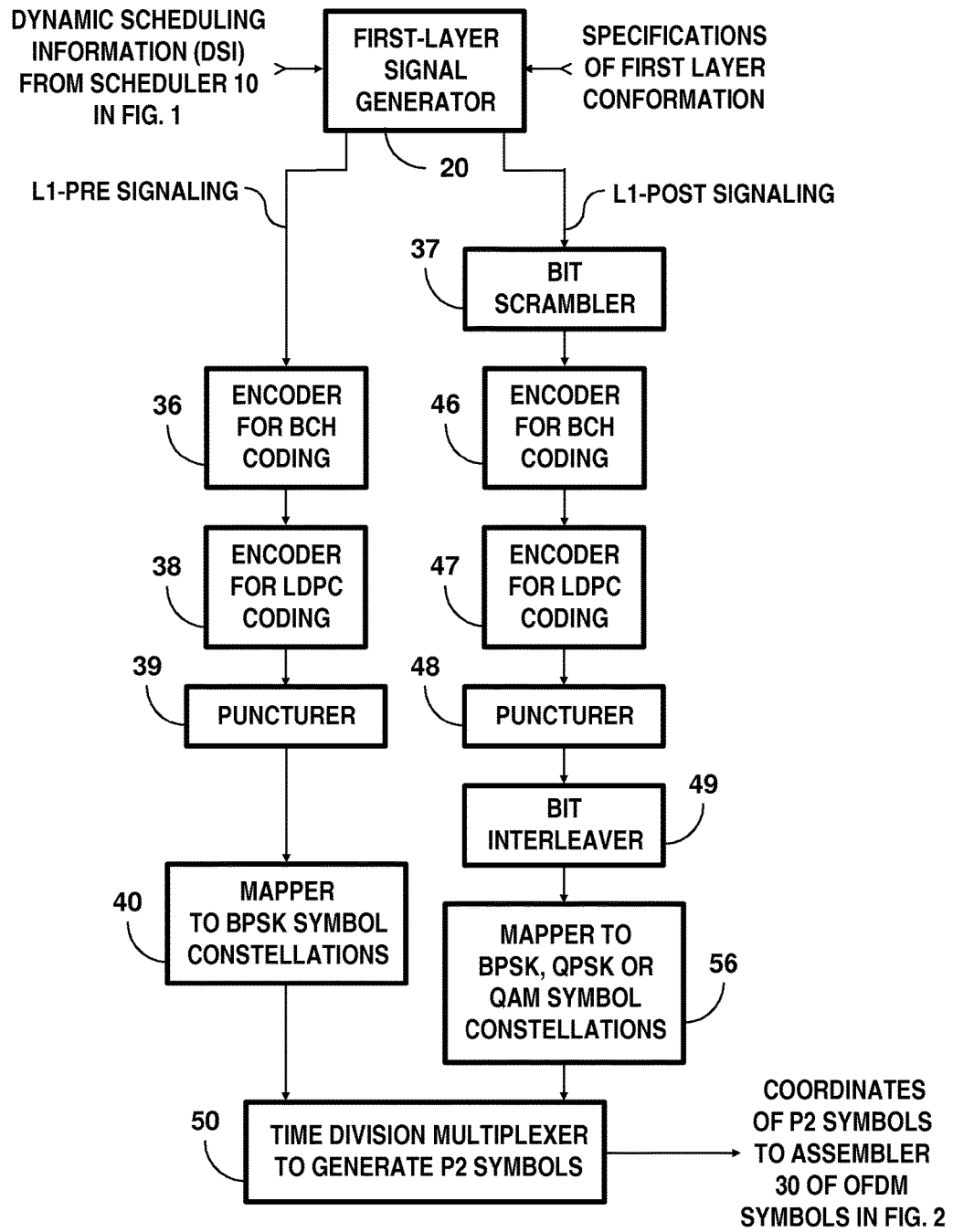
Figure 4:
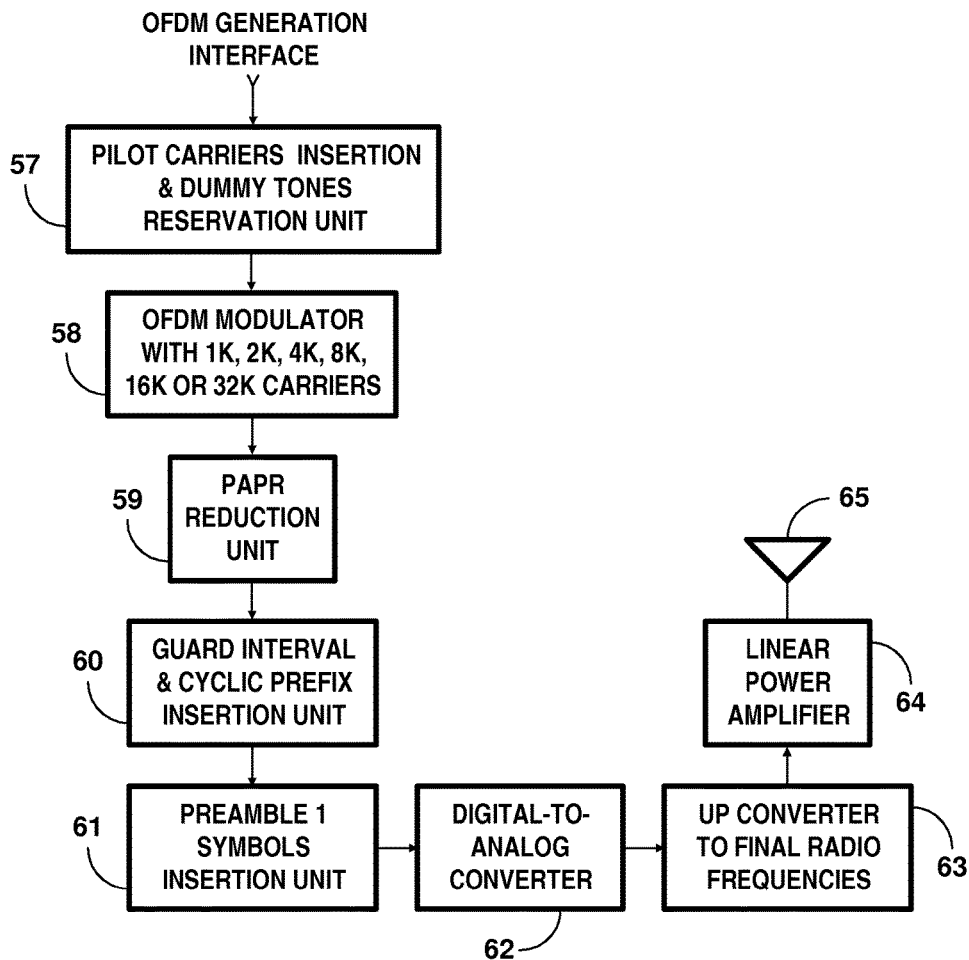

FIGS. 1, 2, 3 and 4 depict a DTV transmitter generating COFDM signals designed for reception by DTV receivers. FIG. 1 depicts apparatus for generating scrambled baseband frames (BBFRAMES) at a Multilevel Coding (MLC) interface. FIG. 2 depicts apparatus for generating bit-wise forward-error-correction (FEC) coding and subsequent COFDM symbol blocks responsive to the scrambled BBFRAMEs supplied at the MLC interface. FIG. 3 depicts apparatus for generating bit-wise forward-error-correction (FEC) coding and subsequent COFDM symbol blocks responsive to first layer (L1) conformation specifications and to dynamic scheduling information (DSI). FIG. 4 depicts apparatus for generating and transmitting radio-frequency COFDM signals. The portions of the DTV transmitter depicted in FIGS. 1, 3 and 4 are essentially the same as specified in European Telecommunications Standards Institute (ETSI) standard EN 462 755 V1.3.1 published in April 2012, titled "Digital Video Broadcasting (DVB); Frame structure channel coding and modulation for a second generation digital terrestrial television broadcasting system (DVB-T2)", and incorporated herein by reference.

A scheduler 10 for interleaving time-slices of services to be broadcast to stationary DTV receivers is depicted in the middle of FIG. 1. The scheduler 10 schedules transmissions of time slices for a number (n+1) of physical layer pipes (PLPs), n being a positive integer at least zero. FIGS. 1 and 2 identify these PLPs by the letters "PLP" followed respectively by consecutive positive integers of a modulo-(n+1) numbering system. The scheduler 10 also generates and schedules dynamic scheduling information (DSI) for application to an additional PLP depicted in FIG. 3, which additional PLP generates OFDM symbol blocks that convey the DSI and first layer conformation specifications. Recommended practice is that at least the physical layer pipe PLP0 is a so-called "common" PLP used for transmitting data, such as a program guide, relating to the other "data" PLPs. The common PLP or PLPs are transmitted in each T2 frame following the P1 and P2 symbols, but before the data PLP or PLPs. A PLP may be of a first type transmitted as a single slice per T2 frame, or the PLP may be of a second type transmitted as a plurality of sub-slices scattered through the T2 frame to achieve greater time diversity.

FIG. 1 depicts the (n+1)th physical layer pipe PLP0 comprising elements 1-6 in cascade connection before the scheduler 10 and further comprising elements 7-9 in cascade connection after the scheduler 10, but before a PLP0 multilevel coding (MLC) interface. More specifically, FIG. 1 indicates that a PLP0 stream of logical digital data is supplied to the input port of an input interface 1, the output port of which connects to the input port of an input stream synchronizer 2. The output port of the input stream synchronizer 2 connects to the input port of a compensating delay unit 3, the output port of which connects to the input port of a null-packet suppressor 4. The output port of the null-packet suppressor 4 connects to the input port of a CRC-8 encoder 5 operative at user packet level, the output port of which encoder 5 connects to the input port of an inserter 6 of headers for baseband (BB) frames. The output port of the BBFRAME header inserter 6 connects to a respective input port of the scheduler 10. The physical layer pipe PLP0 continues following the scheduler 10, with FIG. 1 showing a respective output port of the scheduler 10 connecting to the input port of a delay unit 7 for delaying baseband (BB) frames. FIG. 1 shows the output port of the BBFRAME delay unit 7 connecting to the input port of an inserter 8 for inserting in-band signaling into BBFRAMEs, which in-band signaling essentially consists of dynamic scheduling information (DSI) generated by the scheduler 10, and/or for inserting padding as needed into the BBFRAME. Padding is inserted in circumstances when the user data available for transmission is not sufficient to completely fill a BBFRAME, or when an integral number of user packets is required to be allocated to a BBFRAME. FIG. 1 shows the output port of the inserter 8 connecting to the input port of a BBFRAME scrambler 9, which data-randomizes bits of the BBFRAME supplied from the output port of the BBFRAME scrambler 9 as the PLP0 MLC interface. In practice the delay unit 7, the inserter 8 and the BBFRAME scrambler 9 are realized by suitable configuration of a random-access memory.

FIG. 1 depicts the first physical layer pipe PLP1 comprising elements 11-16 in cascade connection before the scheduler 10 and further comprising elements 17-19 in cascade connection after the scheduler 10, but before a PLP1 multilevel coding (MLC) interface. More specifically, FIG. 1 indicates that a PLP1 stream of logical digital data is supplied to the input port of an input interface 11, the output port of which connects to the input port of an input stream synchronizer 12. The output port of the input stream synchronizer 12 connects to the input port of a compensating delay unit 13, the output port of which connects to the input port of a null-packet suppressor 14. The output port of the null-packet suppressor 14 connects to the input port of a CRC-8 encoder 15 operative at user packet level, the output port of which encoder 15 connects to the input port of an inserter 16 of headers for BBFRAMEs. The output port of the BBFRAME header inserter 16 connects to a respective input port of the scheduler 10. The physical layer pipe PLP1 continues following the scheduler 10, with FIG. 1 showing a respective output port of the scheduler 10 connecting to the input port of a delay unit 17 for delaying BBFRAMEs. FIG. 1 shows the output port of the BBFRAME delay unit 17 connecting to the input port of an inserter 18 for inserting in-band signaling into BBFRAMEs, which in-band signaling essentially consists of DSI generated by the scheduler 10, and/or for inserting padding as needed into the BBFRAME. FIG. 1 shows the output port of the inserter 18 connecting to the input port of a BBFRAME scrambler 19, which data-randomizes bits of the BBFRAME supplied from the output port of the BBFRAME scrambler 19 as the PLP1 MLC interface. In practice the delay unit 17, the inserter 18 and the BBFRAME scrambler 19 are realized by suitable operation of a memory.

FIG. 1 depicts the (n)th physical layer pipe PLPn comprising elements 21-26 in cascade connection before the scheduler 10 and further comprising elements 27-29 in cascade connection after the scheduler 10, but before a PLPn multilevel coding (MLC) interface. More specifically, FIG. 1 indicates that a PLPn stream of logical digital data is supplied to the input port of an input interface 21, the output port of which connects to the input port of an input stream synchronizer 22. The output port of the input stream synchronizer 22 connects to the input port of a compensating delay unit 23, the output port of which connects to the input port of a null-packet suppressor 24. The output port of the null-packet suppressor 24 connects to the input port of a CRC-8 encoder 25 operative at user packet level, the output port of which encoder 25 connects to the input port of an inserter 26 of headers for BBFRAMEs. The output port of the BBFRAME header inserter 26 connects to a respective input port of the scheduler 10. The physical layer pipe PLPn continues following the scheduler 10, with FIG. 1 showing a respective output port of the scheduler 10 connecting to the input port of a delay unit 27 for delaying BBFRAMEs. FIG. 1 shows the output port of the BBFRAME delay unit 27 connecting to the input port of an inserter 28 for inserting in-band signaling into BBFRAMEs, which in-band signaling essentially consists of dynamic scheduling information (DSI) generated by the scheduler 10, and/or for inserting padding as needed into the BBFRAME. FIG. 1 shows the output port of the inserter 28 connecting to the input port of a BBFRAME scrambler 29, which data-randomizes bits of the BBFRAME supplied from the output port of the BBFRAME scrambler 29 as the PLPn MLC interface. In practice the delay unit 27, the inserter 28 and the BBFRAME scrambler 29 are realized by suitable operation of a memory.

The input stream synchronizers 2, 12, 22 etc. are operable to guarantee Constant Bit Rate (CBR) and constant end-to-end transmission delay for any input data format, when there is more than one input data format. Some transmitters may not include ones of the input stream synchronizers 2, 12, 22 etc. or ones of the compensating delay units 3, 13, 23 etc. For some Transport-Stream (TS) input signals, a large percentage of null-packets may be present in order to accommodate variable bit-rate services in a constant bit-rate TS. In such a case, to avoid unnecessary transmission overhead, the null-packet suppressors 4, 14, 24 etc. identify TS null-packets from the packet-identification (PID) sequences in their packet headers and remove those TS null-packets from the data streams to be scrambled by the BBFRAME scramblers 9, 19, 29 etc. This removal is done in a way such that the removed null-packets can be re-inserted in the receiver in the exact positions they originally were in, thus guaranteeing constant bit-rate and avoiding the need for time-stamp (PCR) updating. Further details of the operation of the input stream synchronizers 2, 12, 22 etc.; the compensating delay units 3, 13, 23 etc.; and the null-packet suppressors 4, 14, 24 etc. can be gleaned from ETSI standard EN 462 755 V1.3.1 for DVB-T2.

FIG. 2 depicts the (n+1)th physical layer pipe PLP0 further comprising elements 31-35 in cascade connection after the PLP0 MLC interface, but before a respective input port of an assembler 30 for assembling a serial stream of incomplete COFDM symbols. More specifically, FIG. 2 indicates that the PLP0 MLC interface signal from the output port of the BBFRAME scrambler 9 is applied to the input port of an encoder 31 for BCH coding. The output port of the encoder 31 supplies BCH-coded PLP0 MLC interface signal to the input port of apparatus 32 to generate multilevel LDPC coding. FIG. 2 shows the output port of the apparatus 32 connected to the input port of a mapper 33 for mapping successive bits of that multilevel LDPC coding to successive QAM constellations. In the case of transmissions broadcast for reception by stationary DTV receivers, these QAM constellations are apt to be square 256QAM constellations or cruciform 512QAM constellations, by way of specific examples. In the case of transmissions broadcast for reception by mobile DTV receivers, these QAM constellations are apt to be square 16QAM constellations, square 64 QAM constellations or cruciform 128QAM constellations, by way of specific examples.

The mapper 33 parses the successive bits of the interleaved FEC coding supplied to its input port into consecutive segments or "cells", each having as many bits as in the labeling of each of the lattice points in the particular QAM constellations to which the FEC coding is mapped in the physical layer pipe PLP0. Gray mapping is preferred for square QAM symbols such as 16QAM, 64QAM, 256QAM etc. In Gray mapping the labels associated with various modulation levels of the carrier change by one bit at most for each small change in modulation level. Gray mapping is not possible for cruciform QAM constellations, but a close-to-Gray mapping is possible in which the labels associated with various modulation levels of the carrier change by one bit or two bits at most for each small change in modulation level. Such close-to-Gray mapping is preferred for cruciform QAM symbols such as 32QAM, 128QAM, 512QAM etc. The mapper 33 responds to the consecutive cells of FEC coding to generate the complex coordinates of successive QAM constellations. The complex coordinates of the QAM symbol constellations are supplied from the output port of mapper 33 to the input port of a "cell" interleaver 34 that shuffles the order of the QAM symbols in each successive time-interleaver (T-I) block. The output port of the cell interleaver 34 connects to the write-input port of a memory unit 35 having a read-output port connected to a respective input port of the assembler 30 for assembling a stream of incomplete COFDM symbols.

FIG. 2 depicts the first physical layer pipe PLP1 further comprising elements 41-45 in cascade connection after the PLP1 MLC interface, but before a respective input port of the assembler 30 for assembling a serial stream of incomplete COFDM symbols. More specifically, FIG. 2 indicates that the PLP1 MLC interface signal from the output port of the BBFRAME scrambler 19 is applied to the input port of an encoder 41 for BCH coding. The output port of the encoder 41 supplies BCH-coded PLP1 MLC interface signal to the input port of apparatus 42 to generate multilevel LDPC coding. FIG. 2 shows the output port of the apparatus 42 connected to the input port of a mapper 43 for mapping successive bits of that multilevel LDPC coding to successive QAM constellations.

The mapper 43 parses the successive bits of the interleaved FEC coding supplied to its input port into consecutive segments or "cells", each having as many bits as in the labeling of each of the lattice points in the particular QAM constellations to which the FEC coding is mapped in the physical layer pipe PLP1. The mapper 43 responds to the consecutive cells of the interleaved FEC coding to generate the complex coordinates of successive QAM constellations. The complex coordinates of the QAM symbol constellations are supplied from the output port of mapper 43 to the input port of a "cell" interleaver 43 that shuffles the order of the QAM symbols in each successive time-interleaver (T-I)

block. The output port of the cell interleaver 44 connects to the write-input port of a memory unit 45 having a read-output port connected to a respective input port of the assembler 30 for assembling a stream of incomplete COFDM symbols.

FIG. 2 depicts the (n)th physical layer pipe PLPn further comprising elements 51-55 in cascade connection after the PLPn MLC interface, but before a respective input port of the assembler 30 for assembling a serial stream of incomplete COFDM symbols. More specifically, FIG. 2 indicates that the PLPn MLC interface signal from the output port of the BBFRAME scrambler 19 is applied to the input port of an encoder 51 for BCH coding. The output port of the encoder 51 supplies BCH-coded PLP1 MLC interface signal to the input port of apparatus 52 to generate multilevel LDPC coding. FIG. 2 shows the output port of the apparatus 52 connected to the input port of a mapper 53 for mapping successive bits of that multilevel LDPC coding to successive QAM constellations.

The mapper 53 parses the successive bits of the interleaved FEC coding supplied to its input port into consecutive segments or "cells", each having as many bits as in the labeling of each of the lattice points in the particular QAM constellations to which the FEC coding is mapped in the physical layer pipe PLPn. The mapper 53 responds to the consecutive cells of the interleaved FEC coding to generate the complex coordinates of successive QAM constellations. The complex coordinates of the QAM symbol constellations are supplied from the output port of mapper 53 to the input port of a "cell" interleaver 54 that shuffles the order of the QAM symbols in each successive time-interleaver (T-I) block. The output port of the cell interleaver 54 connects to the write-input port of a memory unit 55 having a read-output port connected to a respective input port of the assembler 30 for assembling a stream of incomplete COFDM symbols.

There is usually a number of other physical layer pipes besides PLP0, PLP1 and PLPn, which other physical pipes are identified by the prefix PLP followed by respective ones of consecutive numbers three through (n−1). Each of these PLPs, n+1 in number, may differ from the others in at least one aspect. One possible difference between these n PLPs concerns the compositions of the LDPC coding these PLPs respectively employ. ETSI standard EN 302 755 V1.3.1 for DVB-T2 specifies a block size of 64,800 bits for normal FEC frames as a first alternative, and a block size of 16,200 bits is specified for short FEC frames as a second alternative. Also, a variety of different LDPC code rates are authorized. PLPs may differ in the number of OFDM carriers involved in each of their spectral samples, which affects the size of the DFT used for demodulating those OFDM carriers. Another possible difference between PLPs concerns the natures of the QAM constellations (or possibly other modulation symbol constellations) they respectively employ.

In accordance with well-known practice, it is preferable that the mappers 33, 43, 53 etc. for the PLPs provide Gray mapping of bit-interleaved LDPC coding to square QAM constellations. Cruciform QAM constellations cannot be Gray mapped exactly, but it is preferable that the mappers 33, 43, 53 etc. for the PLPs provide close-to-Gray mapping of such QAM constellations. By way of examples, cruciform 32QAM constellations, cruciform 128QAM constellations and cruciform 512QAM constellations are possible. Cruciform QAM constellations are advantageous in that they tend to have smaller PAPRs than square QAM constellations have.

The shuffling of the order of the QAM symbols in each successive time-interleaver (T-I) block performed by the "cell" interleavers 34, 44, 54 etc. implements cyclic delay diversity (CDD) that helps the FEC coding to overcome frequency-selective fading. This is particularly useful for single-time transmissions, where the data are transmitted only once. Each T-I block extends over several COFDM symbol intervals.

Each of the memory units 35, 45, 55 etc. can temporarily store a number N of COFDM symbols for a plurality 2N COFDM symbol intervals. These memory units support initial transmissions of COFDM symbols and final transmissions of the same COFDM symbols some time later pursuant to single-time retransmission. Preferably, the delay between the initial and final transmissions of the same COFDM symbols is one or a few COFDM frame intervals, to provide sufficient time-diversity to enable a DTV receiver better to overcome disruption of one of the transmissions of the same COFDM symbols owing to interference or to momentary fade in received signal strength.

The function of the assembler 30 is to assemble the complex coordinates of QAM constellations read from the memory units 35, 45, 55 etc. for each of the PLPs and the complex coordinates of QAM constellations of the modulated L1 signaling data into arrays of incomplete COFDM symbols to be conveyed within respective ones of COFDM frames such as the T2-frames prescribed for DVB-T2 in ETSI standard EN 302 755 V1.3.1. The COFDM symbols are incomplete inasmuch as they do not yet have inserted into them pilot carriers nor tones to adjust peak-to-average power ratio (PAPR) Successive ones of these COFDM frames, possibly with Future Extension Frame (FEF) parts interspersed among them, make up super-frames in the overall frame structure. The assembler 30 comprises respective buffer memories for the n PLPs and means for time-division multiplexing COFDM frames from the various PLPs into an OFDM generation interface signal to be supplied to the FIG. 4 portion of the transmitter for broadcasting DTV signals. The buffer memories included in the assembler 30 are usually dual-ported random-access memories (RAMs). The cell interleaving procedures described in §§6.4 of ETSI standard EN 302 755 V1.3.1 and the time interleaving procedures described in §§6.5 of ETSI standard EN 302 755 V1.3.1 can subsumed into the addressing of these RAMs, rather than using the separate cell interleavers 34, 44, 54 etc. depicted in FIG. 2. The operation of the assembler 30 for assembling a serial stream of incomplete COFDM symbols takes into account the configuration of the frame structure and is further controlled responsive to the dynamic scheduling information produced by the scheduler 10. FIG. 2 does not explicitly depict the connections for applying these control signals to the assembler 30. FIG. 2 depicts the assembler 30 connected for receiving at an input port thereof coordinates of P2 modulation symbols supplied from apparatus depicted in FIG. 3.

The coordinates of P2 modulation symbol constellations supplied from the FIG. 3 apparatus convey the conformation of the frame structure and also convey the dynamic scheduling information (DSI) produced by the scheduler 10. FIG. 3 depicts a first-layer signal generator 20 with two input ports and two output ports. The first of the two input ports is connected for receiving DSI from the scheduler 10, and the second of the two input ports is connected for receiving digital indications specifying the conformation of the frame structure. The first output port of the first-layer (L1) signal generator 20 is connected for supplying L1-pre signaling to the input port of an encoder 36 for BCH coding, and the second output port of the first-layer signal generator 20 is connected for supplying L1-post signaling to the input port of a bit scrambler 37.

FIG. 3 depicts the output port of the encoder 36 for BCH coding connected to the input port of an encoder 38 for LDPC coding. The output port of the encoder 38 connects to the input port of a puncturer 39, the output port of which connects to the input port of a mapper 40 for mapping the coded L1-pre signaling to BPSK symbol constellations. The output port of the mapper 40 connects to a first of two input ports of a time-division multiplexer 50. Details of the processing of L1-pre signaling are essentially as described in §§7.3.1.1 of ETSI standard EN 302 755 V1.3.1 for DVB-T2.

The bit scrambler 37 provides data bit randomization similar to that provided by the BBFRAME scramblers 9, 19 and 29. The output port of the bit scrambler 37 connects to the input port of an encoder 46 for BCH coding. The output port of the encoder 45 for BCH coding is connected to the input port of an encoder 47 for LDPC coding. FIG. 3 depicts the output port of the encoder 47 connected to the input port of a puncturer 48, the output port of which connects to the input port of a bit interleaver 49. The output port of the bit interleaver 49 connects to the input port of a mapper 56 for mapping the coded L1-post signaling to BPSK, QPSK, 16QAM or 64QAM constellations. The output port of the mapper 56 connects to the second input port of the time-division multiplexer 50. The puncturer 48 is optional and can be replaced by a direct connection from the output port of the encoder 47 for LDPC coding to the input port of the bit interleaver 49. Details of the processing of L1-post signaling are essentially as described in §§7.3.2 and §§7.3.3 of ETSI standard EN 302 755 V1.3.1 for DVB-T2. The L1-post signaling is modified to include information concerning the operations of the respective memory units 35, 45, 55 etc. for the PLPs.

The time-division multiplexer 50 is configured for generating a response therefrom that time-interleaves complex coordinates of the BPSK symbol constellations mapping respective segments of coded L1-pre signaling supplied to its first input port from the mapper 40 with the complex coordinates of the BPSK, QPSK or QAM constellations mapping respective segments of coded L1-post signaling supplied to its second input port from the mapper 56. FIG. 3 indicates that the time-division multiplexer 50 supplies the complex coordinates of P2 symbols in its response to a respective input port of the assembler 30 of COFDM symbols depicted in FIG. 2.

A transmission signal in an OFDM broadcast system is transmitted in successive segments called OFDM symbol blocks. Each OFDM symbol block includes an interval during which an effective symbol is supplied for inverse discrete Fourier transformation (I-DFT), and further includes a guard interval into which the waveform of a part of the latter half of this effective symbol will be directly copied. This guard interval is provided in the initial half of the OFDM symbol block. In an OFDM system, such a guard interval is provided to improve performance during multipath reception. A plurality of OFDM symbol blocks are collected to form one OFDM transmission frame. For example, in the ISDB-T standard, ten OFDM transmission frames are formed by a succession of two hundred four OFDM symbol blocks. Insertion positions of pilot signals are set with this unit of OFDM transmission frames as a reference.

FIG. 4 depicts apparatus that generates and transmits radio-frequency COFDM signals responsive to the stream of OFDM symbols supplied via an OFDM generation interface from the output port of the FIG. 2 assembler 30 for assembling a serial stream of OFDM symbols. The output port of the assembler 30 connects to the input port of a pilot carriers insertion and dummy tones reservation unit 57. ETSI standard EN 302 755 V1.3.1 identifies a number of different patterns regarding the insertion of pilot carriers into the frequency spectrum of the transmission channel, any one of which may be used for a PLP in DVB-T2.

The output port of the pilot carriers insertion and dummy tones reservation unit 57 is connected for supplying the COFDM symbol blocks with pilot carriers inserted therein to the input port of a subsequent OFDM modulator 58. FIG. 4 depicts the OFDM modulator 58 as having 1 K, 2K, 4K, 8K, 16K or 32K carriers capability. That is, nominal size of the discrete Fourier transform (DFT) can be 1 K, 2K, 4K, 8K, 16K or 32K. The 16K and 32K sizes of DFT are suitable for transmissions to stationary DTV receivers. Transmissions to mobile receivers are apt to employ smaller DFT size, 8K generally being preferred. The 1K DFT size is employed only when sending indications of the beginnings of COFDM (T2) frames.

The OFDM modulator 58 includes a serial-to-parallel converter for converting the serially generated complex digital samples of the effective COFDM symbols to parallel complex digital samples for inverse discrete Fourier transformation (I-DFT). The OFDM modulator 58 further includes a parallel-to-serial converter for converting the parallel complex digital samples of the I-DFT results to serial complex digital samples of the I-DFT results. FIG. 4 depicts a connection for applying digital samples supplied from the output port of the OFDM modulator 58 to the input port of a peak-to-average-power-ratio (PAPR) reduction unit 59.

ETSI standard EN 302 755 V1.3.1 includes two methods for reducing PAPR in DVB-T2 that allow about a 20% reduction in peak amplifier power rating, which can save significantly on electricity costs for operating a broadcast station. In the first method, called "tone reservation", 1% of the OFDM carriers are reserved and do not carry any data, but instead may be used for inserting values that will counteract the peaks in the signal. In the second method, called "active constellation extension", the values of certain of the edge constellation points are moved "outward" in such way as to reduce the signal peaks. Since only edge constellation points are ever moved outward, their movement has no significant impact on the ability of the DTV receiver to decode the data.

The output port of the PAPR reduction unit 59 is connected to the input port of a guard-interval-and-cyclic-prefix-insertion unit 60. The output port of the guard-interval-and-cyclic-prefix insertion unit 60 is connected to the input port of a unit 61 for inserting preamble-1 (P1) symbols into the digital data stream. The output port of the P1 symbols insertion unit 61 connects to the input port of a digital-to-analog converter 62, the output port of which is connected for supplying analog COFDM carriers to the input port of an up converter 63. The up converter 63 converts the analog COFDM carriers in the DAC 62 response to final radio frequencies and is connected for supplying them from its output port to the input port of a linear power amplifier 64. FIG. 4 depicts the output port of the linear power amplifier 64 connected for driving RF analog COFDM signal power to a transmission antenna 65. FIG. 4 omits depicting some details of the DTV transmitter, such as band-shaping filters for the RF signals.

Figure 5:
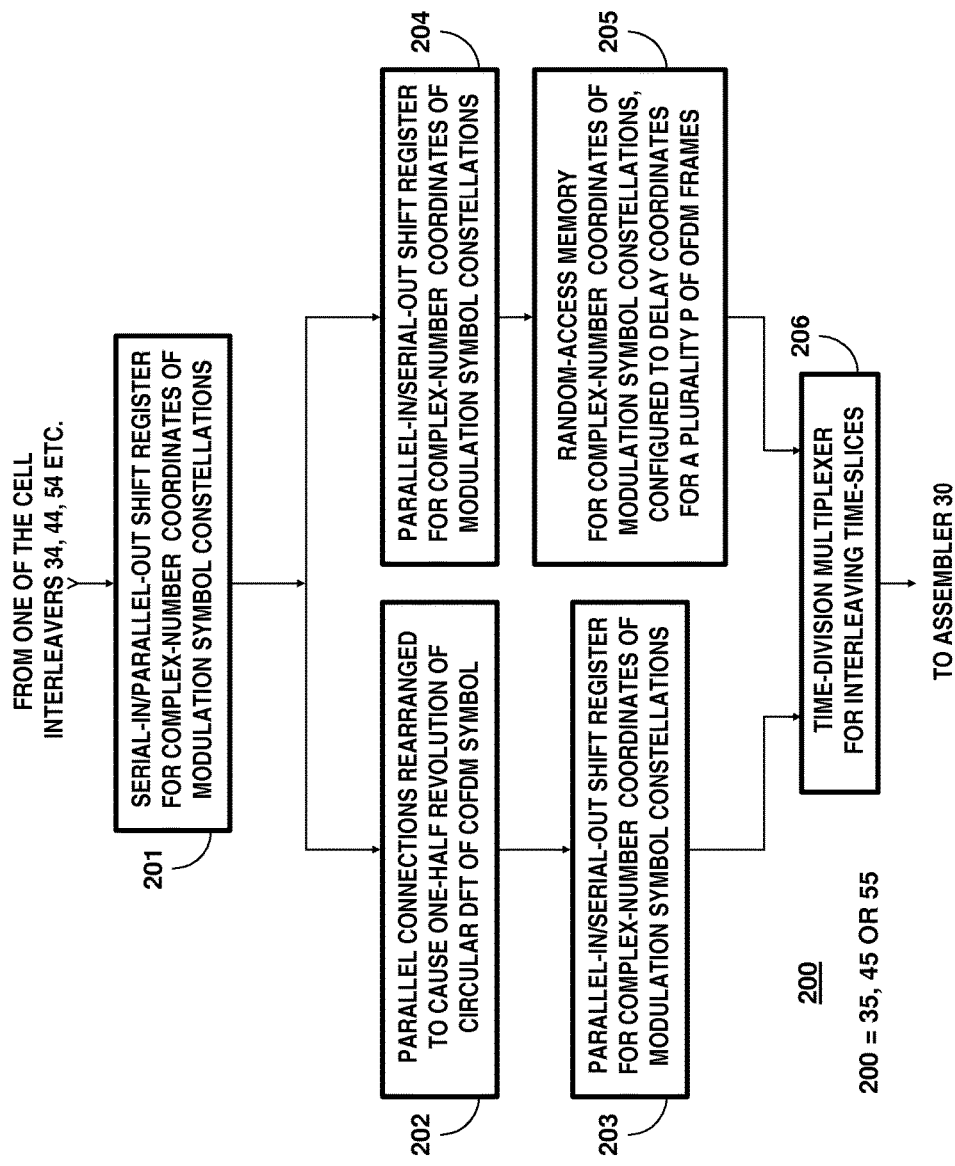
FIG. 5 is a detailed schematic diagram of representative structure for each of the memory units depicted in FIG. 2.

FIG. 5 depicts a preferred memory structure 200 appropriate for any of the memory units 35, 45, 55 etc. in the FIG.

2 portion of the COFDM transmitter depicted in FIGS. 1, 2, 3 and 4 of the drawings. Complex COFDM symbols or cells are supplied from one of the cell interleavers 34, 44, 54 etc. in the FIG. 2 portion of the COFDM transmitter to the input port of a serial-in/parallel-out (SIPO) shift register 201 in the FIG. 5 memory structure 200. The number of parallel bit streams from the multiple-connection output port of the SIPO shift register 201 is such as to comprehend all the bits in a complex COFDM symbol. Parallel connections 202 rearrange these parallel bit streams for application to the multiple-connection input port of a parallel-in/serial-out (PISO) shift register 203. The rearrangement is such as to rotate the circular DFT of the COFDM symbol by one-half revolution. That is, the PISO shift register 203 supplies a serial bitstream from its output port that reproduces the final half of each COFDM symbol supplied to the input port of the SIPO shift register 201 before reproducing the initial half of each COFDM symbol supplied to the input port of the SIPO shift register 201. This bitstream is subsequently used in the initial transmissions conveying FEC-coded data for iterative-diversity reception.

The bitstream to be used in the final transmissions conveying FEC-coded data for iterative-diversity reception is generated by the FIG. 5 memory structure, using a further parallel-in/serial-out (PISO) shift register 204 and a random-access memory (RAM) 205. The multiple-connection output port of the SIPO shift register 201 connects to the multiple-connection input port of the SIPO shift register 204. The SIPO shift register 204 supplies a serial bitstream from its output port that reproduces each COFDM symbol supplied to the input port of the SIPO shift register 201, without altering the order of the bits therein. The total latent delay of COFDM symbols processed through the shift registers 201 and 204 compensates for latent delay of COFDM symbols processed through the shift registers 201 and 203, except for the half-revolution of DFT of COFDM symbols introduced by rearrangement of bit streams in the parallel connections 202. The RAM 205 is configured to delay the COFDM symbols reproduced at the output port of the SIPO shift register 204 further, delaying them for a plurality P in number of COFDM (or T2) frame intervals.

FIG. 5 depicts a time-division multiplexer 206 for interleaving time slices for inclusion in the earlier transmissions for iterative-diversity reception with time slices for inclusion in the earlier transmissions for iterative-diversity reception. The output port of the SIPO shift register 203 is connected for supplying the time-slices for inclusion in the earlier transmissions for iterative-diversity reception to a first of two input ports of the time-division multiplexer 206. A read-output port of the RAM 205 is connected for supplying the second input port of the time-division multiplexer 206 with delayed time-slices for inclusion in the later transmissions for iterative-diversity reception. The output port of the time-division multiplexer 206 connects to an input port of the assembler 30. The time-interleaving introduced by time-division multiplexer 206 in the FIG. 5 memory structure delays the COFDM symbols with non-rotated circular DFT an extra time-slice interval compared to the COFDM symbols with rotated circular DFT. This differential delay is preferably accomplished by suitable addressing of the RAM 205, rather than by an additional delay element within the multiplexer 206.

In a modification of what is depicted in FIG. 5, the time-division multiplexer 206 is replaced by tri-state buffering at the output ports of the PISO shift register 203 and the RAM 205. In another modification of what is depicted in FIG. 5, the RAM 205 is written to in parallel with writing to the input port of the SIPO shift register 201, and the PISO shift register 204 is dispensed with. The addressing of the RAM 205 is adjusted for properly interleaving the COFDM symbols with rotated circular DFT and the COFDM symbols with non-rotated circular DFT.

FIG. 6 is a table tabulating modifications of the S1 field in the P1 Signaling data used in DVB-T2. These modifications signal DTV receivers as to whether an initial transmission or a final transmission of coded data is currently being transmitted. A one-time transmission of coded data is signaled like a final transmission of coded data.

Figure 7:
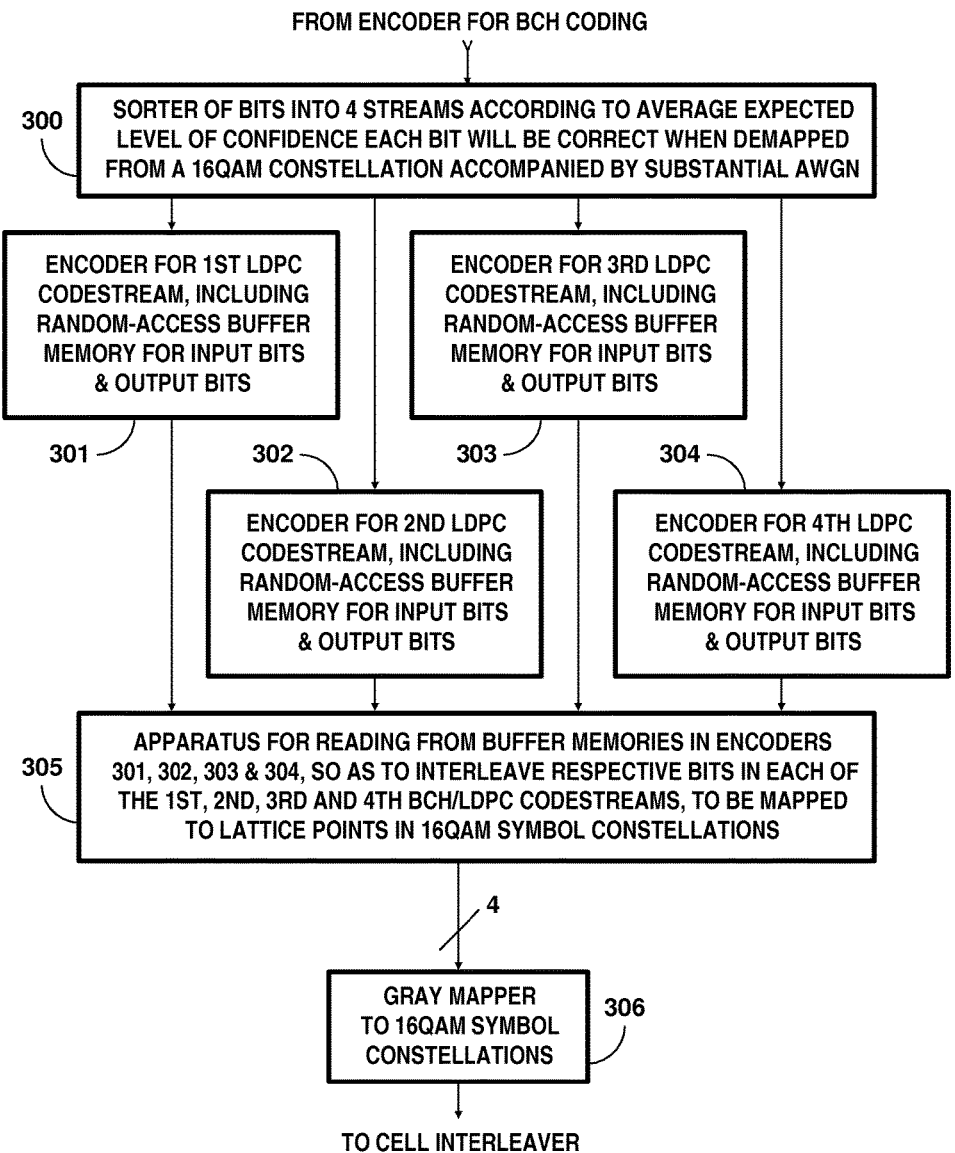
FIG. 7 is a detailed schematic diagram of one embodiment of apparatus to generate multilevel LDPC FEC coding, which apparatus is suitable for inclusion together with a mapper for 16QAM in the FIG. 2 portion of the COFDM transmitter.

FIG. 7 shows in detail a first embodiment of apparatus to generate multilevel LDPC coding for mapping to 16QAM symbol constellations, as can be included one of the PLPs in the FIG. 2 portion of the COFDM transmitter. More particularly, FIG. 7 indicates that BCH coding is supplied to the input port of a sorter 300 of the successive bits of each BCH codeword for cyclical assignment to an in-phase first level of MLC, a quadrature-phase first level of MLC, an in-phase second level of MLC and a quadrature-phase second level of MLC. The groups of bits assigned to the in-phase first level of MLC and the groups of bits assigned to the quadrature-phase first level of MLC are each shorter than a standard-length constituent LDPC codeword by a first prescribed number of chips that will be occupied by respective parity bits after their LDPC coding. The groups of bits assigned to the in-phase second level of MLC and the groups of bits assigned to the quadrature-phase second level of MLC are each shorter than a standard-length constituent LDPC codeword by a second prescribed number of chips that will be occupied by respective parity bits after their LDPC coding. The first and second prescribed numbers of chips to be occupied by parity bits in the constituent LDPC codewords are assigned according to the average expected level of confidence that each bit in those LDPC codewords will be correct when the DTV receiver de-maps those bits from a 16QAM constellation accompanied by substantial AWGN.

The bits in the first level of LDPC-MLC are those that change least frequently in the in-phase direction and those that change least frequently in the quadrature-phase direction as mapped within 16QAM constellations. The bits in the second level of LDPC-MLC are those that change most frequently in the in-phase direction and those that change most frequently in the quadrature-phase direction as mapped within 16QAM constellations. So, there is greater likelihood that the bits in the in-phase second level of MLC and in the quadrature-phase second level of MLC will be corrupted by AWGN than the bits in the in-phase first level of MLC and in the quadrature-phase first level of MLC will be. Therefore, the LDPC codewords in the in-phase second level of MLC and in the quadrature-phase second level of MLC will each have a larger number of LDPC parity bits in them than the LDPC codewords in the in-phase first level of MLC and in the quadrature-phase first level of MLC will each have.

FIG. 7 shows a first output port of the sorter 300 connected for supplying the bits assigned to the in-phase first level of MLC seriatim in a first bitstream to the input port of an encoder 301 for LDPC coding the first bitstream. FIG. 7 shows a second output port of the sorter 300 connected for supplying the bits assigned to the quadrature-phase first level of MLC seriatim in a second bitstream to the input port of an encoder 302 for LDPC coding the second bitstream. FIG. 7 shows a third output port of the sorter 300 connected for supplying the bits assigned to the in-phase second level of MLC seriatim in a third bitstream to the input port of an encoder 303 for LDPC coding the third bitstream. FIG. 7 shows a fourth output port of the sorter 300 connected for supplying the bits assigned to the quadrature-phase second level of MLC seriatim in a fourth bitstream to the input port of an encoder 304 for LDPC coding the fourth bitstream.

Time-division multiplexer (TDM) apparatus 305 arranges for time-division-multiplexed reading from respective random-access buffer memories included in the encoders 301, 302, 303 and 304 after all those encoders finish LDPC coding their respective codestreams in an FEC frame. The TDM apparatus 305 generates or helps generate successive Gray labels for specifying lattice points in 16QAM symbol constellations. Each Gray label is generated responsive to one bit of first LDPC codestream read from the buffer memory of encoder 301, one bit of second LDPC codestream read from the buffer memory of encoder 302, one bit of third LDPC codestream read from the buffer memory of encoder 303, and one bit of fourth LDPC codestream read from the buffer memory of encoder 304. FIG. 7 shows the output port of the TDM apparatus 305 connected to supply Gray labels to the input port of the mapper 306 for Gray mapping those sets of four bits to respective 16QAM symbol constellations. The mapper 306 corresponds to one of the mappers 33, 43, 53 etc. depicted in FIG. 2.

Figure 8:
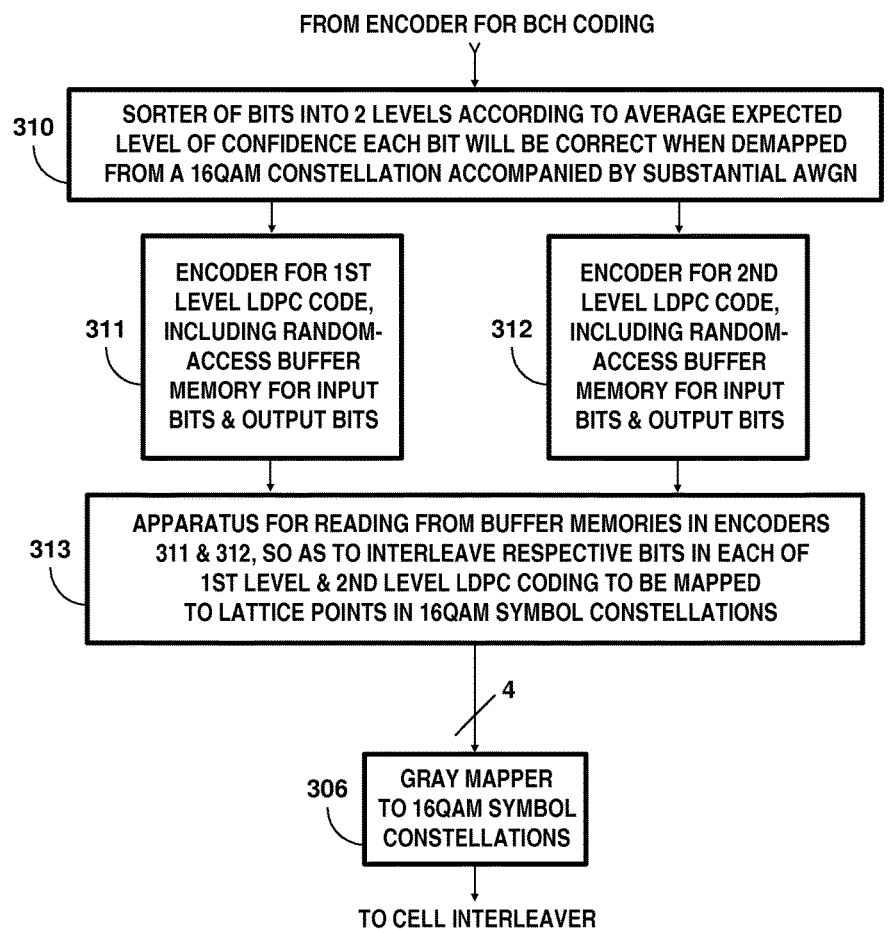
FIG. 8 is a detailed schematic diagram of another embodiment of apparatus to generate multilevel LDPC FEC coding, which apparatus is suitable for inclusion together with a mapper for 16QAM in the FIG. 2 portion of the COFDM transmitter.

FIG. 8 shows in detail a second embodiment of apparatus to generate multilevel LDPC coding for mapping to 16QAM symbol constellations, as can be included in one of the PLPs in the FIG. 2 portion of the COFDM transmitter. More particularly, FIG. 8 indicates that BCH coding is supplied to the input port of a sorter 310 of successive bits of each BCH codeword for cyclical assignment to two levels according to the average expected level of confidence that each bit will be correct when the DTV receiver de-maps those bits from a 16QAM constellation accompanied by substantial AWGN.

A first output port of the sorter 310 is connected for supplying the input port of an encoder 311 for LDPC coding each group of bits of the BCH coding assigned to the level of MLC less likely to exhibit AWGN-caused error in the results of de-mapping 16QAM constellations in the DTV receiver. A second output port of the sorter 310 is connected for supplying the input port of an encoder 312 each group of bits of the BCH coding assigned to the level of MLC more likely to exhibit AWGN-caused error in the results of de-mapping 16QAM constellations in the DTV receiver.

Time-division multiplexer (TDM) apparatus 313 arranges for time-division-multiplexed reading from respective random-access buffer memories included in the encoders 311 and 312 after both those encoders finish LDPC coding their respective streams of BCH coding in an FEC frame. The TDM apparatus 313 generates or helps generate successive Gray labels for specifying lattice points in 16QAM symbol constellations. Each Gray label is generated responsive to two bits of a first-level LDPC codeword read from the buffer memory of encoder 311 and two bits of a second-level LDPC codeword read from the buffer memory of encoder 312. FIG. 8 depicts the output port of the TDM apparatus 313 connected to supply Gray labels to the input port of the mapper 306 for Gray mapping their bits to 16QAM symbol constellations.

FIG. 9 illustrates the compositions of the constituent LDPC codewords temporarily stored in the buffer memories of the encoders 301, 302, 303 and 304 of the FIG. 7 apparatus to generate multilevel LDPC coding for mapping to 16QAM symbols. The codewords of the first LPDC codestream temporarily stored in the buffer memory of the encoder 301 and the codewords of the second LPDC codestream temporarily stored in the buffer memory of the encoder 302 each have the same number of parity bits for LDPC coding as the other. The codewords of the third LPDC codestream temporarily stored in the buffer memory of the encoder 303 and the codewords of the fourth LPDC codestream temporarily stored in the buffer memory of the encoder 304 each have the same number of parity bits for LDPC coding as the other, but approximately twice as many as in the codewords of the first and the second LPDC codestreams. The larger number of parity bits in the third and fourth LPDC codestreams compensates for the mapping of these codestreams within successive 16QAM symbol constellations being more likely to experience error in channels with AWGN than the first and second LPDC codestreams are.

FIG. 10 illustrates the compositions of the constituent LDPC codewords temporarily stored in the buffer memories of the encoders 311 and 312 of the FIG. 8 apparatus to generate multilevel LDPC coding for mapping to 16QAM symbols. The second-level LDPC codewords temporarily stored in the buffer memory of the encoder 312 each have approximately twice as many parity bits as the first-level codewords temporarily stored in the buffer memory of the encoder 311. The larger number of parity bits in the second-level LDPC codewords compensates for the mapping of successive ones of these codewords within successive 16QAM symbol constellations being more likely to experience error in channels with AWGN than successive first-level LDPC codewords mapped within those successive 16QAM symbol constellations.

Figure 11:
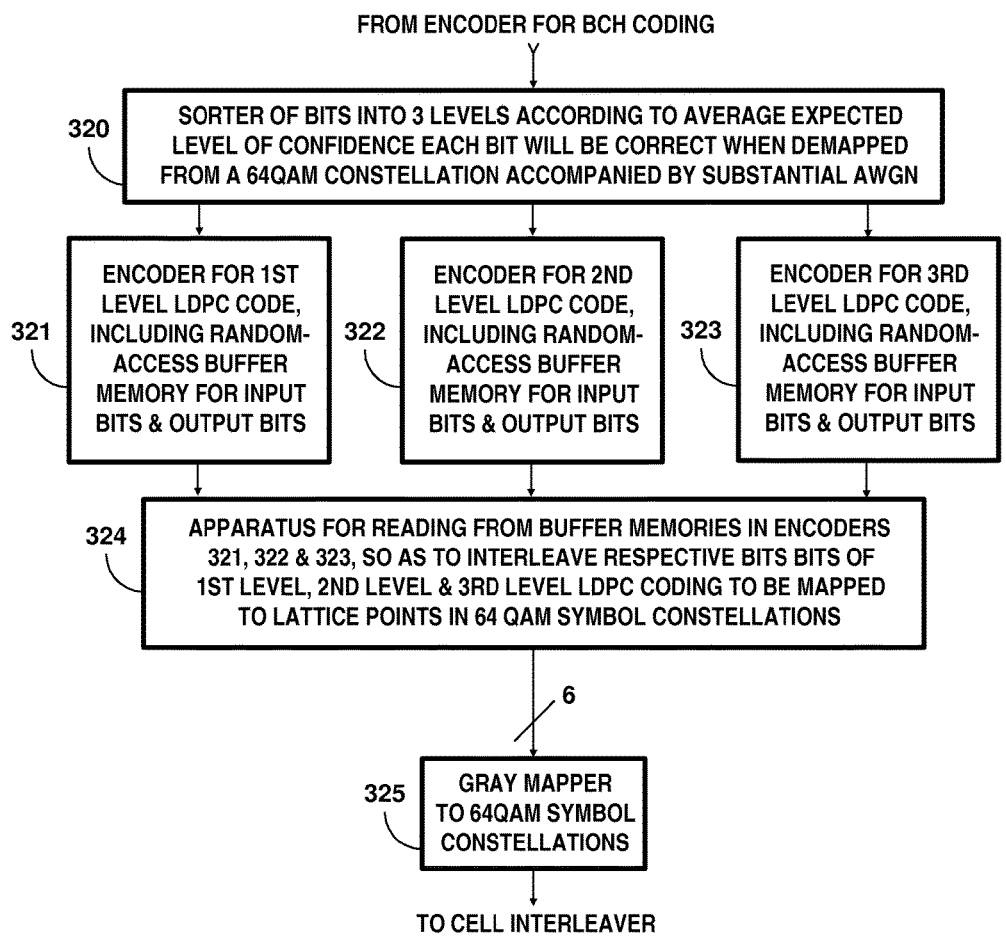
FIG. 11 is a detailed schematic diagram of one embodiment of apparatus to generate multilevel LDPC FEC coding, which apparatus is suitable for inclusion together with a mapper for 64 QAM in the FIG. 2 portion of the COFDM transmitter.

FIG. 11 shows in detail a first embodiment of apparatus to generate multilevel LDPC coding for mapping to 64QAM symbol constellations, as can be included one of the PLPs in the FIG. 2 portion of the COFDM transmitter. More particularly, FIG. 11 indicates that BCH coding is supplied to the input port of a sorter 320 of successive bits of BCH coding for cyclical assignment to three levels according to the average expected level of confidence that each bit will be correct when the DTV receiver de-maps those bits from a 64QAM constellation accompanied by substantial AWGN. The groups of bits assigned to the first level each consist of a prescribed number of bits larger than a prescribed number of bits that groups of bits assigned to the second level each consist of. The groups of bits assigned to the second level each consist of a prescribed number of bits larger than a prescribed number of bits that groups of bits assigned to the third level each consist of.

FIG. 11 shows encoders 321, 322 and 323 for LDPC coding being included within the one of the apparatuses 31, 41, 51 etc. depicted in FIG. 2 that resides in the PLP under consideration and is used for generating multilevel LDPC coding. A first output port of the sorter 320 is connected for supplying the input port of the encoder 321 those groups of bits assigned to the first level of MLC least likely to exhibit AWGN-caused error in the results of de-mapping 64QAM constellations in the DTV receiver. A second output port of the sorter 320 is connected for supplying the input port of the encoder 322 those groups of bits assigned to the second level of MLC more likely, but not most likely, to exhibit AWGN-caused error in the results of de-mapping 64QAM constellations in the DTV receiver. A third output port of the sorter 320 is connected for supplying the input port of the encoder 323 those groups of bits assigned to the third level of MLC most likely to exhibit AWGN-caused error in the results of de-mapping 64QAM constellations in the DTV receiver. The groups of bits assigned to the first level each consist of a prescribed number of bits larger than a prescribed number of bits that groups of bits assigned to the second level each consist of. The groups of bits assigned to the second level each consist of a prescribed number of bits larger than a prescribed number of bits that groups of bits assigned to the third level each consist of.

Time-division multiplexer (TDM) apparatus 324 arranges for time-division-multiplexed reading from respective random-access buffer memories included in the encoders 321, 322 and 323 after all those encoders finish LDPC coding their respective levels of BCH coding in an FEC frame. The TDM apparatus 324 generates or helps generate successive Gray labels for specifying lattice points in a 64QAM symbol constellation. Each Gray label is generated responsive to two bits of a first-level LDPC codeword read from the buffer memory of encoder 321, two bits of a second-level LDPC codeword read from the buffer memory of encoder 322 and two bits of a third-level LDPC codeword read from the buffer memory of encoder 323. FIG. 11 depicts the output port of the TDM apparatus 324 connected to supply interleaved bits to the input port of a mapper 325 for Gray mapping those bits to 64QAM symbol constellations.

Figure 12:
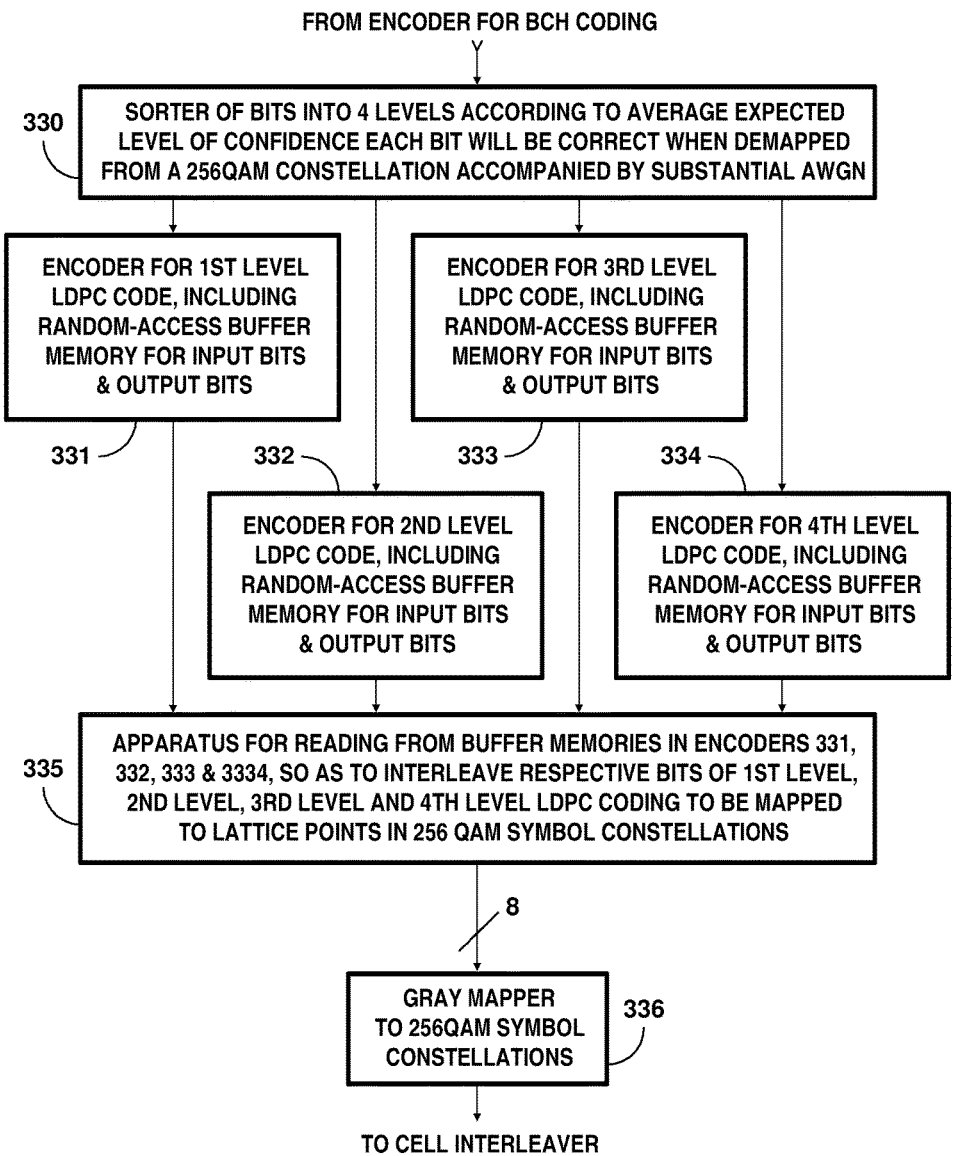
FIG. 12 is a detailed schematic diagram of one embodiment of apparatus to generate multilevel LDPC FEC coding, which apparatus is suitable for inclusion together with a mapper for 256QAM in the FIG. 2 portion of the COFDM transmitter.

FIG. 12 shows in detail a first embodiment of apparatus to generate multilevel LDPC coding for mapping to 256QAM symbol constellations, as can be included one of the PLPs in the FIG. 2 portion of the COFDM transmitter. More particularly, FIG. 12 indicates that BCH coding is supplied to the input port of a sorter 330 of successive bits of each BCH codeword for cyclical assignment to four levels according to the average expected level of confidence that each bit will be correct when the DTV receiver de-maps those bits from a 256QAM constellation accompanied by substantial AWGN.

FIG. 12 shows encoders 331, 332, 333 and 334 for LDPC coding being included within the one of the apparatuses 31, 41, 51 etc. depicted in FIG. 2 that resides in the PLP under consideration and is used for generating multilevel LDPC coding. A first output port of the sorter 330 is connected for supplying the input port of the encoder 331 those groups of bits assigned to the first level of MLC least likely to exhibit AWGN-caused error in the results of de-mapping 256QAM constellations in the DTV receiver. A second output port of the sorter 330 is connected for supplying the input port of the encoder 332 those groups of bits assigned to the second level of MLC next more likely to exhibit AWGN-caused error in the results of de-mapping 256QAM constellations in the DTV receiver. A third output port of the sorter 330 is connected for supplying the input port of the encoder 333 those groups of bits assigned to the third level of MLC even next more likely to exhibit AWGN-caused error in the results of de-mapping 256QAM constellations in the DTV receiver. A fourth output port of the sorter 320 is connected for supplying the input port of the encoder 334 those groups of bits assigned to the forth level of MLC most likely to exhibit AWGN-caused error in the results of de-mapping 256QAM constellations in the DTV receiver.

Time-division multiplexer (TDM) apparatus 335 arranges for time-division-multiplexed reading from respective random-access buffer memories included in the encoders 331, 332, 333 and 334 after all those encoders finish LDPC coding their respective levels of LDPC coding in an FEC frame. The TDM apparatus 335 generates or helps generate successive Gray labels for specifying lattice points in a 256QAM symbol constellation. Each Gray label is generated responsive to two bits of a first-level LDPC codeword read from the buffer memory of encoder 331, two bits of a second-level LDPC codeword read from the buffer memory of encoder 332, two bits of a third-level LDPC codeword read from the buffer memory of encoder 333, and two bits of a fourth-level LDPC codeword read from the buffer memory of encoder 334. FIG. 12 depicts the output port of the TDM apparatus 335 connected to supply interleaved bits to the input port of a mapper 336 for Gray mapping those bits to 256QAM symbol constellations.

FIG. 13 illustrates the compositions of the constituent LDPC codewords temporarily stored in the buffer memories of the encoders 321, 322 and 323 of the FIG. 11 apparatus to generate multilevel LDPC coding for mapping to 64QAM symbols. In LDPC-MLC per FIG. 13 there are many more LDPC parity bits for the third level LDPC coding than for the second level of systematic bits and BCH coding parity bits, and there are many more LDPC parity bits for the second level of LDPC coding than for the first level of LDPC coding. Successive pairs of bits in the first level of LDPC coding specify the quadrants within the 64QAM constellations those pairs of bits are mapped to by the Gray mapper 325. Successive pairs of bits in the second level of LDPC coding specify the sub-quadrants of the quadrants within the 64QAM constellations that successive pairs of bits in the second level of LDPC coding are mapped to by the Gray mapper 325. Successive pairs of bits in the third level of LDPC coding specify the sub-sub-quadrants of the sub-quadrants of the quadrants within the 64QAM constellations that successive pairs of bits in the third level of LDPC coding are mapped to by the Gray mapper 325. FIG. 13 suggests the number of parity bits of the first-level LDPC coding, the number of parity bits of the second-level LDPC coding and the number of parity bits of the third-level LDPC coding being in 1:2:4 ratio. This set of ratios is based on the approximate likelihood of error in each level owing to additive white Gaussian noise (AWGN). The component ratios are apt to be optimized over the course of time, based on extensive computer simulation of noise conditions.

FIG. 14 illustrates the compositions of the constituent LDPC codewords temporarily stored in the buffer memories of the encoders 331, 332, 333 and 334 of the FIG. 12 apparatus to generate multilevel LDPC coding for mapping to 256QAM symbols. In LDPC-MLC per FIG. 14 there are many more LDPC-coding parity bits for the fourth level of LDPC coding than for the third level of LDPC coding, there are many more LDPC-coding parity bits for the third level of LDPC coding than for the second level LDPC coding, and there are many more LDPC-coding parity bits for the second level of LDPC coding than for the first level of LDPC coding. The uppermost of the blocks in FIG. 14 (as viewed from the right side of the page) depicts successive bits of a partial BCH codeword followed by the parity bits for first-level LDPC coding, as arranged for being mapped to a first set of lattice points in each of the point lattices mapped to respective ones of 256QAM constellations for inverse Fourier transformation to a COFDM signal. The next-to-uppermost one of the blocks in FIG. 14 (as viewed from the right side of the page) depicts successive bits of a partial BCH codeword followed by parity bits for second-level LDPC coding, as arranged for being mapped to a second set of lattice points in each of the point lattices mapped to respective ones of 256QAM constellations for inverse Fourier transformation to a COFDM signal. The next-to-lowest one of the blocks in FIG. 14 (as viewed from the right side of the page) depicts successive bits of a partial BCH codeword followed by the parity bits for third-level LDPC coding, as arranged for being mapped to a third set of lattice points in each of the point lattices mapped to respective ones of 256QAM constellations for inverse Fourier transformation to a COFDM signal. The lowermost one of the blocks in FIG. 14 (as viewed from the right side of the page) depicts successive bits of a partial BCH codeword followed by the parity bits for fourth-level LDPC coding, as arranged for being mapped to a fourth set of lattice points in each of the point lattices mapped to respective ones of 256QAM constellations for inverse Fourier transformation to a COFDM signal. FIG. 14 suggests the numbers of parity bits for the first, second, third and fourth levels of LDPC-MLC being in 1:2:4:8 ratio. This set of ratios is based on the approximate likelihood of error in each level owing to AWGN. These ratios are apt to be optimized over the course of time, based on extensive computer simulation of noise conditions encountered in the field.

Figure 15:
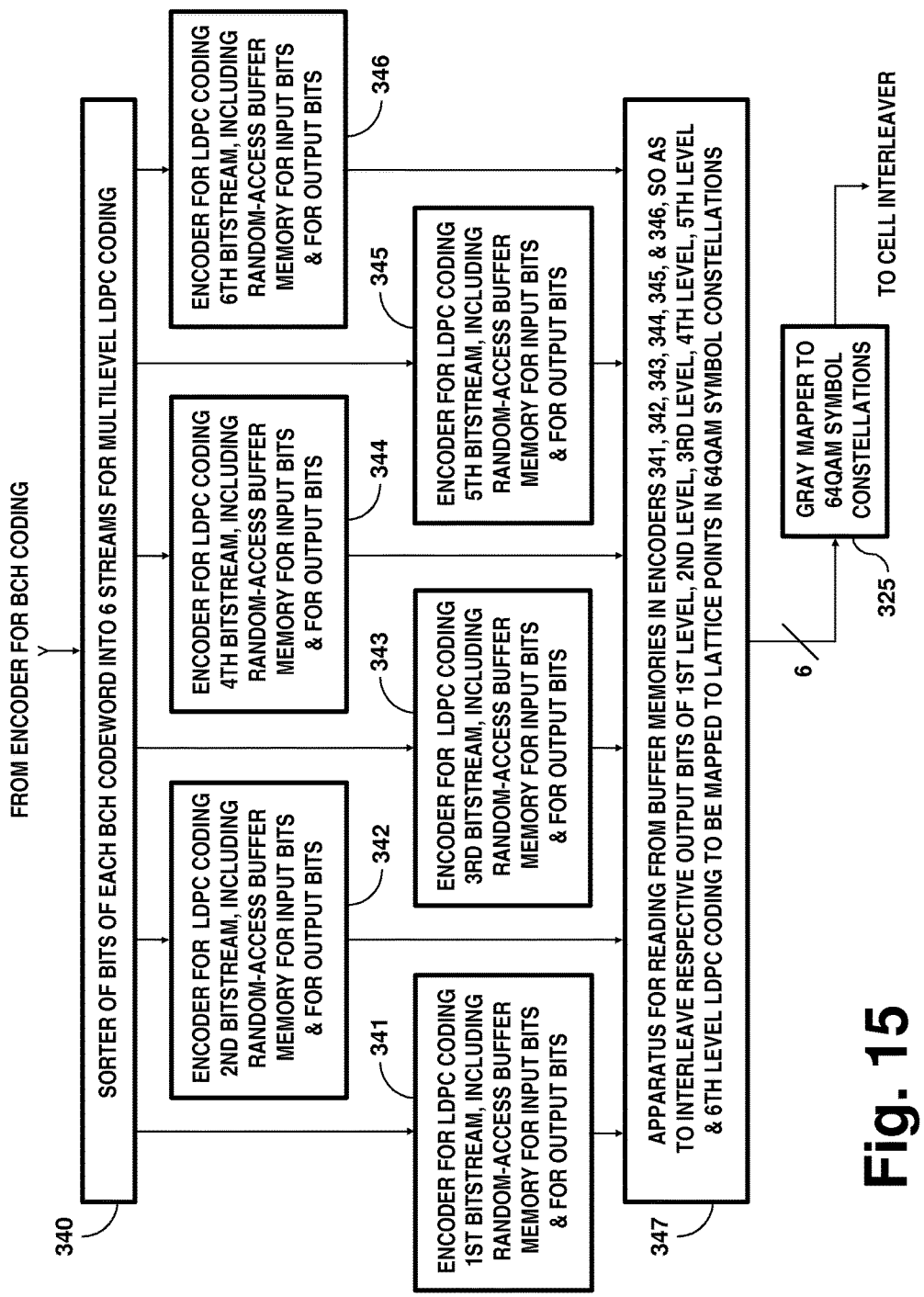
FIG. 15 is a detailed schematic diagram of another embodiment of apparatus to generate multilevel LDPC FEC coding, which apparatus is suitable for inclusion together with a mapper for 64QAM in the FIG. 2 portion of the COFDM transmitter.

FIG. 15 depicts in detail a second embodiment of apparatus to generate multilevel LDPC coding for mapping to 64QAM symbol constellations, as can be included one of the PLPs in the FIG. 2 portion of the COFDM transmitter. The FIG. 15 embodiment of such part of the FIG. 2 portion of the COFDM transmitter is essentially a modification of the FIG. 11 embodiment of this part of the FIG. 2 portion of the COFDM transmitter. In this modification the three respective streams of systematic data bits for three levels of multilevel LDPC coding are each subdivided into two halves for separate LDPC coding. The groups of bits assigned to the in-phase first level of MLC and the groups of bits assigned to the quadrature-phase first level of MLC are each shorter than a standard-length constituent LDPC codeword by a first prescribed number of chips that will be occupied by respective parity bits after their LDPC coding. The groups of bits assigned to the in-phase second level of MLC and the groups of bits assigned to the quadrature-phase second level of MLC are each shorter than a standard-length constituent LDPC codeword by a second prescribed number of chips that will be occupied by respective parity bits after their LDPC coding. The groups of bits assigned to the in-phase third level of MLC and the groups of bits assigned to the quadrature-phase third level of MLC are each shorter than a standard-length constituent LDPC codeword by a third prescribed number of chips that will be occupied by respective parity bits after their LDPC coding. The first, second and third prescribed numbers of chips to be occupied by parity bits in the constituent LDPC codewords are assigned according to the average expected level of confidence that each bit in those LDPC codewords will be correct when the DTV receiver de-maps those bits from a 64QAM constellation accompanied by substantial AWGN.

The bits in the first level of LDPC-MLC are those that change least frequently in the in-phase direction and those that change least frequently in the quadrature-phase direction as mapped within 64QAM constellations. The bits in the second level of LDPC-MLC are those that change more, but not most, frequently in the in-phase direction and those that change more, but not most, frequently in the quadrature-phase direction as mapped within 64QAM constellations. The bits in the third level of LDPC-MLC are those that change most frequently in the in-phase direction and those that change most frequently in the quadrature-phase direction as mapped within 64QAM constellations.

There is greater likelihood, then, that the bits in the in-phase third level of MLC and in the quadrature-phase third level of MLC will be corrupted by AWGN than the bits in the in-phase second level of MLC and in the quadrature-phase second level of MLC will be. Therefore, the constituent LDPC codewords in the in-phase third level of MLC and in the quadrature-phase third level of MLC will have a larger number of LDPC parity bits in each of them than the constituent LDPC codewords in the in-phase second level of MLC and in the quadrature-phase second level of MLC will each have.

Furthermore, there is greater likelihood that the bits in the in-phase second level of MLC and in the quadrature-phase second level of MLC will be corrupted by AWGN than the bits in the in-phase first level of MLC and in the quadrature-phase first level of MLC will be. Therefore, the constituent LDPC codewords in the in-phase second level of MLC and in the quadrature-phase second level of MLC will each have a larger number of LDPC parity bits in them than the constituent LDPC codewords in the in-phase first level of MLC and in the quadrature-phase first level of MLC will each have.

More particularly, FIG. 15 indicates that BCH coding is supplied to the input port of a sorter 340 of successive bits of each BCH codeword for cyclical assignment to an in-phase first level of MLC, a quadrature-phase first level of MLC, an in-phase second level of MLC, a quadrature-phase second level of MLC, an in-phase third level of MLC and a quadrature-phase third level of MLC. A first output port of the sorter 340 is connected for supplying the bits assigned to the in-phase first level of MLC seriatim in a first bitstream to the input port of an encoder 341 for LDPC coding of the first bitstream. A second output port of the sorter 340 is connected for supplying the bits assigned to the quadrature-phase first level of MLC seriatim in a second bitstream to the input port of an encoder 342 for LDPC coding of the second bitstream. A third output port of the sorter 340 is connected for supplying the bits assigned to the in-phase second level of MLC seriatim in a third bitstream to the input port of an encoder 343 for LDPC coding of the third bitstream. A fourth output port of the sorter 340 is connected for supplying the bits assigned to the quadrature-phase second level of MLC seriatim in a fourth bitstream to the input port of an encoder 344 for LDPC coding of the fourth bitstream. A fifth output port of the sorter 340 is connected for supplying the bits assigned to the in-phase third level of MLC seriatim in a fifth bitstream to the input port of an encoder 345 for LDPC coding of the fifth bitstream. A sixth output port of the sorter 340 is connected for supplying the bits assigned to the quadrature-phase third level of MLC seriatim in a sixth bitstream to the input port of an encoder 346 for LDPC coding of the sixth bitstream. The encoders 341, 342, 343, 344, 345 and 346 provide the constituent LDPC coding for the one of the apparatuses 31, 41, 51 etc. to generate multilevel LDPC coding depicted in FIG. 2 that resides in the PLP under consideration.

Time-division multiplexer (TDM) apparatus 347 arranges for time-division-multiplexed reading from respective random-access buffer memories included in the encoders 341, 342, 343, 344, 345 and 346 after all those encoders finish LDPC coding their respective levels of BCH coding in an FEC frame. The TDM apparatus 347 generates or helps generate successive Gray labels for specifying lattice points in 64QAM symbol constellations. Each Gray label is generated responsive to one bit of first LDPC codestream read from the buffer memory of encoder 341, one bit of second LDPC codestream read from the buffer memory of encoder 342, one bit of third LDPC codestream read from the buffer memory of encoder 343, one bit of fourth LDPC codestream read from the buffer memory of encoder 344, one bit of fifth LDPC codestream read from the buffer memory of encoder 345, and one bit of sixth LDPC codestream read from the buffer memory of encoder 346. FIG. 15 depicts the output port of the TDM apparatus 347 connected to supply Gray labels to the input port of the mapper 325 for Gray mapping those sets of sixth bits to respective 64QAM symbol constellations. The mapper 325 corresponds to one of the mappers 33, 43, 53 etc. depicted in FIG. 2 that resides in the PLP under consideration.

Figure 16:
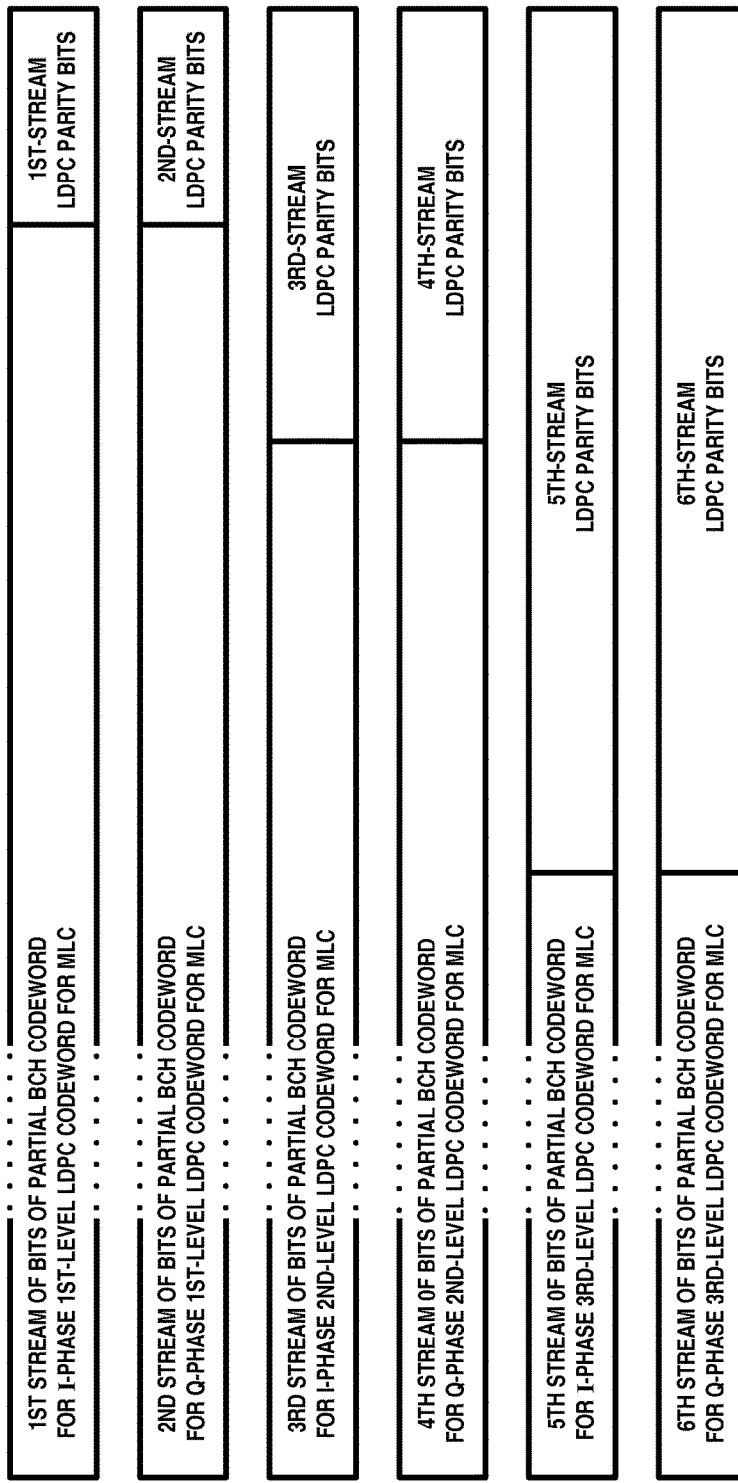
FIG. 16 is a diagram showing the relative numbers of LDPC parity bits in the six constituent codestreams of LDPC-MLC generated by the FIG. 15 apparatus.

FIG. 16 illustrates the compositions of the constituent LDPC codewords temporarily stored in the buffer memories of the encoders 341, 342, 343, 344, 345 and 346 of the FIG. 15 apparatus to generate multilevel LDPC coding for mapping to 64QAM symbols. The codewords of the first LPDC codestream temporarily stored in the buffer memory of the encoder 341 and the codewords of the second LPDC codestream temporarily stored in the buffer memory of the encoder 342 each have the same number of parity bits for LDPC coding as the other.

The codewords of the third LPDC codestream temporarily stored in the buffer memory of the encoder 343 and the codewords of the fourth LPDC codestream temporarily stored in the buffer memory of the encoder 344 each have the same number of parity bits for LDPC coding as the other, but approximately twice as many as in each codeword of the first and the second LPDC codestreams. The larger number of parity bits in the third and fourth LPDC codestreams compensates for the mapping of these codestreams within successive 64QAM symbol constellations being more likely to experience error in channels with AWGN than are the first and second LPDC codestreams.

The codewords of the fifth LPDC codestream temporarily stored in the buffer memory of the encoder 345 and the codewords of the sixth LPDC codestream temporarily stored in the buffer memory of the encoder 346 each have the same number of parity bits for LDPC coding as the other, but approximately twice as many as in each codeword of the third and the fourth LPDC codestreams. The larger number of parity bits in the fifth and the sixth LPDC codestreams compensates for the mapping of these codestreams within successive 64QAM symbol constellations being more likely to experience error in channels with AWGN than are the third and fourth LPDC codestreams.

FIG. 16 suggests the number of parity bits in constituent LDPC codewords in the first, second, third, fourth, fifth and sixth LDPC codestreams being in 1:1:2:2:4:4 ratio. This set of ratios is based on the approximate likelihood of error in each codestream owing to additive white Gaussian noise (AWGN). The component ratios are apt to be optimized over the course of time, based on extensive computer simulation of noise conditions.

Figure 17:
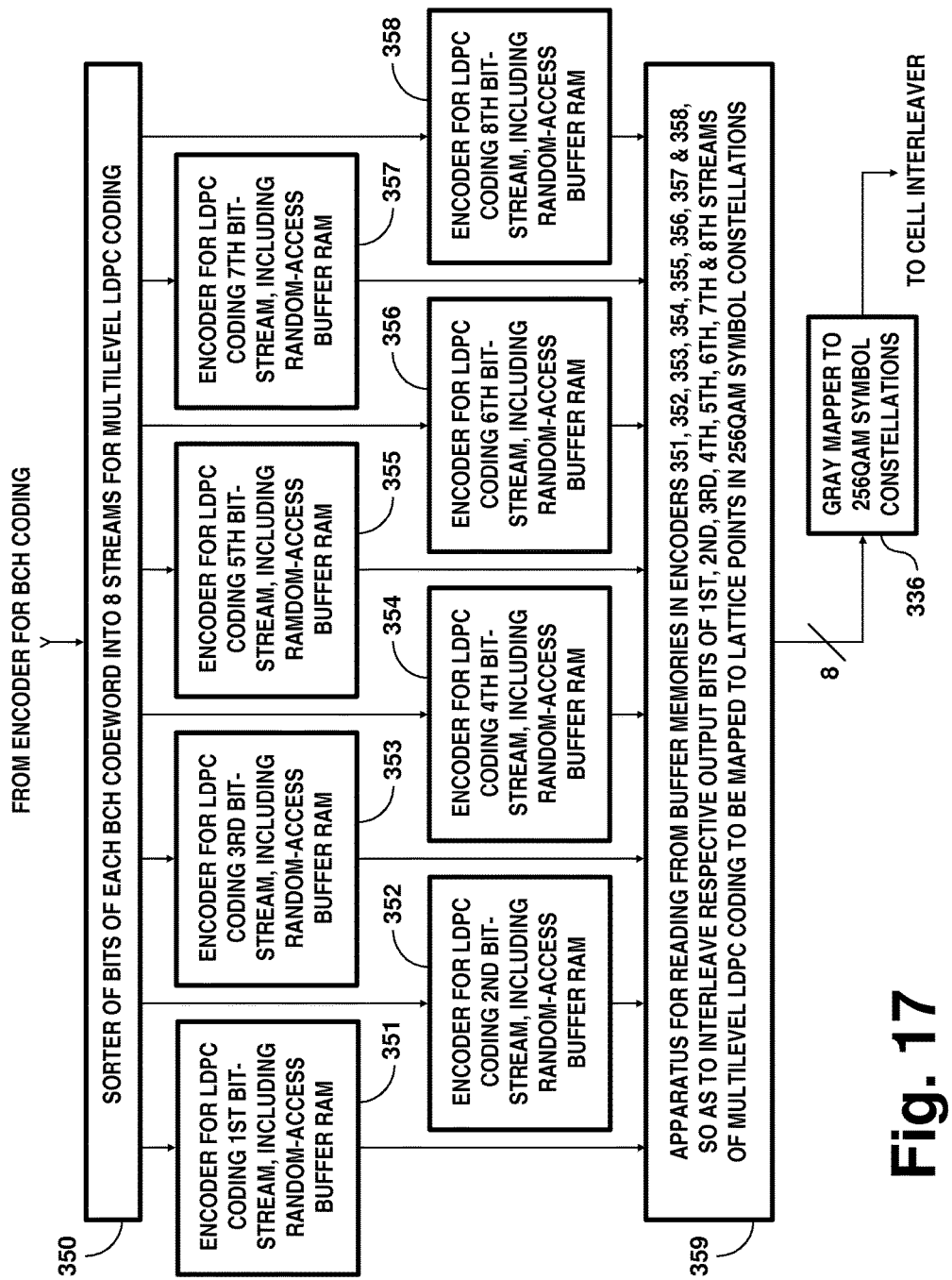
FIG. 17 is a detailed schematic diagram of another embodiment of apparatus to generate multilevel LDPC FEC coding, which apparatus is suitable for inclusion together with a mapper for 256QAM in the FIG. 2 portion of the COFDM transmitter.

FIG. 17 depicts in detail a second embodiment of a part of the FIG. 2 portion of the COFDM transmitter for encoding multilevel LDPC coding, which multilevel coding is designed for being mapped into 256QAM constellations. The FIG. 17 embodiment of such part of the FIG. 2 portion of the COFDM transmitter is essentially a modification of the FIG. 12 embodiment of this part of the FIG. 2 portion of the COFDM transmitter. In this modification the respective streams of systematic data bits for four levels of LDPC coding are each subdivided into two halves for separate LDPC coding. The groups of bits assigned to the in-phase first level of MLC and the groups of bits assigned to the quadrature-phase first level of MLC are each shorter than a standard-length constituent LDPC codeword by a first prescribed number of chips that will be occupied by respective parity bits after their LDPC coding. The groups of bits assigned to the in-phase second level of MLC and the groups of bits assigned to the quadrature-phase second level of MLC are each shorter than a standard-length constituent LDPC codeword by a second prescribed number of chips that will be occupied by respective parity bits after their LDPC coding. The groups of bits assigned to the in-phase third level of MLC and the groups of bits assigned to the quadrature-phase third level of MLC are each shorter than a standard-length constituent LDPC codeword by a third prescribed number of chips that will be occupied by respective parity bits after their LDPC coding. The groups of bits assigned to the in-phase fourth level of MLC and the groups of bits assigned to the quadrature-phase fourth level of MLC are each shorter than a standard-length constituent LDPC codeword by a fourth prescribed number of chips that will be occupied by respective parity bits after their LDPC coding. The first, second, third and fourth prescribed numbers of chips to be occupied by parity bits in the constituent LDPC codewords are assigned according to the average expected level of confidence that each bit in those LDPC codewords will be correct when the DTV receiver de-maps those bits from a 256QAM constellation accompanied by substantial AWGN.

The bits in the first level of LDPC-MLC are those that change least frequently in the in-phase direction and those that change least frequently in the quadrature-phase direction as mapped within 256QAM constellations. The bits in the second level of LDPC-MLC are those that change next to least frequently in the in-phase direction and those that change next to least frequently in the quadrature-phase direction as mapped within 256QAM constellations. The bits in the third level of LDPC-MLC are those that change next to most frequently in the in-phase direction and those that change next to most frequently in the quadrature-phase direction as mapped within 256QAM constellations. The bits in the fourth level of LDPC-MLC are those that change most frequently in the in-phase direction and those that change most frequently in the quadrature-phase direction as mapped within 256QAM constellations.

There is greater likelihood, then, that the bits in the in-phase fourth level of MLC and in the quadrature-phase fourth level of MLC will be corrupted by AWGN than the bits in the in-phase third level of MLC and in the quadrature-phase third level of MLC will be. Therefore, the constituent LDPC codewords in the in-phase third level of MLC and in the quadrature-phase third level of MLC will have a larger number of LDPC parity bits in each of them than the constituent LDPC codewords in the in-phase fourth level of MLC and in the quadrature-phase fourth level of MLC will each have.

Furthermore, there is greater likelihood that the bits in the in-phase third level of MLC and in the quadrature-phase third level of MLC will be corrupted by AWGN than the bits in the in-phase second level of MLC and in the quadrature-phase second level of MLC will be. Therefore, the constituent LDPC codewords in the in-phase third level of MLC and in the quadrature-phase third level of MLC will have a larger number of LDPC parity bits in each of them than the constituent LDPC codewords in the in-phase second level of MLC and in the quadrature-phase second level of MLC will each have.

Furthermore yet, there is greater likelihood that the bits in the in-phase second level of MLC and in the quadrature-phase second level of MLC will be corrupted by AWGN than the bits in the in-phase first level of MLC and in the quadrature-phase first level of MLC will be. Therefore, the constituent LDPC codewords in the in-phase second level of MLC and in the quadrature-phase second level of MLC will each have a larger number of LDPC parity bits in them than the constituent LDPC codewords in the in-phase first level of MLC and in the quadrature-phase first level of MLC will each have.

More particularly, FIG. 17 indicates that BCH coding is supplied to the input port of a sorter 350 of successive bits of each BCH codeword for cyclical assignment to an in-phase first level of MLC, a quadrature-phase first level of MLC, an in-phase second level of MLC, a quadrature-phase second level of MLC, an in-phase third level of MLC, a quadrature-phase third level of MLC, an in-phase fourth level of MLC and a quadrature-phase fourth level of MLC. A first output port of the sorter 350 is connected for supplying the bits assigned to the in-phase first level of MLC seriatim in a first bitstream to the input port of an encoder 351 for LDPC coding the first bitstream. A second output port of the sorter 350 is connected for supplying the bits assigned to the quadrature-phase first level of MLC seriatim in a second bitstream to the input port of an encoder 352 for LDPC coding the second bitstream. A third output port of the sorter 350 is connected for supplying the bits assigned to the in-phase second level of MLC seriatim in a third bitstream to the input port of an encoder 353 for LDPC coding the third bitstream. A fourth output port of the sorter 350 is connected for supplying the bits assigned to the quadrature-phase second level of MLC seriatim in a fourth bitstream to the input port of an encoder 354 for LDPC coding the fourth bitstream. A fifth output port of the sorter 350 is connected for supplying the bits assigned to the in-phase third level of MLC seriatim in a fifth bitstream to the input port of an encoder 355 for LDPC coding the fifth bitstream. A sixth output port of the sorter 350 is connected for supplying the bits assigned to the quadrature-phase third level of MLC seriatim in a sixth bitstream to the input port of an encoder 356 for LDPC coding the sixth bitstream. A seventh output port of the sorter 350 is connected for supplying the bits assigned to the in-phase fourth level of MLC seriatim in a seventh bitstream to the input port of an encoder 357 for LDPC coding the seventh bitstream. An eighth output port of the sorter 350 is connected for supplying the bits assigned to the quadrature-phase fourth level of MLC seriatim in an eighth bitstream to the input port of an encoder 358 for LDPC coding the eighth bitstream. The encoders 351, 352, 353, 354, 355, 356, 357 and 358 provide constituent LDPC coding for the one of the apparatuses 31, 41, 51 etc. to generate multilevel LDPC coding depicted in FIG. 2 that resides in the PLP under consideration.

Time-division multiplexer (TDM) apparatus 359 arranges for time-division-multiplexed reading from respective random-access buffer memories included in the encoders 351, 352, 353, 354, 355, 356, 357 and 358 after all those encoders finish LDPC coding their respective levels of BCH coding in an FEC frame. The TDM apparatus 359 generates or helps generate successive Gray labels for specifying lattice points in 256QAM symbol constellations. Each Gray label is generated responsive to one bit of first LDPC codestream read from the buffer memory of encoder 351, one bit of second LDPC codestream read from the buffer memory of encoder 352, one bit of third LDPC codestream read from the buffer memory of encoder 353, one bit of fourth LDPC codestream read from the buffer memory of encoder 354, one bit of fifth LDPC codestream read from the buffer memory of encoder 355, one bit of sixth LDPC codestream read from the buffer memory of encoder 356, one bit of seventh LDPC codestream read from the buffer memory of encoder 357, and one bit of eighth LDPC codestream read from the buffer memory of encoder 358. FIG. 17 depicts the output port of the TDM apparatus 359 connected to supply Gray labels to the input port of the mapper 336 for Gray mapping those sets of eighth bits to respective 256QAM symbol constellations. The mapper 336 corresponds to the one of the mappers 33, 43, 53 etc. depicted in FIG. 2 that resides in the PLP under consideration.

Figure 18:
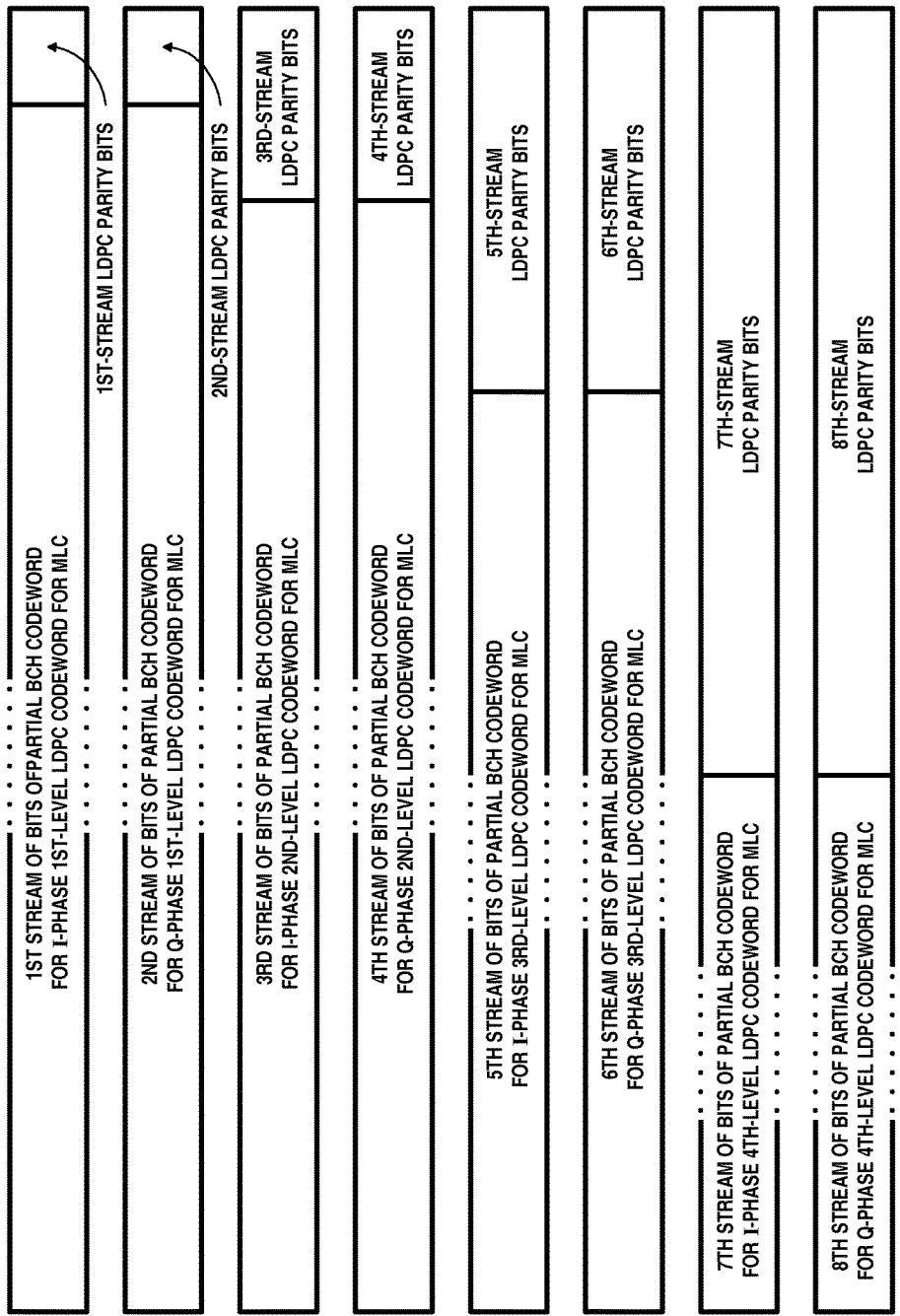
FIG. 18 is a diagram showing the relative numbers of LDPC parity bits in the eight constituent codestreams of LDPC-MLC generated by the FIG. 17 apparatus.

FIG. 18 illustrates the compositions of the constituent LDPC codewords temporarily stored in the buffer memories of the encoders 351, 352, 353, 354, 355, 356, 357 and 358 of the FIG. 17 apparatus to generate multilevel LDPC coding for mapping to 256QAM symbols. The codewords of the first LPDC codestream temporarily stored in the buffer memory of the encoder 351 and the codewords of the second LPDC codestream temporarily stored in the buffer memory of the encoder 352 each have the same number of parity bits for LDPC coding as the other.

The codewords of the third LPDC codestream temporarily stored in the buffer memory of the encoder 353 and the codewords of the fourth LPDC codestream temporarily stored in the buffer memory of the encoder 354 each have the same number of parity bits for LDPC coding as the other, but approximately twice as many as in each codeword of the first and the second LPDC codestreams. The larger number of parity bits in the third and the fourth LPDC codestreams compensates for the mapping of these codestreams within successive 256QAM symbol constellations being more likely to experience error in channels with AWGN than are the first and the second LPDC codestreams.

The codewords of the fifth LPDC codestream temporarily stored in the buffer memory of the encoder 355 and the codewords of the sixth LPDC codestream temporarily stored in the buffer memory of the encoder 356 each have the same number of parity bits for LDPC coding as the other, but approximately twice as many as in each codeword of the third and the fourth LPDC codestreams. The larger number of parity bits in the fifth and thr sixth LPDC codestreams compensates for the mapping of these codestreams within successive 256QAM symbol constellations being more likely to experience error in channels with AWGN than are the third and the fourth LPDC codestreams.

The codewords of the seventh LPDC codestream temporarily stored in the buffer memory of the encoder 357 and the codewords of the eighth LPDC codestream temporarily stored in the buffer memory of the encoder 358 each have the same number of parity bits for LDPC coding as the other, but approximately twice as many as in each codeword of the fifth and the sixth LPDC codestreams. The larger number of parity bits in the seventh and the eighth LPDC codestreams compensates for the mapping of these codestreams within successive 256QAM symbol constellations being more likely to experience error in channels with AWGN than are the fifth and the sixth LPDC codestreams.

FIG. 18 suggests the number of parity bits in constituent LDPC codewords in the first, second, third, fourth, fifth, sixth, seventh and eighth LDPC codestreams being in 1:1:2:2:4:4:8:8 ratio. This set of ratios is based on the approximate likelihood of error in each codestream owing to additive white Gaussian noise (AWGN). The component ratios are apt to be optimized over the course of time, based on extensive computer simulation of noise conditions.

Figure 19:
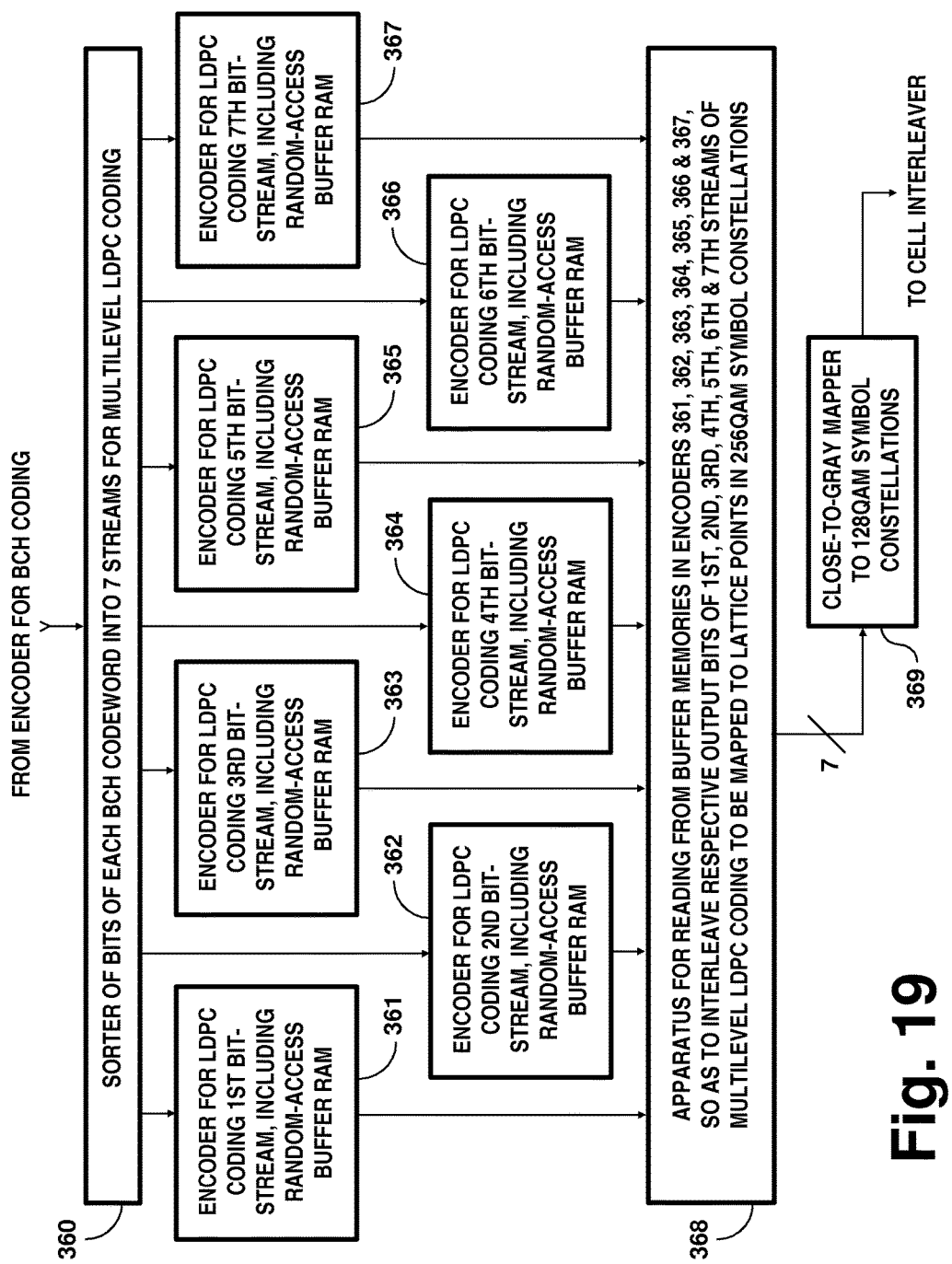
FIG. 19 is a detailed schematic diagram of one embodiment of apparatus to generate multilevel LDPC FEC coding, which apparatus is suitable for inclusion together with a mapper for 128QAM in the FIG. 2 portion of the COFDM transmitter.

FIG. 19 shows in more detail part of the FIG. 2 portion of the COFDM transmitter for encoding multilevel LDPC coding, which multilevel coding is designed for being mapped into 128QAM constellations. More particularly, FIG. 19 indicates that BCH coding is supplied to the input port of a sorter 360 of successive bits of each BCH codeword into seven groups of BCH coding for cyclical assignment bit-by-bit to a first level of MLC, an in-phase second level of MLC, a quadrature-phase second level of MLC, an in-phase third level of MLC, a quadrature-phase third level of MLC, an in-phase fourth level of MLC and a quadrature-phase fourth level of MLC. A first output port of the sorter 360 is connected for supplying the bits assigned to the first level of MLC seriatim in a first bitstream to the input port of an encoder 361 for LDPC coding the first bitstream. A second output port of the sorter 360 is connected for supplying the bits assigned to the in-phase second level of MLC seriatim in a second bitstream to the input port of an encoder 362 for LDPC coding the second bitstream. A third output port of the sorter 360 is connected for supplying the bits assigned to the quadrature-phase second level of MLC seriatim in a third bitstream to the input port of an encoder 363 for LDPC coding the third bitstream. A fourth output port of the sorter 360 is connected for supplying the bits assigned to the in-phase third level of MLC seriatim in a fourth bitstream to the input port of an encoder 364 for LDPC coding the fourth bitstream. A fifth output port of the sorter 360 is connected for supplying the bits assigned to the quadrature-phase third level of MLC seriatim in a fifth bitstream to the input port of an encoder 365 for LDPC coding the fifth bitstream. A sixth output port of the sorter 360 is connected for supplying the bits assigned to the in-phase fourth level of MLC seriatim in a sixth bitstream to the input port of an encoder 366 for LDPC coding the sixth bitstream. A seventh output port of the sorter 360 is connected for supplying the bits assigned to the quadrature-phase fourth level of MLC seriatim in a seventh bitstream to the input port of an encoder 367 for LDPC coding the seventh bitstream. The encoders 361, 362, 363, 364, 365, 366 and 367 provide constituent LDPC coding for the one of the apparatuses 31, 41, 51 etc. to generate multilevel LDPC coding depicted in FIG. 2 that resides in the PLP under consideration.

Time-division multiplexer (TDM) apparatus 368 arranges for time-division-multiplexed reading from respective random-access buffer memories included in the encoders 361, 362, 363, 364, 365, 366 and 367 after all those encoders finish LDPC coding their respective levels of BCH coding in an FEC frame. The TDM apparatus 368 generates or helps generate successive close-to-Gray labels for specifying lattice points in 128QAM symbol constellations. Each close-to-Gray label is generated responsive to one bit of first LDPC codestream read from the buffer memory of encoder 361, one bit of second LDPC codestream read from the buffer memory of encoder 362, one bit of third LDPC codestream read from the buffer memory of encoder 363, one bit of fourth LDPC codestream read from the buffer memory of encoder 364, one bit of fifth LDPC codestream read from the buffer memory of encoder 365, one bit of sixth LDPC codestream read from the buffer memory of encoder 366, and one bit of seventh LDPC codestream read from the buffer memory of encoder 367.

FIG. 19 depicts the output port of the TDM apparatus 368 connected to supply close-to-Gray labels to the input port of a mapper 369 for close-to-Gray mapping those sets of eight bits to respective 128QAM symbol constellations. Such cruciform 128QAM constellations offer close-to-Gray mapping in which the 7-bit segments of the coding mapped to adjacent lattice points in the cruciform point lattice differ by two bits in only 16 instances and otherwise differ by only a single bit in the other 112 instances. The mapper 369 corresponds to the one of the mappers 33, 43, 53 etc. depicted in FIG. 2 that resides in the PLP under consideration.

Figure 20:
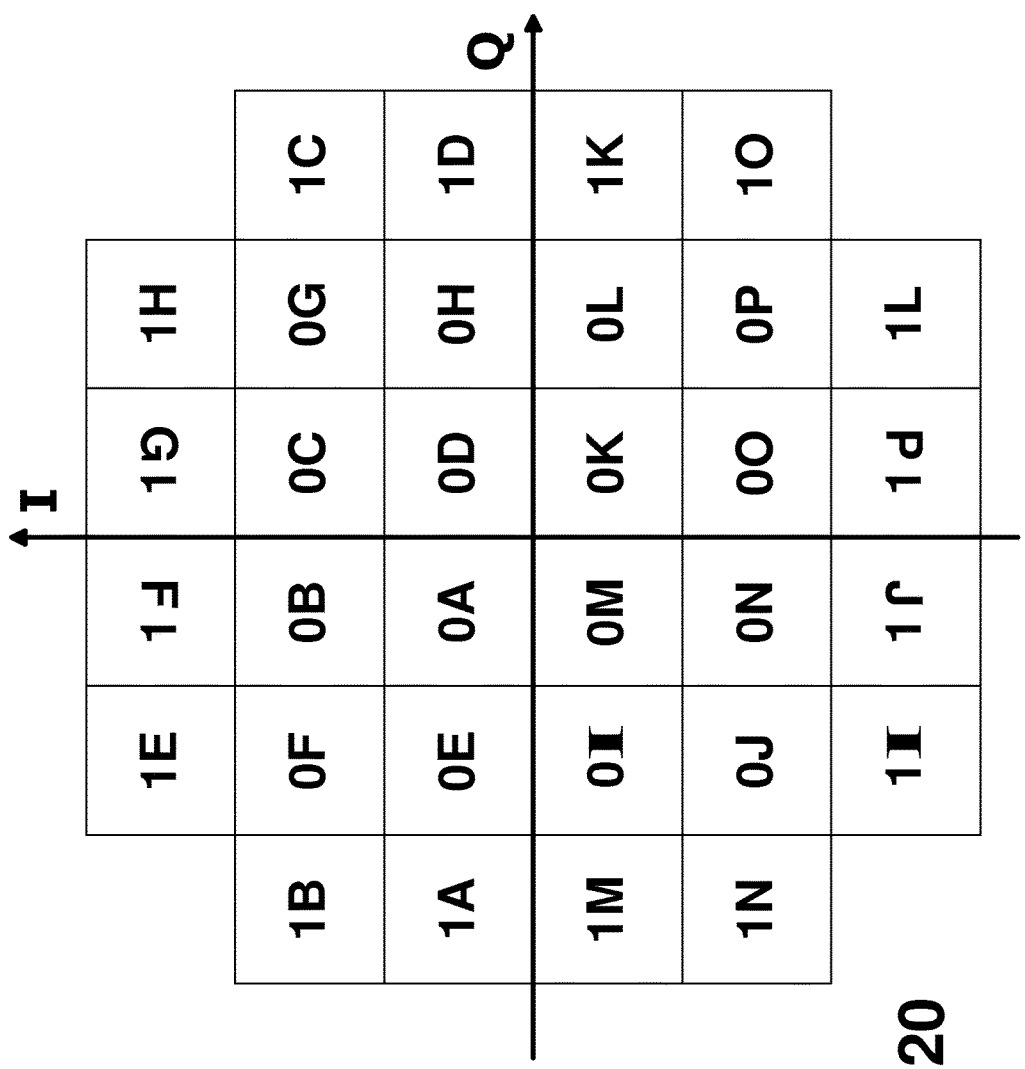
FIG. 20 is an illustration of a procedure for mapping a cruciform $2(^{2n+1})$QAM constellation based on a square $2^{2n}$QAM constellation, n being a positive integer.

FIG. 20 illustrates a procedure for mapping a cruciform $2^{(2n+1)}$QAM constellation based on a square $2^{2n}$QAM constellation, n being a positive integer. The square $2^{2n}$QAM constellation, which forms the "core" of the cruciform $2^{(2n+1)}$QAM constellation, is subdivided into sixteen blocks of lattice-point labels—four blocks of them to each quadrant. FIG. 20 labels each of these sixteen blocks with a respective arithmetic ZERO, followed by a respective character of the alphabet. Each character of the alphabet symbolizes the remaining arithmetic bits of the $2^{(2n+1)}$-chip following the arithmetic ZERO in a respective lattice-point label for the square lattice defining the $2^{2n}$QAM constellation. I. e., each character of the alphabet specifies a respective sub-lattice of lattice points in the square lattice defining the $2^{2n}$QAM constellation.

The cruciform $2^{(2n+1)}$QAM constellation comprises another sixteen blocks of lattice-point labels—four blocks of them apportioned to each "arm" or "tab" of the cruciform constellation. FIG. 20 labels twelve of these sixteen blocks with a respective arithmetic ONE, followed by a respective character of the alphabet. Each character of the alphabet symbolizes the remaining arithmetic bits of the $2^{(2n+1)}$-chip following the arithmetic ONE in a respective lattice-point label. The arithmetic bits of the $2^{(2n+1)}$-chip following the arithmetic ONE in a respective lattice-point label specify a sub-lattice corresponding to the sub-lattice in the "core" of the cruciform constellation identified by the same character of the alphabet following arithmetic ZERO.

The remaining four of the sixteen blocks in the "arms" or "tabs" of the cruciform constellation are labeled with a respective arithmetic ONE, followed by a respective character of the alphabet depicted up-side-down. The up-side-down character of the alphabet identifies a sub-lattice corresponding to an inversion of the sub-lattice in the "core" of the cruciform constellation identified by the same character of the alphabet following arithmetic ZERO.

Figure 21:
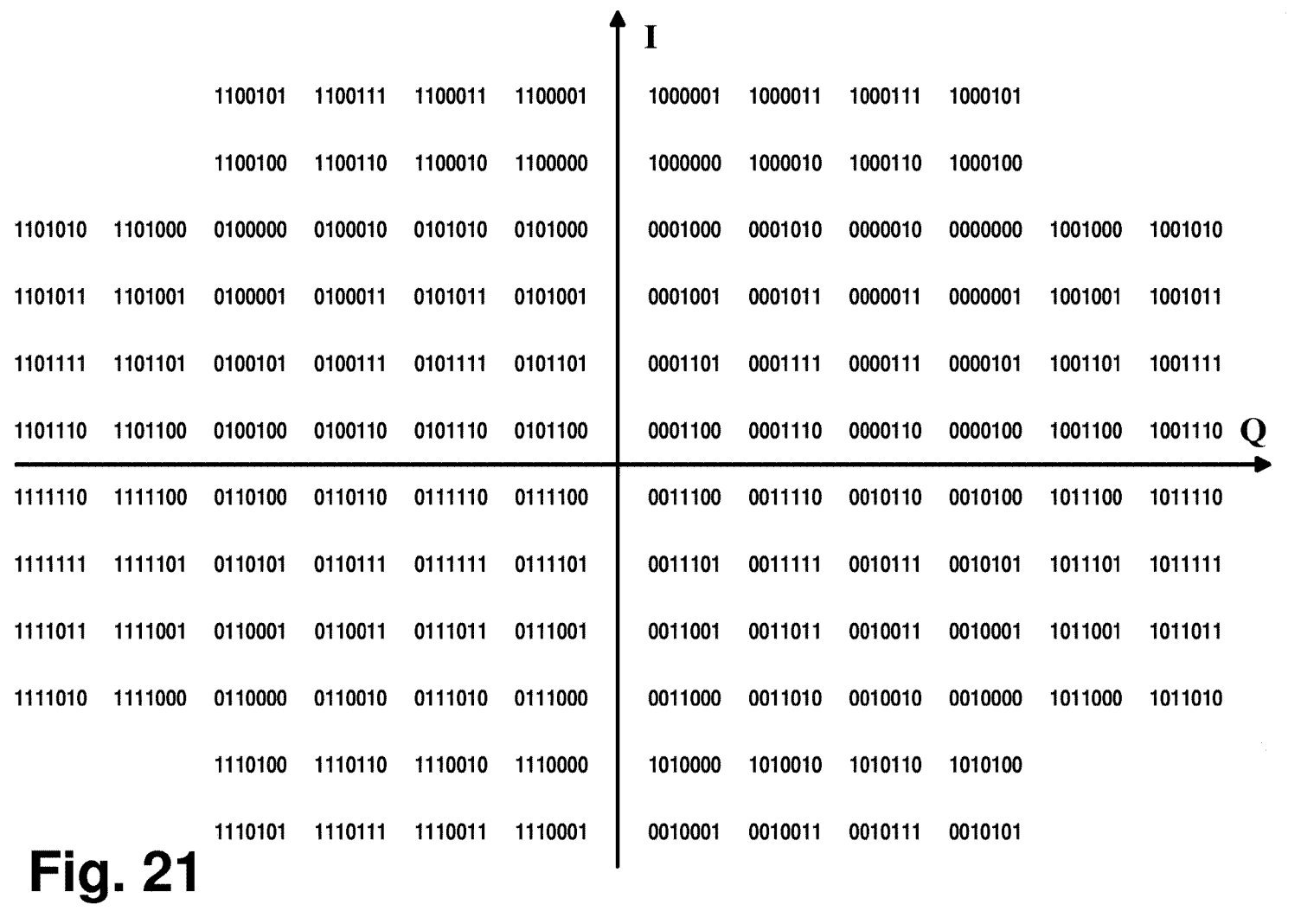

FIG. 21 is a map of 7-bit symbols to a cruciform 128QAM symbol constellation based on a square 64QAM constellation core and provided with additional four arms or tabs extending from respective sides of that square 64QAM constellation core. Study of FIG. 21 can help one to understand why the close-to-Gray mapping procedure illustrated in FIG. 20 is valid. An alternative close-to-Gray mapping procedure to that illustrated by FIG. 20 is syntactically similar, except for the the cruciform constellation being rotated a quarter turn respective to the in-phase (I) axis and the quadrature-phase (Q) axis.

Figure 22:
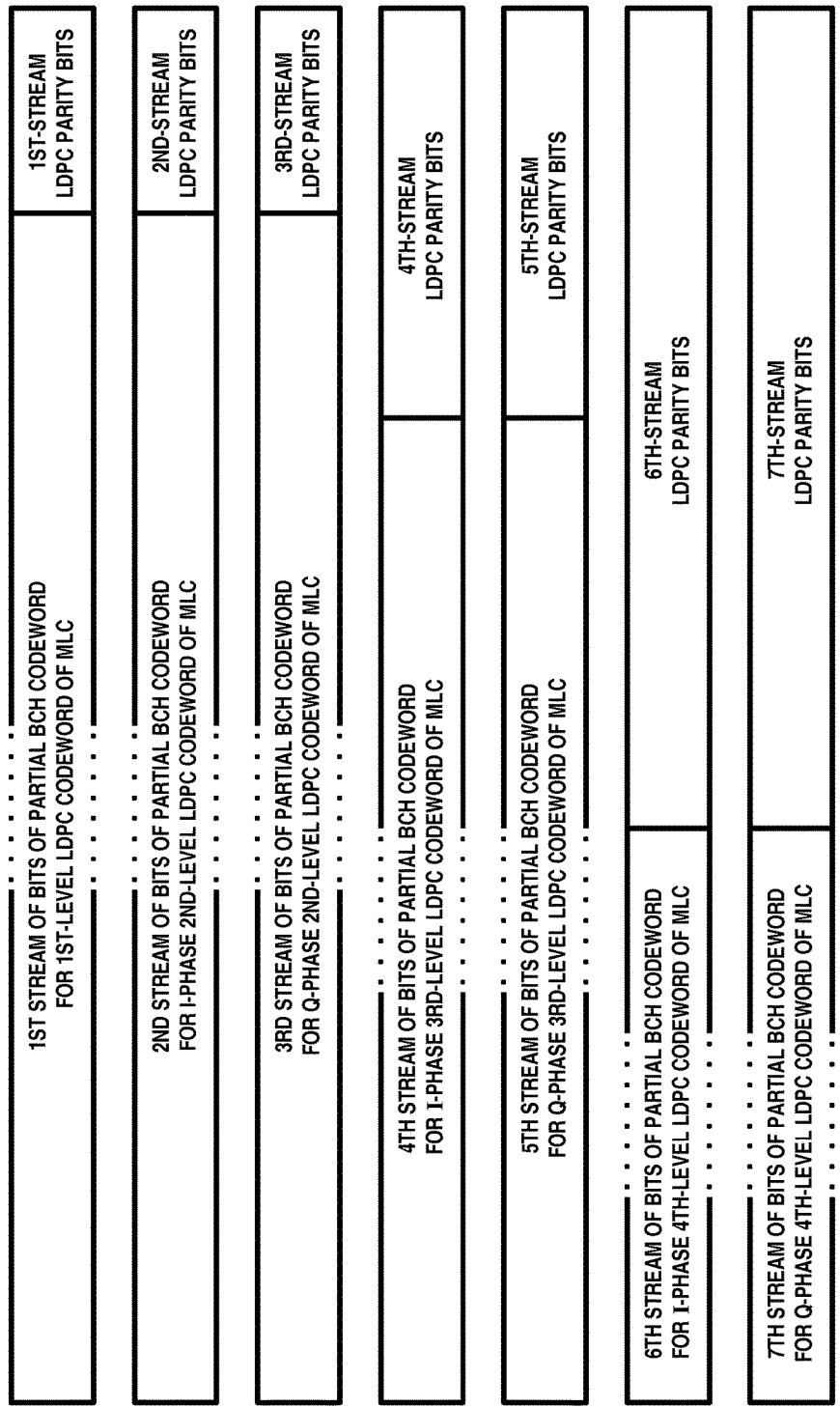
FIG. 22 is a diagram showing the relative numbers of LDPC parity bits in the seven constituent codestreams of LDPC-MLC generated by the FIG. 19 apparatus.

FIG. 22 illustrates the compositions of the constituent LDPC codewords temporarily stored in the buffer memories of the encoders 361, 362, 363, 364, 365, 366 and 367 of the FIG. 19 apparatus to generate multilevel LDPC coding for mapping to 128QAM symbols. According to FIG. 22, the codewords of the first LPDC codestream temporarily stored in the buffer memory of the encoder 361, the codewords of the second LPDC codestream temporarily stored in the buffer memory of the encoder 362, and the codewords of the third LPDC codestream temporarily stored in the buffer memory of the encoder 363 each have the same number of parity bits for LDPC coding as the other two.

The codewords of the fourth LPDC codestream temporarily stored in the buffer memory of the encoder 364 and the codewords of the fifth LPDC codestream temporarily stored in the buffer memory of the encoder 365 each have the same number of parity bits for LDPC coding as the other, but approximately twice as many as in each codeword of the first, the second and the third LPDC codestreams. The larger number of parity bits in the fourth and the fifth LPDC codestreams compensates for the mapping of these codestreams within successive 128QAM symbol constellations being more likely to experience error in channels with AWGN than are the first, the second and the third LPDC codestreams.

The codewords of the sixth LPDC codestream temporarily stored in the buffer memory of the encoder 366 and the codewords of the seventh LPDC codestream temporarily stored in the buffer memory of the encoder 367 each have the same number of parity bits for LDPC coding as the other, but approximately twice as many as in each codeword of the fourth and the fifth LPDC codestreams. The larger number of parity bits in the sixth and the seventh LPDC codestreams compensates for the mapping of these codestreams within successive 128QAM symbol constellations being more likely to experience error in channels with AWGN than are the fourth and the fifth LPDC codestreams.

FIG. 22 suggests the number of parity bits in constituent LDPC codewords in the first, second, third, fourth, fifth, sixth and seventh LDPC codestreams being in 1:1:1:2:2:4:4 ratio. This set of ratios is based on the approximate likelihood of error in each codestream owing to additive white Gaussian noise (AWGN). The component ratios are apt to be optimized over the course of time, based on extensive computer simulation of noise conditions.

Figure 23:
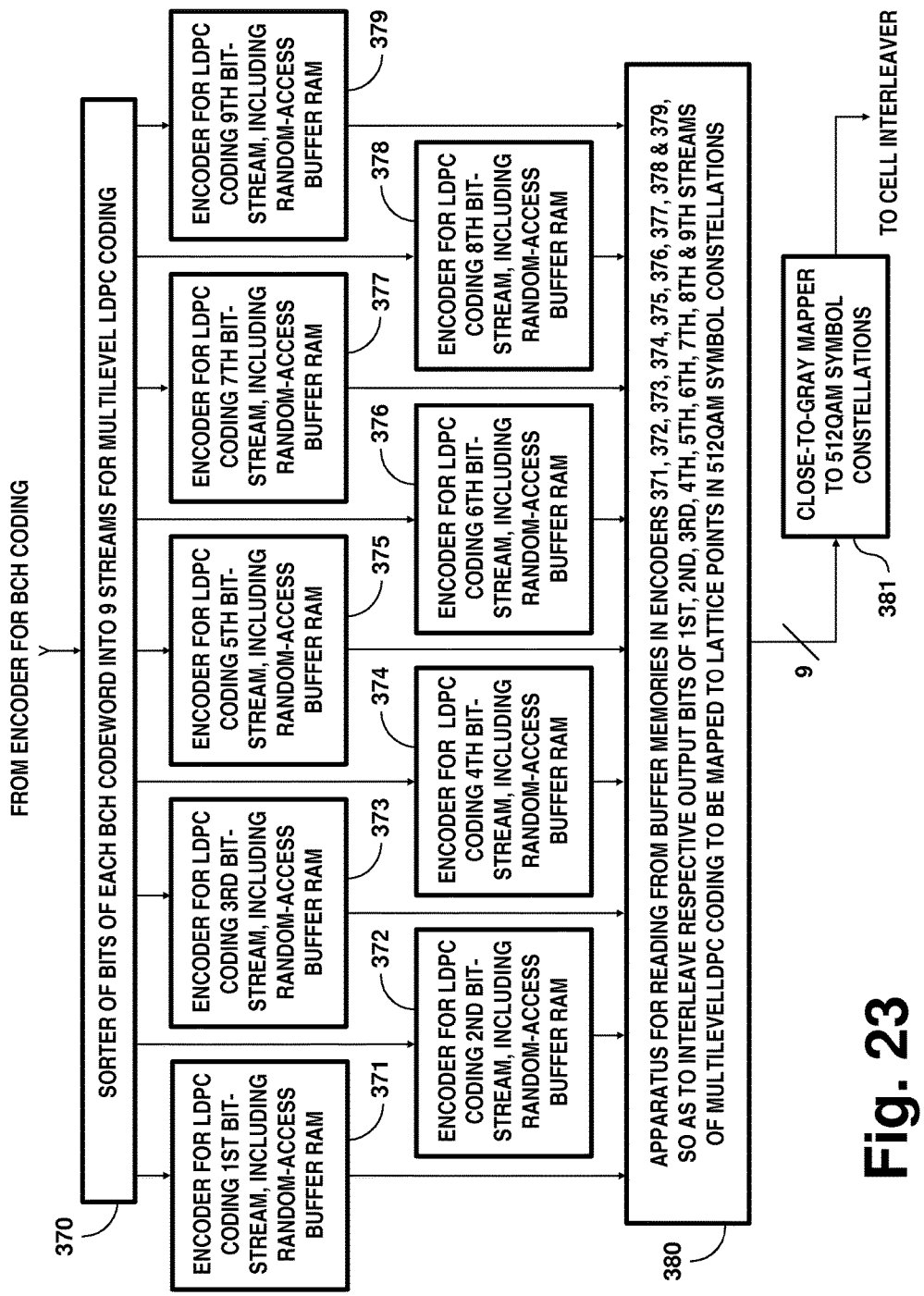
FIG. 23 is a detailed schematic diagram of one embodiment of apparatus to generate multilevel LDPC FEC coding, which apparatus is suitable for inclusion together with a mapper for 512QAM in the FIG. 2 portion of the COFDM transmitter.

FIG. 23 shows in more detail an embodiment of a part of the FIG. 2 portion of the COFDM transmitter for encoding multilevel LDPC coding, which coding is designed for being mapped into 512QAM constellations. E. g., the mapping of the 512QAM constellations uses a procedure of the general sort illustrated in FIG. 20. Such cruciform 512QAM constellations offer close-to-Gray mapping in which the 9-bit segments of the coding mapped to adjacent lattice points in the cruciform point lattice differ by two bits in 32 instances and otherwise differ by only a single bit in the other 480 instances.

FIG. 23 indicates that an encoder for BCH coding has connection to the input port of a sorter 370 of successive bits of each BCH codeword into nine groups cyclically assigned bit-by-bit to a first level of MLC, an in-phase second level of MLC, a quadrature-phase second level of MLC, an in-phase third level of MLC, a quadrature-phase third level of MLC, an in-phase fourth level of MLC, a quadrature-phase fourth level of MLC, an in-phase fifth level of MLC and a quadrature-phase fifth level of MLC. A first output port of the sorter 370 is connected for supplying the bits assigned to the first level of MLC seriatim in a first bitstream to the input port of an encoder 371 for LDPC coding the first bitstream. A second output port of the sorter 370 is connected for supplying the bits assigned to the in-phase second level of MLC seriatim in a second bitstream to the input port of an encoder 372 for LDPC coding the second bitstream. A third output port of the sorter 370 is connected for supplying the bits assigned to the quadrature-phase second level of MLC seriatim in a third bitstream to the input port of an encoder 373 for LDPC coding the third bitstream. A fourth output port of the sorter 370 is connected for supplying the bits assigned to the in-phase third level of MLC seriatim in a fourth bitstream to the input port of an encoder 374 for LDPC coding the fourth bitstream. A fifth output port of the sorter 370 is connected for supplying the bits assigned to the quadrature-phase third level of MLC seriatim in a fifth bitstream to the input port of an encoder 375 for LDPC coding the fifth bitstream. A sixth output port of the sorter 370 is connected for supplying the bits assigned to the in-phase fourth level of MLC seriatim in a sixth bitstream to the input port of an encoder 376 for LDPC coding the sixth bitstream. A seventh output port of the sorter 370 is connected for supplying the bits assigned to the quadrature-phase fourth level of MLC seriatim in a seventh bitstream to the input port of an encoder 377 for LDPC coding the seventh bitstream. An eighth output port of the sorter 370 is connected for supplying the bits assigned to the in-phase fifth level of MLC seriatim in an eighth bitstream to the input port of an encoder 378 for LDPC coding the eighth bitstream. A ninth output port of the sorter 370 is connected for supplying the bits assigned to the quadrature-phase fifth level of MLC seriatim in a ninth bitstream to the input port of an encoder 379 for LDPC coding the ninth bitstream. The encoders 371, 372, 373, 374, 375, 376, 377, 378 and 379 provide constituent LDPC coding for the one of the apparatuses 31, 41, 51 etc. to generate multilevel LDPC coding depicted in FIG. 2 that resides in the PLP under consideration.

Time-division multiplexer (TDM) apparatus 380 arranges for time-division-multiplexed reading from respective random-access buffer memories included in the encoders 371, 372, 373, 374, 375, 376, 377, 378 and 379 after all those encoders finish LDPC coding their respective levels of BCH coding in an FEC frame. The TDM apparatus 380 generates or helps generate successive Gray labels for specifying lattice points in 512QAM symbol constellations. Each Gray label is generated responsive to one bit of first LDPC codestream read from the buffer memory of encoder 371, one bit of second LDPC codestream read from the buffer memory of encoder 372, one bit of third LDPC codestream read from the buffer memory of encoder 373, one bit of fourth LDPC codestream read from the buffer memory of encoder 374, one bit of fifth LDPC codestream read from the buffer memory of encoder 375, one bit of sixth LDPC codestream read from the buffer memory of encoder 376, one bit of seventh LDPC codestream read from the buffer memory of encoder 377, one bit of eighth LDPC codestream read from the buffer memory of encoder 378, and one bit of ninth LDPC codestream read from the buffer memory of encoder 379.

FIG. 23 depicts the output port of the TDM apparatus 380 connected to supply close-to-Gray labels to the input port of a mapper 381 for close-to-Gray mapping those sets of nine bits to respective 512QAM symbol constellations. Such cruciform 512QAM constellations offer close-to-Gray mapping in which the 9-bit segments of the coding mapped to adjacent lattice points in the cruciform point lattice differ by two bits in only 32 instances and otherwise differ by only a single bit in the other 480 instances. The mapper 381 corresponds to the one of the mappers 33, 43, 53 etc. depicted in FIG. 2 that resides in the PLP under consideration.

Figure 24:
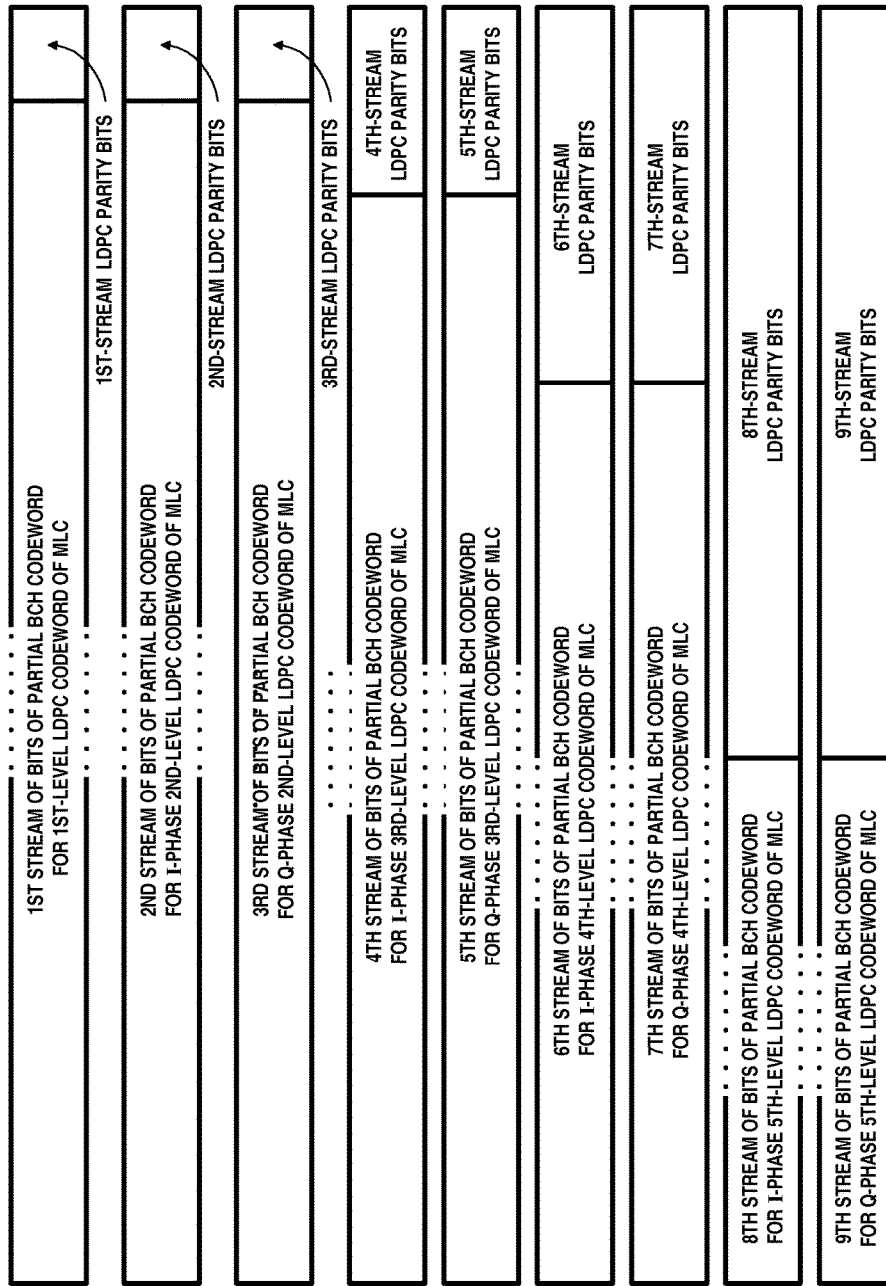
FIG. 24 is a diagram showing the relative numbers of LDPC parity bits in the nine constituent codestreams of LDPC-MLC generated by the FIG. 23 apparatus.

FIG. 24 illustrates the compositions of the constituent LDPC codewords temporarily stored in the buffer memories of the encoders 371, 372, 373, 374, 375, 376, 377, 378 and 379 of the FIG. 23 apparatus to generate multilevel LDPC coding for mapping to 512QAM symbols. According to FIG. 24, the codewords of the first LPDC codestream temporarily stored in the buffer memory of the encoder 371, the codewords of the second LPDC codestream temporarily stored in the buffer memory of the encoder 372, and the codewords of the third LPDC codestream temporarily stored in the buffer memory of the encoder 373 each have the same number of parity bits for LDPC coding as the other two.

The codewords of the fourth LPDC codestream temporarily stored in the buffer memory of the encoder 374 and the codewords of the fifth LPDC codestream temporarily stored in the buffer memory of the encoder 375 each have the same number of parity bits for LDPC coding as the other, but approximately twice as many as in each codeword of the first, the second and the third LPDC codestreams. The larger number of parity bits in the fourth and the fifth LPDC codestreams compensates for the mapping of these codestreams within successive 512QAM symbol constellations being more likely to experience error in channels with AWGN than are the first, the second and the third LPDC codestreams.

The codewords of the sixth LPDC codestream temporarily stored in the buffer memory of the encoder 376 and the codewords of the seventh LPDC codestream temporarily stored in the buffer memory of the encoder 377 each have the same number of parity bits for LDPC coding as the other, but approximately twice as many as in each codeword of the fourth and the fifth LPDC codestreams. The larger number of parity bits in the sixth and in the seventh LPDC codestreams compensates for the mapping of these codestreams within successive 512QAM symbol constellations being more likely to experience error in channels with AWGN than are the fourth and the fifth LPDC codestreams.

The codewords of the eighth LPDC codestream temporarily stored in the buffer memory of the encoder 378 and the codewords of the ninth LPDC codestream temporarily stored in the buffer memory of the encoder 379 each have the same number of parity bits for LDPC coding as the other, but approximately twice as many as in each codeword of the sixth and the seventh LPDC codestreams. The larger number of parity bits in the eighth and ninth LPDC codestreams compensates for the mapping of these codestreams within successive 512QAM symbol constellations being more likely to experience error in channels with AWGN than are the sixth and the seventh LPDC codestreams.

FIG. 24 suggests the number of parity bits in constituent LDPC codewords in the first, second, third, fourth, fifth, sixth, seventh, eighth and ninth LDPC codestreams being in 1:1:1:2:2:4:4:8:8 ratio. This set of ratios is based on the approximate likelihood of error in each codestream owing to additive white Gaussian noise (AWGN). The component ratios are apt to be optimized over the course of time, based on extensive computer simulation of noise conditions.

Figure 25:
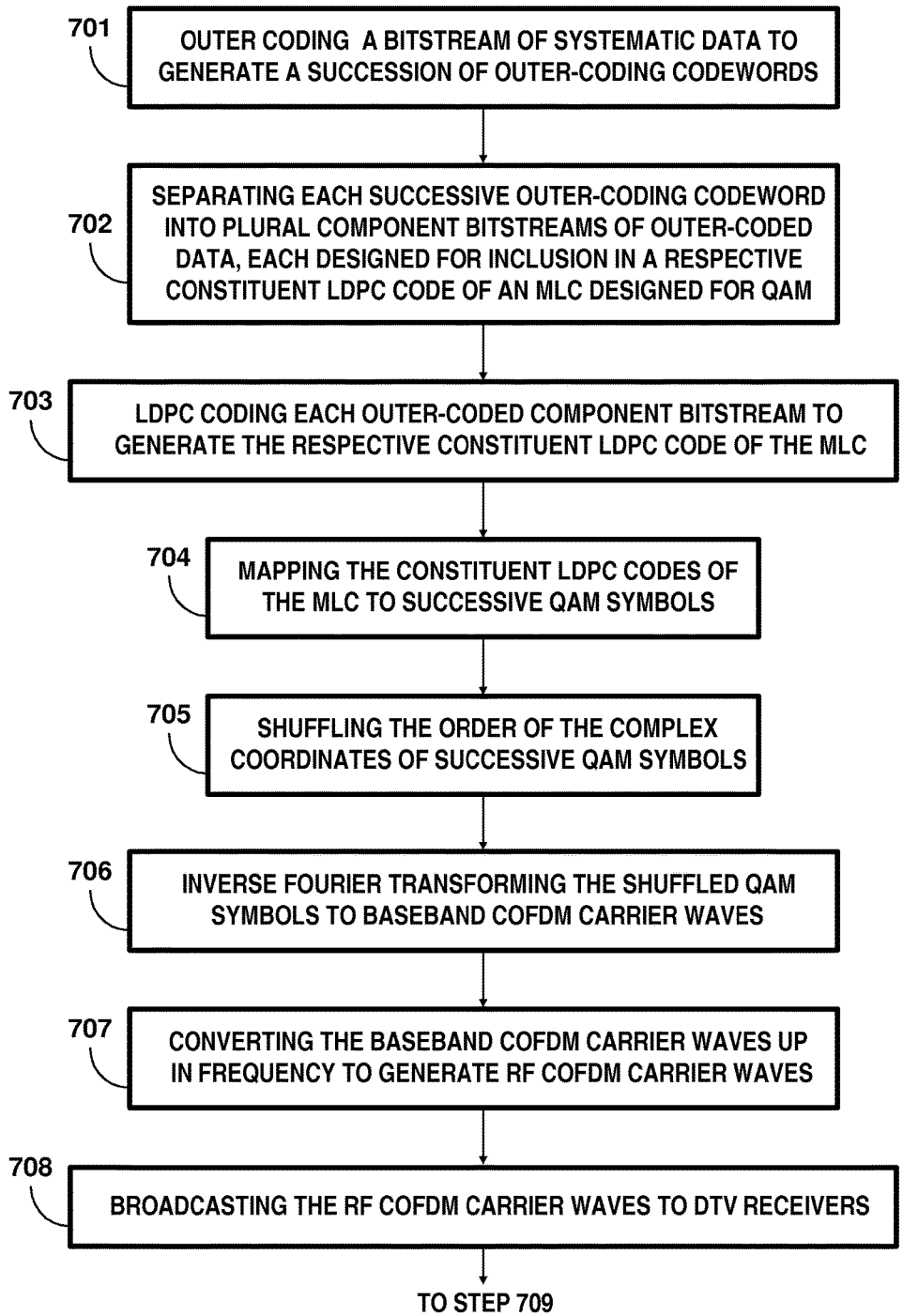
FIG. 25 is a flow chart illustrating fundamental operations in DTV transmitter embodying the invention in certain of its aspects, as exemplified by the transmitter depicted in FIGS. 1, 2, 3 and 4.

FIG. 25 is a flow chart illustrating fundamental operations in the DTV transmitter depicted in FIGS. 1, 2, 3 and 4 that help implement a method for conveying systematic data from the transmitter in a COFDM broadcasting system to a plurality of remotely located receivers. In a step 701 a bitstream of systematic data is outer-coded to generate a succession of outer-coding codewords. E. g., the outer coding is Bose-Chaudhuri-Hocquenghem (BCH) coding performed by one of encoders 31, 41, 51 etc. depicted in FIG. 2. BCH coding affords some bit-error correction capability in addition to bit-error detection capability. This is helpful in overcoming any few remaining bit errors left after a prescribed maximum number of iterative decoding procedures are executed on sorts of LDPC coding that exhibit a "floor" region. Performing outer coding in the step 701 before commencing multilevel coding in a subsequent step 702 avoids need for designing suitable outer coding for each MLC level, which can present some difficulty with large block codes. More specifically, performing BCH coding in the step 701 before commencing multilevel LDPC coding facilitates using the BCH coding of 64,800-bit normal FEC frames or 16,200 short FEC frames that ETSI standard EN 302 755 V1.3.1 prescribes for DVB-T2 broadcasting.

In the subsequent step 702 each of the outer-coding codewords is separated into a plurality of component bitstreams of the outer coding. The number of those component bitstreams depends on how they will respectively map to QAM symbols associated with the baseband OFDM carrier waves. The ratios among respective lengths of the component bitstreams are determined by their code rates within prospective LDPC coding of each of them.

In a subsequent set 703 of parallel steps each of the component bitstreams is LDPC coded in accordance with a respective code rate, thus to generate respective constituent LDPC codes of the multilevel code. The LDPC coding is LDPC block coding in some embodiments of the invention. Preferably, though, LDPC coding is LDPC convolutional coding. LDPC convolutional coding does not require as many different types of code be designed if multilevel codes with a variety of code rates are transmitted at different times. Also, DTV receivers can use sliding window decoding techniques for reducing the number of different decoders needed to decode constituent LDPC codes of multilevel LDPC codes having different code rates.

In a subsequent step 704 the constituent LDPC codes of the MLC are mapped to successive QAM symbols. The step 704 is performed by the Gray mapper 306 to 16QAM symbols in FIG. 7 and FIG. 8, the Gray mapper 325 to 64QAM symbols in FIG. 11 and FIG. 15, the Gray mapper 336 to 256QAM symbols in FIG. 12 and FIG. 17, the close-to-Gray mapper 369 to 128QAM symbols in FIG. 18, or the close-to-Gray mapper 381 to 512QAM symbols in FIG. 23. Bits are cyclically selected one bit at a time from each of the constituent LDPC codes of the MLC for partially mapping a respective lattice point in each successive QAM symbol, presuming that there are separate constituent codes for in-phase and quadrature-phase components of each level of MLC. If there be only a single constituent code for both in-phase and quadrature-phase components of each level of MLC, bits are cyclically selected a pair at a time from each of the constituent LDPC codes of the MLC for mapping a respective lattice point in each successive QAM symbol.

In a next step 705 the complex coordinates of the successive QAM symbols are shuffled to a different order. In the transmitter depicted in FIGS. 1-4 the step 705 is performed by one of the FIG. 2 cell interleavers 34, 44. 54 etc. in the PLP of particular concern.

Then, in a step 706 the inverse Fourier transform of the shuffled QAM symbols is computed to generate quadrature-amplitude-modulated baseband COFDM carrier waves. In the transmitter depicted in FIGS. 1-4 the step 706 is performed by the OFDM modulator 56 of FIG. 4 In a subsequent step 707 these baseband COFDM carrier waves are converted upward in frequency to generate radio-frequency (RF) COFDM carrier waves. In a final step 708 the RF COFDM carrier waves are broadcast to DTV receivers. In the transmitter depicted in FIGS. 1-4 the step 707 is performed by the up converter 61 of FIG. 4, and the step 708 is performed by the linear power amplifier 62 and the transmitter antenna 63.

Figure 26:
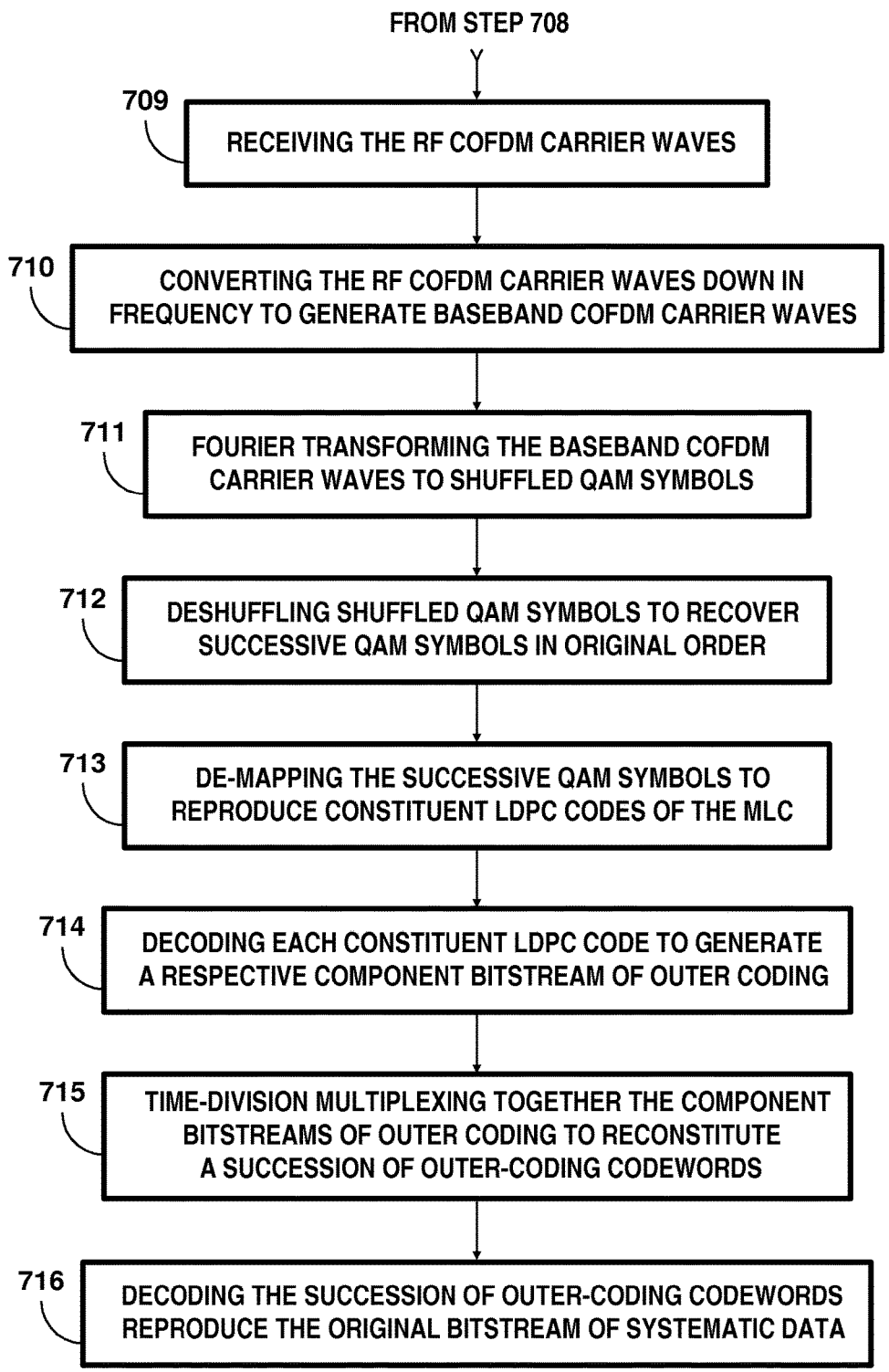
FIG. 26 is a flow chart illustrating fundamental operations in DTV receiver apparatus embodying the invention in certain of its aspects, as exemplified by the receiver apparatus depicted in FIGS. 27, 28 and 29, by the receiver apparatus depicted in FIGS. 30, 28 and 29 or by the receiver apparatus depicted in FIGS. 65, 28 and 66.

FIG. 26 is a flow chart illustrating fundamental operations in DTV receiver apparatus that help implement a method for conveying systematic data from the transmitter in a COFDM broadcasting system to a plurality of remotely located receivers. RF COFDM carrier waves are received by a DTV receiver apparatus in the step 709 and are then converted downward in frequency in a step 710 to generate baseband COFDM carrier waves. These steps 709 and 710 are performed by the reception antenna 66 and the front-end tuner 67 depicted in FIG. 27, FIG. 30 and FIG. 65 portions of respective DTV receiver apparatuses.

A first of two output ports of the timing synchronization apparatus 71 is connected for supplying gating control signal to the control input port of a guard-interval-removal unit 72. The signal input port of this guard-interval-removal unit, which unit is commonly referred to as a "guard interval remover", is connected for receiving digitized samples of baseband COFDM signal from the output port of the front-end tuner 66. The output port of the guard-interval-removal unit 72 is connected for supplying the input port of discrete-Fourier-transform computer 73 with windowed portions of the baseband COFDM signal that contain effective COFDM samples. A second of the output ports of the timing synchronization apparatus 71 is connected for supplying the DFT computer 73 with synchronizing information concerning the effective COFDM samples.

Figure 29:
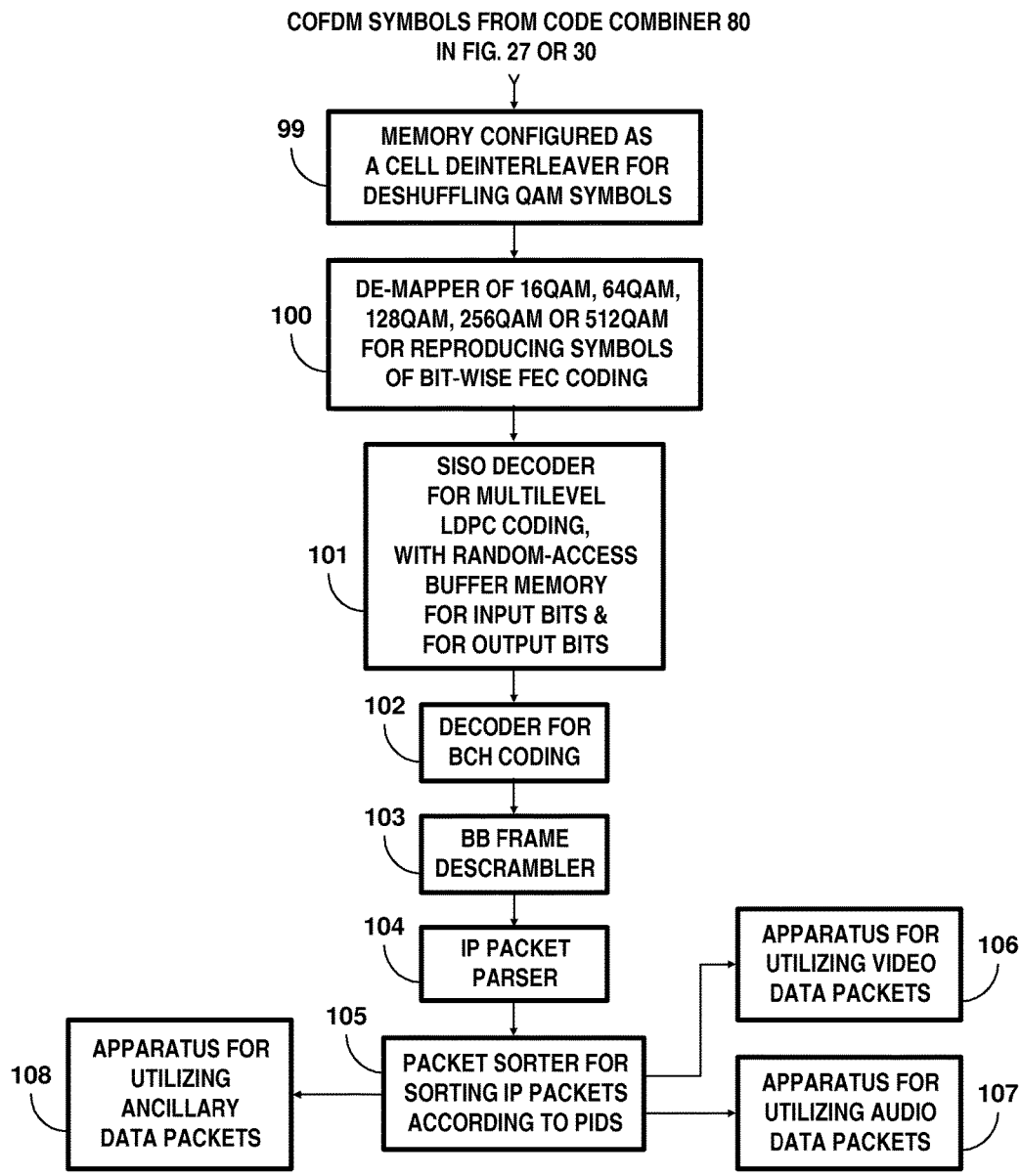

In a next step 712 the shuffled QAM symbols are deshuffled to recover successive QAS symbols in their original order within the outer-coding generated in the step 701 of the FIG. 25 flow chart. The step 712 is performed in the memory 99 configured as a cell deinterleaver, as shown in FIG. 29 and in FIG. 66. The occurrence of burst noise or a wide-band fade in the received COFDM DTV is apt to corrupt a number of consecutive QAM symbols in one or more COFDM symbols generated in the step 711 of Fourier transforming the baseband COFDM carrier waves. The step 712 of deshuffling the shuffled QAM symbols disperses the corrupted QAM symbols among a plurality of multilevel LDPC codewords, to increase the likelihood that errors attributable to burst noise or a wide-band fade can be corrected during iterative decoding of the constituent LDPC codes of those multilevel LDPC codewords. In systems where the likelihood of burst noise or a, wide-band fade in the received COFDM DTV corrupting a number of consecutive QAM symbols is very unlikely, both the step 705 of shuffling the order of QAM symbols in the transmitter and the step 712 of deshuffling the order of QAM symbols in the receiver may be skipped over.

In a subsequent step 713 the constituent LDPC codes of the MLC are de-mapped from the successive QAM symbols. The step 713 is performed by the de-mapper 100 in the FIG. 29 portion of these DTV receiver apparatuses. Then, in a set 714 of steps the constituent LDPC codes of the MLC are decoded to generate respective component bitstreams of outer coding. In a next step 715 these component bitstreams of outer coding are time-division multiplexed together to reconstitute the succession of outer-coding codewords generated in step 701 of the FIG. 25 flow chart. In a step 716 the succession of outer-coding codewords is decoded to reproduce a bitstream of original systematic data. E. g., the set 714 of steps is performed by a soft-input/soft-output decoder 101 for multilevel LDPC coding of these DTV receiver apparatuses. So is the step 715 following the step 714. The decoder 101 is depicted in FIG. 29, and FIGS. 33-40 depict respective species of this decoder 101. In a final step 716 the succession of outer-coding codewords is decoded to reproduce the original bitstream of systematic data. E. g., this final step 716 of decoding successive outer-coding codewords is performed by a decoder 102 for BCH coding depicted in the FIG. 29 portion of DTV receiver apparatuses.

Figure 27:
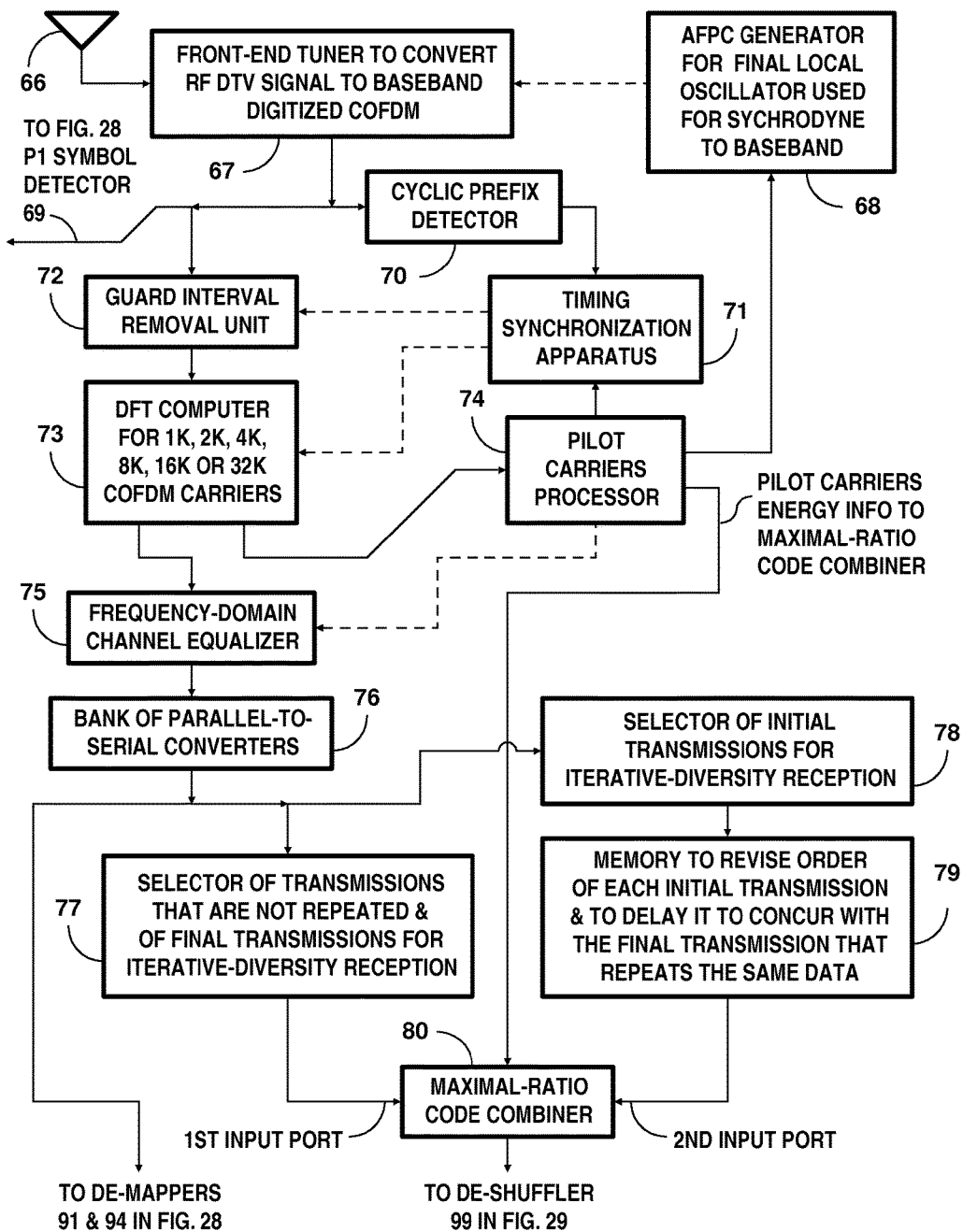
FIGS. 27, 28 and 29 together form a schematic diagram of COFDM receiver apparatus configured for iterative-diversity reception of COFDM signals, which receiver apparatus employs maximal-ratio code combining of twice-transmitted signals and is further configured in accordance with the invention.

FIG. 27 shows the initial portion of a DTV receiver designed for iterative-diversity reception of COFDM signals as transmitted at VHF or UHF by a DTV transmitter, such as the one depicted in FIGS. 1, 2, 3 and 4. A reception antenna 66 captures the radio-frequency COFDM signal for application as input signal to a front-end tuner 67 of the receiver. The front-end tuner 67 can be of a double-conversion type composed of initial single-conversion super-heterodyne receiver circuitry for converting radio-frequency (RF) COFDM signal to intermediate-frequency (IF) COFDM signal followed by circuitry for performing a final conversion of the IF COFDM signal to baseband COFDM signal. The initial single-conversion receiver circuitry typically comprises a tunable RF amplifier for RF COFDM signal incoming from the reception antenna, a tunable first local oscillator, a first mixer for heterodyning amplified RF COFDM signal with local oscillations from the first local oscillator to obtain the IF COFDM signal, and an intermediate-frequency (IF) amplifier for the IF COFDM signal. Typically, the front-end tuner 67 further includes a synchronous demodulator for performing the final conversion from IF COFDM signal to baseband COFDM signal and an analog-to-digital converter for digitizing the baseband COFDM signal. Synchronous demodulation circuitry typically comprises a final local oscillator with automatic frequency and phase control (AFPC) of its oscillations, a second mixer for synchrodyning amplified IF COFDM signal with local oscillations from the final local oscillator to obtain the baseband COFDM signal, and a low-pass filter for suppressing image signal accompanying the baseband COFDM signal. In some designs of the front-end tuner 67, synchronous demodulation is performed in the analog regime before subsequent analog-to-digital conversion of the resulting complex baseband COFDM signal. In other designs of the tuner 67, analog-to-digital conversion is performed before synchronous demodulation is performed in the digital regime.

Succinctly stated, the front-end tuner 67 converts radio-frequency COFDM signal received at its input port to digitized samples of baseband COFDM signal supplied from its output port. Typically, the digitized samples of the real component of the baseband COFDM signal are alternated with digitized samples of the imaginary component of the baseband COFDM signal for arranging the complex baseband COFDM signal in a single stream of digital samples. FIG. 27 depicts an AFPC generator 68 for generating the automatic frequency and phase control (AFPC) signal for controlling the final local oscillator within the front-end tuner 67.

The output port of the front-end tuner 67 is connected for supplying digitized samples of baseband COFDM signal to the respective input ports of a P1 symbol detector 69 depicted in FIG. 28 and a cyclic prefix detector 70 depicted in FIG. 27. The cyclic prefix detector 70 differentially combines the digitized samples of baseband COFDM signal with those samples as delayed by the duration of an effective COFDM symbol. Nulls in the difference signal so generated should occur, marking the guard intervals of the baseband COFDM signal. The nulls are processed to reduce any corruption caused by noise and to generate better-defined indications of the phasing of COFDM symbols. The output port of the cyclic prefix detector 70 is connected to supply these indications to a first of two input ports of timing synchronization apparatus 71.

A first of two output ports of the timing synchronization apparatus 71 is connected for supplying gating control signal to the control input port of a guard-interval-removal unit 72, the signal input port of which is connected for receiving digitized samples of baseband COFDM signal from the output port of the front-end tuner 66. The output port of the guard-interval-removal unit 72 is connected for supplying the input port of discrete-Fourier-transform computer 73 with windowed portions of the baseband COFDM signal that contain effective COFDM samples. A second of the output ports of the timing synchronization apparatus 71 is connected for supplying the DFT computer 73 with synchronizing information concerning the effective COFDM samples.

The indications concerning the phasing of COFDM symbols that the cyclic prefix detector 70 supplies to the timing synchronization apparatus 71 are sufficiently accurate for initial windowing of a baseband COFDM signal that the guard-interval-removal unit 72 supplies to the DFT computer 73. A first output port of the DFT computer 73 is connected for supplying demodulation results for at least all of the pilot carriers in parallel to the input port of a pilot carriers processor 74, and a second output port of the DFT computer 73 is connected for supplying demodulation results for each of the COFDM carriers to the input port of a frequency-domain channel equalizer 75. The processor 74 selects the demodulation results concerning pilot carriers for processing, part of which processing generates weighting coefficients for channel equalization filtering in the frequency domain. A first of four output ports of the processor 74 that are explicitly shown in FIG. 27 is connected for supplying these weighting coefficients (via wiring depicted as a dashed-line connection) to the frequency-domain channel equalizer 75, which uses them for adjusting its responses to the demodulation results for each of the COFDM carriers.

A second of the output ports of the pilot carriers processor 74 that are explicitly shown in FIG. 27 is connected for supplying more accurate window-positioning information to the second input port of the timing synchronization apparatus 71. This window-positioning information is an adjustment generated by a feedback loop that seeks to minimize the noise accompanying pilot carriers, which noise increases owing to intercarrier interference from adjoining modulated carriers when window positioning is not optimal.

A third of the output ports of the pilot carriers processor 74 that are explicitly shown in FIG. 27 is connected for forwarding unmodulated pilot carriers to the input port of the AFPC generator 68. The real components of the unmodulated pilot carriers are multiplied by their respective imaginary components in the AFPC generator 68. The resulting products are summed and low-pass filtered to develop the AFPC signal that the AFPC generator 68 supplies to the front-end tuner 67 for controlling the final local oscillator therein. Other methods to develop AFPC signals for the final local oscillator in the front-end tuner 67 are also known, which can replace or supplement the method described above. One such other method is described in U.S. Pat. No. 5,687,165 titled "Transmission system and receiver for orthogonal frequency-division multiplexing signals, having a frequency-synchronization circuit", which was granted to Flavio Daffara and Ottavio Adami on 11 Nov. 1997. In that method complex digital samples from the tail of each OFDM symbol are multiplied by the conjugates of corresponding digital samples from the cyclic prefix of the OFDM symbol. The resulting products are summed and low-pass filtered to develop the AFPC signal that the AFPC generator 68 supplies to the front-end tuner 66 for controlling the final local oscillator therein.

A fourth of the output ports of the pilot carriers processor 74 that are explicitly shown in FIG. 27 is connected for supplying information concerning the respective energies of unmodulated pilot carriers. This information is supplied to a maximal-ratio code combiner 80 shown at the foot of FIG. 27 and in more detail in FIG. 31. The code combiner 80 comprises elements 81, 82, 83, 84, 85, 86, 87, 88 and 89. The code combiner 80 is more fully described further on in this specification with reference to drawing FIG. 31. The portions of the pilot carriers processor 74 for generating information concerning the respective energies of unmodulated pilot carriers are shown in FIG. 32 and are described in more detail further on in this specification.

The DFT computer 73 is customarily constructed so it can demodulate any one of the 1K, 2K, 4 k, 8K, 16K and 32K options as to the number of OFDM carriers. If this be the case, the correct option is chosen responsive to information from the P1 symbol detector 69 depicted in FIG. 28. As noted supra, the second output port of the DFT computer 73 is connected to supply demodulated complex digital samples of the complex coordinates of QPSK or QAM constellations in parallel to the input port of the frequency-domain channel equalizer 75. To implement a simple form of frequency-domain channel equalization, the pilot carriers processor 74 measures the amplitudes of the demodulated pilot carriers to determine basic weighting coefficients for various portions of the frequency spectrum. The pilot carriers processor 74 then interpolates among the basic weighting coefficients to generate respective weighting coefficients supplied to the frequency-domain channel equalizer 75 with which to multiply the complex coordinates of QPSK or QAM constellations supplied from the DFT computer 73. Various alternative types of frequency-domain channel equalizer are also known in the art.

The output port of the DFT computer 73 involves a plurality of connections for supplying respective sets of complex coordinates for QPSK or QAM constellations of respective OFDM carriers. The frequency-domain channel equalizer 75 weights each of these respective sets of complex coordinates for BPSK, QPSK or QAM constellations of respective OFDM carriers received in parallel at its input port and supplies the weighted responses in parallel from its output port to the respective input ports of a bank 76 of parallel-to-series converters. The response of the one of the parallel-to-series converters in this bank 76 of them that is appropriate for the number of OFDM carriers in the I-DFT and the sort of modulation symbol constellations for those carriers is selected as the response supplied from the bank 76 of parallel-to-series converters for de-mapping of the modulation symbol constellations in that response.

Response from one of the bank 76 of parallel-to-series converters to the successive BPSK, QPSK or QAM constellations of the preambles of FEC frames are supplied to the input ports of de-mappers for those constellations—i. e., the de-mappers 91 and 94 depicted in FIG. 28. As thusfar described, the FIG. 27 initial portion of a COFDM receiver is similar to the initial portions of COFDM receivers used for DVB in Europe. However, in a departure from customary practice, response from one of the bank 76 of parallel-to-series converters to the successive QPSK or QAM constellations descriptive of the FEC-coding of systematic data is not supplied directly to a de-mapper for those successive QPSK or QAM constellations. Instead, such response is supplied to the respective input ports of selectors 77 and 78.

The selector 77 selectively reproduces at its output port complex QPSK, 16QAM, 32QAM, 64QAM, 256QAM or 512QAM symbol map coordinates just for selected ones of those transmissions that are not repeated or for selected final ones of those transmissions that are repeated for iterative-diversity reception. The output port of the selector 77 is connected to a first of two input ports of a maximal-ratio code combiner 80 that combines symbol-map coordinates of QPSK or QAM constellations from later transmissions of time-slices with delayed symbol-map coordinates of QPSK or QAM constellations from earlier transmissions of similar time-slices. The combining is done in ratio determined by the relative root-mean-square (RMS) energies of the unmodulated pilot carriers that respectively accompany the earlier transmissions of the QPSK or QAM constellations and the later transmissions of the same constellations. The output port of the code combiner 80 is connected for supplying complex coordinates for QPSK or QAM constellations to de-mappers for those symbol constellations.

The input port of a selector 78 for initial transmissions is connected for receiving complex coordinates of modulation symbol constellations from the output port of the bank 76 of parallel-to serial converters. The output port of the selector 78 connects to the write-input port of a memory 79, and the read-output port of the memory 79 connects to the second input port of the maximal-ratio code combiner 80. The memory 79 is configured to revise the order of the complex coordinates of modulation symbol constellations initial transmissions for iterative-diversity reception and to delay them as read to the second input port of the code combiner 80, so as to concur in time with the complex coordinates of modulation symbol constellations in corresponding final transmissions applied to the first input port of the code combiner 80. I. e., there is an offset between the write addressing and the read addressing of locations in memory 79 for temporarily storing those complex coordinates of modulation symbol constellations that in effect provides for de-rotating the circular DFT specifying those complex coordinates. This de-rotation is complementary to the rotation of circular I-DFT performed in the memory 57 in the FIG. 4 portion of the COFDM transmitter depicted in FIGS. 1-4. Address generation suitable for the memory 79 is described in detail with regard to a corresponding memory 93 in A. L. R. Limberg's U.S. Pat. No. 8,958,490 issued 17 Feb. 2015 with the title "COFDM broadcasting with single-time retransmission of COFDM symbols".

The maximal-ratio code combiner 80 differs somewhat from the ordinary maximal-ratio code-combiner used to combine coding recovered from separate receivers of COFDM signals. An ordinary maximal-ratio code-combiner combines one-dimensional, real-only codes obtained from separately de-mapping paired QAM constellation maps. The maximal-ratio code combiner 80 is a special type of code-combiner, which combines the two-dimensional complex symbol-map coordinates of paired QPSK or QAM constellation maps to synthesize respective single QPSK or QAM constellation maps for de-mapping. When both the earlier transmissions of the QPSK or QAM constellations and the later transmissions of the same constellations are received in strength, the maximal-ratio combining of the two-dimensional coordinates of paired QPSK or QAM constellation maps permits improvement of coordinates estimation in the presence of additive white Gaussian noise (AWGN). This is because the coordinates of the paired QPSK or QAM constellation maps should be correlated, while the AWGN is uncorrelated. Accordingly, errors in de-mapping are less likely to occur, as well as gaps in reception tending to be filled. Maximal-ratio code combining after de-mapping QAM constellations tends to fill gaps in reception, but does not improve coordinates estimation of the paired QAM constellation maps in the presence of AWGN. FIG. 28 described further on in this specification depicts the maximal-ratio code combiner 80 in more detail, as comprising elements 81-89.

FIG. 28 depicts a controller 90 of decoding operations in the DTV receiver, but does not explicitly show the connections to elements of the receiver through which those elements are controlled. FIG. 28 shows the output port of the P1 symbol detector 69 connected to a respective input port of the controller 90. FIG. 28 further indicates that the input port of the P1 symbol detector 69 is connected for receiving baseband digitized COFDM signal from the front-end tuner 67 depicted in FIG. 27. The P1 symbol detector 69 detects each occurrence of a P1 symbol, which is based on a 1K OFDM symbol with frequency-shifted repeats at its beginning and its conclusion. A P1 symbol signals the beginning of a COFDM (T2) frame, and the P1 symbol detector 69 supplies this important timing information to the controller 90. The structure of the P1 symbol facilitates easy detection thereof, as well as forestalling any possibility of its being imitated by any part of the signal within the ensuing COFDM frame. Only a fraction of the 1K OFDM carrier positions convey energy, and these carry one of a set of carefully chosen data patterns to provide some capability for signaling the controller 90 for decoding operations in the DTV receiver. This format of P1 symbol provides (a) a simple and robust mechanism for rapid detection of T2 signals when a receiver scans through the appropriate spectrum band, (b) a fast frequency lock mechanism for the receiver and (c) 6-bits of signaling. E.g., these bits may be used for signaling the FFT size used for COFDM symbols in the COFDM (T2) frame. If the DTV standard prescribes inverting the polarity of frames of OFDM signals during initial transmissions, one of these bits can be reserved to signal such inversion.

Figure 30:
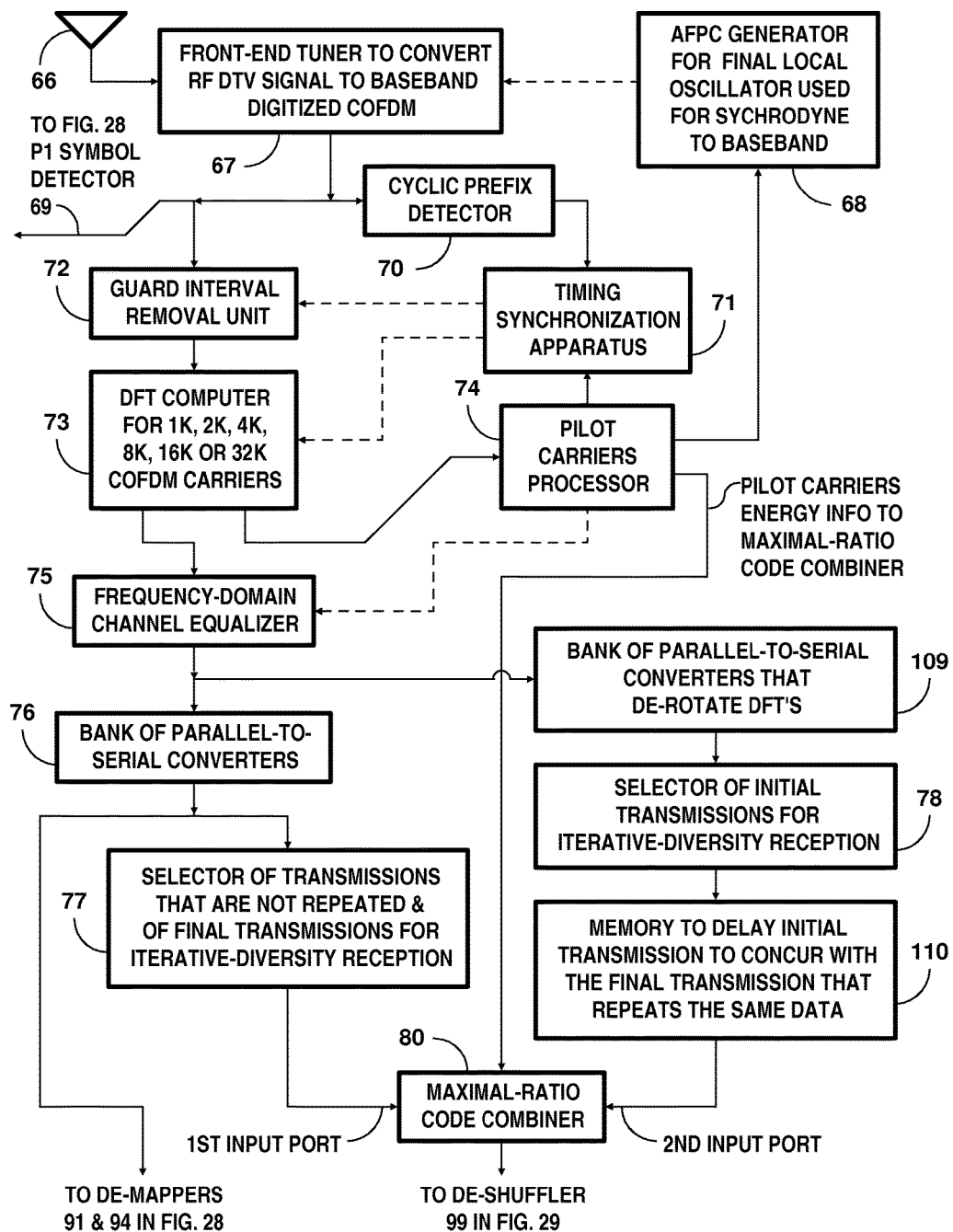
FIG. 30 is a schematic diagram of a modification of the FIG. 27 portion of the COFDM receiver apparatus further depicted in FIGS. 28 and 29, which COFDM receiver apparatus as so modified is an alternative embodiment of receiver apparatus configured in accordance with the invention.

FIG. 28 depicts a de-mapper 91 for successive coordinates of BPSK symbol constellations as supplied to its input port from one of the parallel-to-serial converters in the bank 76 of them depicted in FIG. 27, 30 or 64. The de-mapper 91 supplies bits responsive to the respective parities of the COFDM carriers to reproduce bit-wise FEC coded L1-pre signaling, supplied from the output port of the de-mapper 91 to the input port of a decoder 92 for LDPC coding. The output port of the decoder 92 for LDPC coding is connected for supplying reproduced BCH coding to the input port of a decoder 93 for BCH coding, the output port of which is connected for supplying reproduced L1-pre signaling to a respective input port of the controller 90 of decoding operations within the DTV receiver.

FIG. 28 depicts a de-mapper 94 for successive complex coordinates of QPSK or QAM constellations as supplied to its input port from one of the parallel-to-serial converters in the bank 76 of them depicted in FIG. 27, 30 or 64. ETSI standard EN 302 755 V1.3.1 prescribes BPSK, QPSK, 16QAM, or 64QAM constellations be used for L1-post signaling in DVB-T2. The de-mapper 94 responds to the complex coordinates descriptive of successive BPSK symbol constellations to recover a single soft bit of FEC coding from each constellation. The de-mapper 94 responds to the complex coordinates descriptive of successive QPSK constellations to recover two soft bits of FEC coding from each constellation. The de-mapper 94 responds to the complex coordinates descriptive of successive 16QAM constellations to recover four soft bits of FEC coding from each constellation. The de-mapper 94 responds to the complex coordinates descriptive of successive 64QAM constellations to recover six soft bits of FEC coding from each constellation. In any one of these four cases, the de-mapper 94 supplies the soft bits of FEC coding from its output port to the input port of a deinterleaver 95 of the interleaving of those soft bits, introduced by the bit interleaver 49 in the FIG. 3 portion of the DTV transmitter. The design of the deinterleaver 95 is different for different ones of these four cases. The output port of the deinterleaver 95 connects to the input port of a soft-input/soft-output decoder 96 for decoding multilevel LDPC coding. The output port of the SISO decoder 96 is connected for supplying bits of BCH coding to the input port of a decoder 97 for decoding BCH coding.

Arranging the decoder for decoding multilevel LDPC coding to supply soft bits of BCH coding to the input port of the decoder 97 for decoding BCH coding facilitates the decoder 97 being of a type that responds to soft-input bits for locating bit errors, which increases the capability of the decoder 97 to correct bit errors. FIG. 28 shows the output port of the BCH decoder 97 connected to the input port of a bits descrambler 98. The output port of the bits descrambler 98 is connected for supplying L1-post signaling to a respective input port of the controller 90 of decoding operations within the DTV receiver.

FIG. 29 depicts a memory 99 configured as a cell deinterleaver for deshuffling successive complex coordinates of 16QAM, 64QAM, 128QAM, 256QAM or 512QAM constellations as supplied to its write input port from the output port of the maximal-ratio code combiner 80. Complex-coordinate descriptions of de-interleaved cells are read from the memory 99 to the input port of a QAM de-mapper 100. The de-mapper 100 responds to the complex QAM coordinates descriptive of successive 16QAM constellations to recover four soft bits of FEC coding from each constellation. Alternatively, the de-mapper 100 responds to the soft complex QAM coordinates descriptive of successive 64QAM constellations to recover six soft bits of FEC coding from each constellation. Alternatively, the de-mapper 100 responds to the soft complex QAM coordinates descriptive of successive 128QAM constellations to recover seven soft bits of FEC coding from each constellation. Alternatively, the de-mapper 100 responds to the soft complex QAM coordinates descriptive of successive 256QAM constellations to recover eight soft bits of FEC coding from each constellation. Alternatively, the de-mapper 100 responds to the soft complex QAM coordinates descriptive of successive 512QAM constellations to recover nine soft bits of FEC coding from each constellation. In any one of these five cases, the de-mapper 100 supplies the soft bits of FEC coding from its output port to the input port of a soft-input/soft-output decoder 101 for decoding multilevel LDPC coding in accordance with an aspect of the invention. In actual practice a DTV receiver is likely to include a bank of various de-mappers, rather than just a de-mapper for one size of QAM constellation.

FIG. 29 shows the output port of the SISO decoder 101 connected to the input port of a decoder 102 for BCH coding. The iterative procedures for decoding the constituent codestreams of the multi-level LDPC coding are sometimes prone to exhibiting bit-error floor characteristics when low bit error rates are reached. There remain a number of remnant bit errors even after a large prescribed maximum number of decoding iterations have been performed. The decoder 102 for BCH coding is designed to correct these remnant errors. FIG. 29 shows the output port of the decoder 102 connected to the input port of a baseband-frame (BBFRAME) descrambler 103. The output port of the BBFRAME descrambler 103 connects to the input port of an IP packet parser 104. Responsive to indications in the BBFRAME header, the IP packet parser 104 locates the start of the initial IP packet that begins in a BBFRAME. Thereafter, the IP packet parser 104 locates the start of any further IP packet that begins in the same BBFRAME by daisy-chaining from indications in the header of the IP packet just before. Also, daisy-chaining from indications in the header of the immediately preceding IP packet can be used to verify the location of the start of the initial IP packet that begins in a next BBFRAME.

FIG. 29 shows the output port of the IP packet parser 104 connected to supply IP packets to the input port of a packet sorter 105 for sorting them according to their packet identification sequences (PIDs). FIG. 29 shows a first output port of the IP packet sorter 105 connected for supplying video data packets to the input port of apparatus 106 for utilizing video data packets, which apparatus typically includes a video-data-packet decoder at the outset thereof. FIG. 29 shows a second output port of the IP packet sorter 105 connected for supplying audio data packets to the input port of apparatus 107 for utilizing audio data packets, which apparatus typically includes an audio-data-packet decoder at the outset thereof. FIG. 29 shows a third output port of the IP packet sorter 105 connected for supplying ancillary data packets to the input port of apparatus 108 for utilizing ancillary data packets, which apparatus typically includes an ancillary-data-packet decoder at the outset thereof. In practice, the packet sorter 105 is likely to be subsumed within respective packet-selection input circuitry of the apparatus 106 for utilizing video data packets, of the apparatus 107 for utilizing audio data packets and of the apparatus 108 for utilizing ancillary data packets.

The IP packets supplied from the IP packet parser 104 include CRC-8 coding in their headers. This CRC-8 coding could be decoded before the IP packets are sorted according to their PIDs, thus to determine whether or not each IP packet reproduced at the output port of the IP packet parser 104 is presumably free of error. In usual designs, however, this CRC-8 coding is decoded within the apparatus 106 for utilizing video data packets, within the apparatus 107 for utilizing audio data packets, and within the apparatus 108 for utilizing ancillary data packet decoders. Such decoding of CRC-8 coding confirms whether or not each IP packet sorted to the apparatus 106, to the apparatus 107 or to the apparatus 108 is free of detectable error.

The decoder 101 for decoding multilevel LDPC coding depicted in FIG. 29 is apt to be a microprocessor having its own memory, which microprocessor responds to commands derived from the configurable portion of L1-post signaling to implement decoding of one of the types of LDPC coding that are transmitted in accordance with a broadcast standard. The deinterleaver for cell interleaving is apt to be subsumed into the addressing of that memory when soft complex coordinates of QAM symbols are written thereto, rather than a separate memory 99 being used to deshuffle those symbols in a cell de-interleaving procedure.

FIG. 30 depicts a modification of the FIG. 27 portion of the COFDM receiver apparatus further depicted in FIGS. 28 and 29. As noted supra, the frequency-domain channel equalizer 75 weights each of respective sets of complex coordinates for QPSK or QAM constellations of respective OFDM carriers received in parallel at its input port. The channel equalizer 75 supplies the weighted responses in parallel from its output port to the respective input ports of a bank 76 of parallel-to-series converters. The output port of the bank 76 of parallel-to-series converters is connected for supplying complex QPSK or QAM symbol map coordinates to the input port of the selector 77. The selector 77 selectively reproduces at its output port complex QPSK or QAM symbol map coordinates just for transmissions that are not subsequently repeated and for transmissions repeated for iterative-diversity reception. The output port of the selector 77 is connected to the first input port of the maximal-ratio code combiner 80.

In a departure from customary practice and from what FIG. 27 depicts, the channel equalizer 75 further supplies the weighted responses in parallel from its output port to the respective input ports of another bank 109 of parallel-to-series converters. The connections to the input ports of the bank 109 of parallel-to-series converters are arranged so as in effect to de-rotate the circular DFT components computed by the DFT computer 73. The response of the one of the parallel-to-series converters in this bank 109 of them that is appropriate for the number of OFDM carriers in the DFT and the sort of modulation symbol constellations for those carriers is selected as the response supplied from the bank 109 of parallel-to-series converters. The output port of the bank 109 of parallel-to-series converters is connected for supplying complex QPSK or QAM symbol map coordinates to the input port of the selector 78. The selector 78 selectively reproduces at its output port complex QPSK or QAM symbol map coordinates just for initial transmissions that are subsequently repeated for iterative-diversity reception. The output port of the selector 78 is connected to the write input port of a memory 110 configured to delay the selected initial ones of those transmissions subsequently repeated for iterative-diversity reception so as to concur in timing with corresponding final ones of those transmissions as repeated for iterative-diversity reception.

The memory 110 is operable for delaying the PSK or QAM symbol map coordinates read in normal time-sequential order from a read-output port thereof to the second input port of the code combiner 80. The delay is for N super-frame periods plus a time-slice interval. This delay can be prescribed fixed delay or, alternatively, can be programmable responsive to delay specified by bits in L1-pre signaling. Were it not for corruption caused by noise and fading, the PSK or QAM symbol map coordinates read from the memory 110 to the second input port of the code combiner 80 would concur with the PSK or QAM symbol map coordinates supplied by the selector 77 to the first input port of the code combiner 80. Since the memory 110 simply provides delay and is not used for de-rotating components from rotated circular DFT, it can be serial memory. If the memory 110 be random-access memory, its read addressing can be generated simply by adding a constant offset to its write addressing, which is generally provided from a counter. That is, the addressing of a random-access memory 110 as configured for FIG. 30 is simpler to provide than is the addressing of a random-access memory configured, not only to delay the COFDM symbols of initial transmissions of the DTV data, but also to de-rotate them, as required of the memory 79 depicted in FIG. 27.

Figure 31:
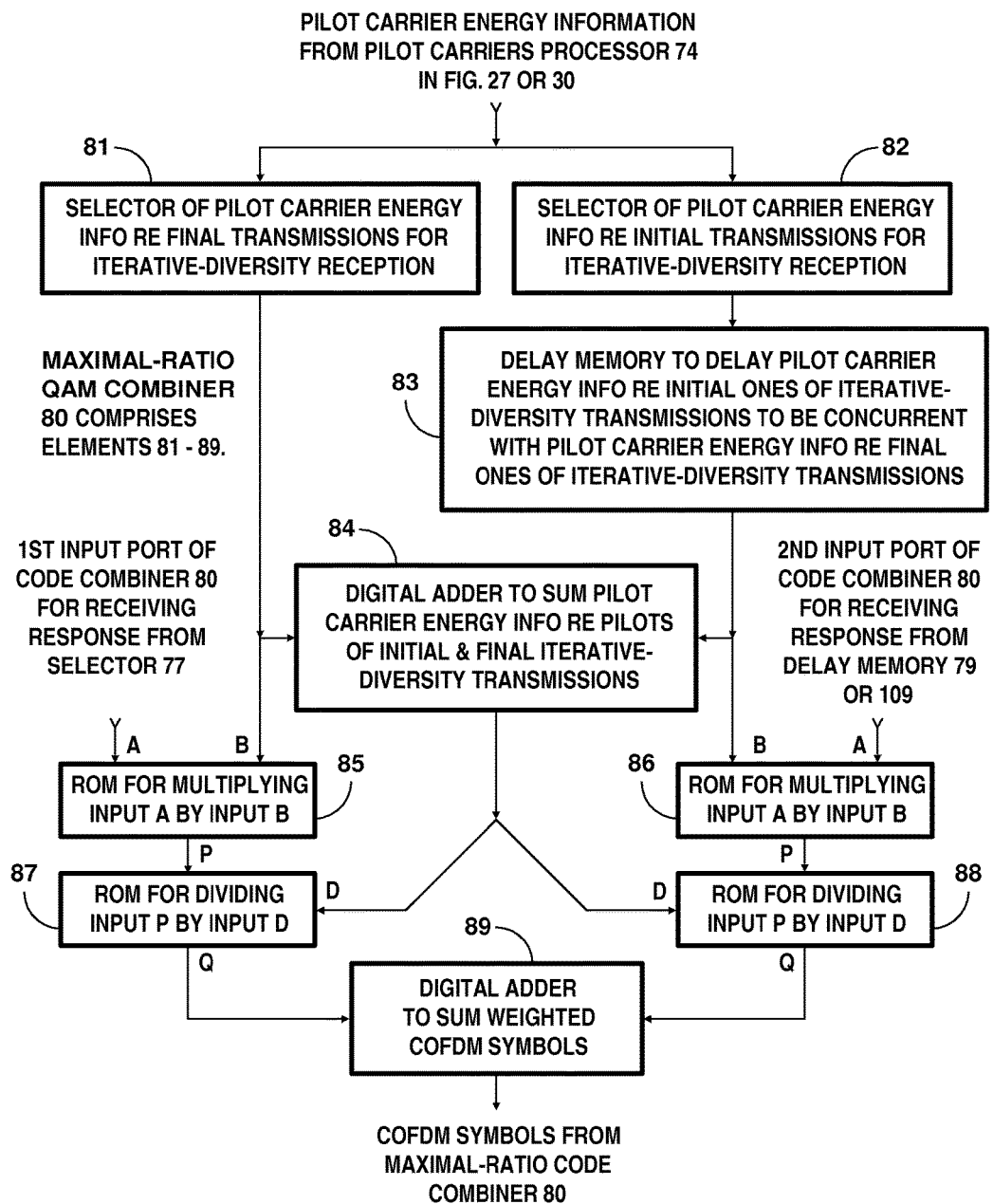
FIG. 31 is a detailed schematic diagram of the maximal-ratio code combiner depicted in the FIG. 27 and FIG. 30 portions of COFDM receiver apparatuses.
Figure 32:
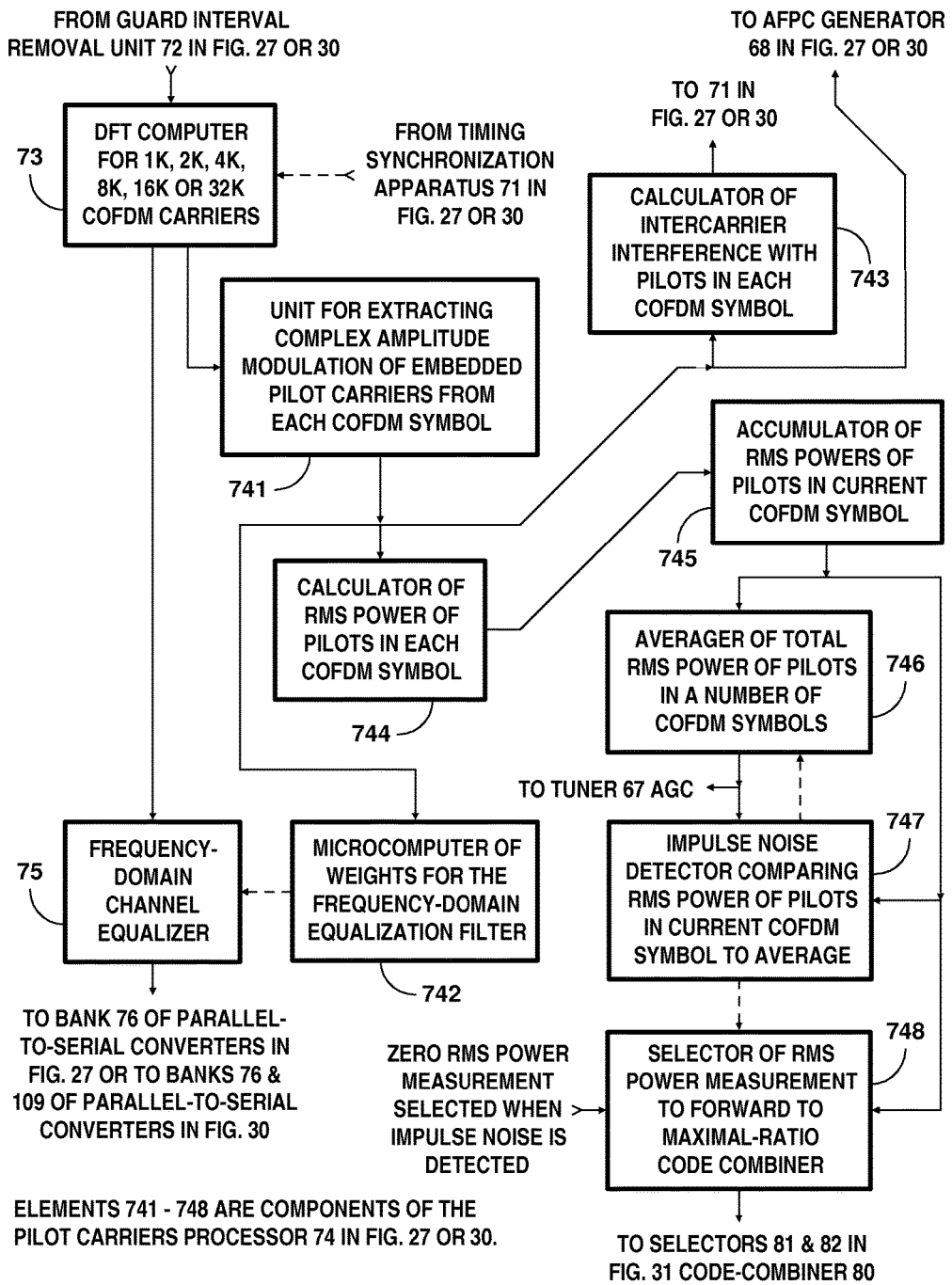
FIG. 32 is a detailed schematic diagram of portions of the pilot carriers processor as depicted in FIG. 27 or in FIG. 30, which portions generate measurements of the total RMS power of pilot carriers for controlling the maximal-ratio code combiner depicted in FIG. 27 or in FIG. 30.

FIG. 31 shows in detail the basic structure of the maximal-ratio code combiner 80 depicted in FIG. 27 and in FIG. 30. The code combiner 80 is connected for receiving pilot-carrier-energy information from the pilot carriers processor 74 shown in FIG. 27 and in FIG. 30. The pilot carriers processor 74 squares the real and imaginary terms of each unmodulated pilot carrier, sums the resulting squares and square-roots the sum to determine the root-mean-square (RMS) energy of that unmodulated pilot carrier. This procedure can be carried out for each pilot carrier using read-only memory addressed by the real and imaginary terms of each successively considered unmodulated pilot carrier. The RMS energies of the pilot carriers are then summed by an accumulator, which determines the total RMS energy of the pilot carriers for each OFDM symbol epoch.

The value of the total RMS energy supplied from the pilot carriers processor 74 is applied to the respective input ports of selectors 81 and 82 in the maximal-ratio code combiner 80 as shown in FIG. 31. The selector 81 selectively reproduces at its output port the total energy of the pilot carriers during those transmissions that are not repeated and the final ones of those transmissions repeated for iterative-diversity reception. The selector 82 selectively reproduces at its output port the total energy of the pilot carriers during the initial ones of those transmissions repeated for iterative-diversity reception. These operations of the selectors 81 and 82 are controlled responsive to indications conveyed in the L1 signaling. These operations support the complex coordinates of QPSK or QAM symbols from transmissions that are not repeated, which coordinates are supplied to a first of the two input ports of the code combiner 80, being reproduced without modification from its output port.

A delay memory 83 is connected for delaying the selector 82 response to supply a delayed selector 82 response that is concurrent with the selector 81 response. The delay memory 83 is preferably a random-access memory (RAM) with write addressing and read addressing configuring the RAM to provide delay. The length of delay afforded by the delay memory 83 is essentially the same as the length of delay afforded by the memory 110 depicted in FIG. 30 or the length of delay that would be afforded by the memory 79 depicted in FIG. 27 were it not relied upon to de-rotate DFT components.

A digital adder 84 is connected for adding the selector 81 response and the delayed selector 82 response read from the delay memory 83. The sum output response from the adder 84 combines the total energies of the initial and final transmissions for iterative-diversity reception, to be used for normalizing the weighting of the selector 80 response and the weighting of the delayed selector 82 response read from the RAM 83.

In the COFDM receiver apparatus depicted in FIGS. 27, 28 and 29 a read-only memory 85 is connected for multiplying soft complex QAM coordinates in the response from the selector 77 (depicted in FIG. 27) by the total energy of a final transmission for iterative-diversity reception. A read-only memory 86 is connected for multiplying the soft complex QAM coordinates read from the memory 79 depicted in FIG. 27 by the total energy of the corresponding initial transmission for iterative-diversity reception.

In the COFDM receiver apparatus depicted in FIGS. 30, 28 and 29 the read-only memory 85 is connected for multiplying soft complex QAM coordinates in the response from the selector 77 (depicted in FIG. 30) by the total energy of a final transmission for iterative-diversity reception. The read-only memory 86 is connected for multiplying the soft complex QAM coordinates read from the memory 110 depicted in FIG. 30 by the total energy of the corresponding initial transmission for iterative-diversity reception.

In both of the FIG. 27 and FIG. 30 maximal-ratio code combiners 80 the soft complex product from the ROM 85 is a weighted response to soft complex QAM coordinates in transmissions that are not repeated and in the final ones of those transmissions repeated for iterative-diversity reception. A read-only memory 87 is connected for normalizing this weighted response with respect to the total energies of the initial and final transmissions for iterative-diversity reception, by dividing the complex product from the ROM 85 by the sum output response from the adder 84. The soft complex product from the ROM 86 is a weighted response to soft complex QAM coordinates in the initial ones of those transmissions subsequently repeated for iterative-diversity reception. A read-only memory 88 is connected for normalizing this weighted response with respect to the total energies of the initial and final transmissions for iterative-diversity reception, by dividing the complex product from the ROM 86 by the sum output response from the adder 84.

A digital complex adder 89 is connected for summing the respective complex quotients from the ROMs 87 and 88 to synthesize soft-decision COFDM symbols that are the maximal-ratio code combiner 80 response supplied to the write input port of the FIG. 29 memory 99 configured as a cell deinterleaver for de-shuffling QAM symbols One skilled in digital design is apt to perceive that, alternatively, normalization of the coefficients for weighting of the selector 81 response and for weighting of the inverted-in-polarity and delayed selector 82 response read from the delay memory 84 can be performed before such weighting, rather than after. A single read-only memory can be designed to perform the combined functions of the ROMs 85 and 87; and a single read-only memory can be designed to perform the combined functions of the ROMs 86 and 88. Alternatively, the ROMs 85, 86, 87 and 88 could be combined with the complex adder 89 in a very large ROM. The computations can be performed by digital circuitry other than ROMs, but problems with proper timing are considerably more difficult.

The operation of the maximal-ratio code combiner 80 following a change in RF channel or sub-channel is of interest. Following such a change, a DTV receiver as described supra will not have foregoing initial transmissions for iterative-diversity reception temporarily stored in its RAM 86. Therefore, the DTV receiver bulk-erases the contents of storage locations in the RAM 83. The pilot carriers processor 74 will not have supplied the maximal-ratio code combiner 80 with information concerning the RMS-energy of pilot carriers accompanying the foregoing initial transmissions for iterative-diversity reception. Accordingly, the DTV receiver erases the contents of the delay memory 83 within the code combiner 80 that stores such information. This erasure conditions the maximal-ratio code combiner 80 for single-transmission reception until the delay memory 83 therein refills with information concerning the RMS-energy of pilot carriers accompanying the foregoing initial transmissions for iterative-diversity reception. During this delay in the code combiner 80 beginning iterative-diversity reception, the storage locations in the RAM 86 fill with complex coordinates of modulation symbol constellations in initial transmissions for iterative-diversity reception. These complex coordinates are supplied with delay to the second input port of the code combiner 80 when iterative-diversity reception begins.

FIG. 32 depicts more specifically elements 741-748 in a representative embodiment of the pilot carriers processor 74 as shown in each of FIGS. 27 and 30. The first output port of the DFT computer 73 connects to the input port of a unit 741 for extracting complex amplitude-modulation components of pilot carriers embedded in each successive COFDM symbol according to one of a number of prescribed patterns. The unit 741 comprises a plurality of parallel-to-serial converters for converting to serial format the complex amplitude-modulation components of pilot carriers available in parallel from the DFT computer 73 according to respective ones of those prescribed patterns. This implements a procedure referred to as "embedded signal recovery" in some of the technical literature concerning DVB-T and DVB-T2 practices. The complex components of the amplitude modulation of pilot carriers are supplied in serial format from a selected one of the parallel-to-serial converters in the unit 741 to the AFPC generator 68 as shown in FIGS. 27 and 30. The AFPC generator 68 multiplies the imaginary coordinates of the pilot carriers by their real coordinates and averages the resulting products to provide a basis for developing automatic frequency and phase control (AFPC) of the final local oscillator in the front-end tuner 67 shown in FIGS. 27 and 30. Also, the complex components of the amplitude modulation of pilot carriers are supplied in serial format from that selected one of the parallel-to-serial converters in the unit 741 to a microcomputer 742 of weighting coefficients for the frequency-domain channel equalizer 75. Furthermore, the complex components of the amplitude modulation of pilot carriers are supplied in serial format from that selected one of the parallel-to-serial converters in the unit 741 to a calculator 743 of intercarrier interference with pilot carriers caused by proximate data-modulated OFDM carriers. The calculator 743 accumulates intercarrier interference measurements for all the pilot carriers in each COFDM symbol and transmits the total from an output port thereof to the timing synchronization apparatus 71, there to implement fine adjustment of the DFT window positioning in time in a feedback loop that attempts to minimize the total intercarrier interference from data-modulated OFDM carriers.

ETSI standard EN 302 755 V1.3.1 prescribes eight different patterns of scattered pilots. The number and location of continual pilots depends both on the FFT size and on the scattered pilot pattern in use. The continual pilot locations are taken from one or more of six "CP groups" depending on the FFT mode. So the unit 741 for extracting complex amplitude-modulation components of pilot carriers embedded in each successive COFDM symbol according to each combination of patterns of pilot carriers prescribed by EN 302 755 V1.3.1 contains a considerable number of parallel-to-serial converters for processing single-time transmissions or the final transmissions for iterative-diversity reception. The patterns of scattered pilots prescribed by EN 302 755 V1.3.1 are modified by the rotation of circular I-DFT by one-half revolution in the initial transmissions for iterative-diversity reception, so another considerable number of parallel-to-serial converters must be included in the unit 741 for processing the pilots in the initial transmissions. It should be possible to design patterns of pilot carriers for an improved broadcast standard that are the same whether or not the circular I-DFT is rotated half a revolution.

A function of the pilot carriers processor 74 that is of principal concern is the generation of measurements of the total RMS power of pilot carriers that the maximal-ratio code combiner 80 depicted in FIG. 31 utilizes to control combining the results of demodulating initial and final transmissions of COFDM signals during iterative-diversity reception. Man-made noise (MMN) generated close to the DTV reception site tends to cause interference within a radio-frequency channel selected for reception, which interference is apt to be many times larger than the DTV signal sought after. If only one of the similar initial and final transmissions of the coded DTV signal transmitted for iterative-diversity reception is corrupted by the MMN, it is desirable to keep the corrupted transmission from generating measurements of the total RMS power of pilot carriers that will condition the maximal-ratio code-combiner 80 to respond primarily to that corrupted transmission, rather than responding primarily to the other of the initial and late transmissions that is not corrupted by MMN. This avoids the stronger MMN capturing the results of the combining procedures owing to its greater signal strength. It is preferable that reception of the coded DTV signal relies exclusively on the transmission uncorrupted by strong MMN.

Complex amplitude-modulation components of pilot carriers embedded in each successive COFDM symbol are supplied in serial format to a calculator 744 from parallel-to-serial converters in the unit 741 for extracting those components. The calculator 744 calculates the RMS power of the pilot carriers in each COFDM symbol. In effect the calculator 744 squares the real and imaginary components of each pilot carrier, sums the squares and then square roots the sum to calculate the root-mean-square (RMS) power of that particular pilot carrier. The calculator 744 can be replaced by read-only memory addressed by the real and imaginary amplitude-modulation components of each pilot carrier for supplying the RMS power of that particular pilot carrier in shorter time than required for real-time calculation. Since the DFT-window-adjustment feedback loop including the timing synchronization apparatus 71 seeks to minimize the imaginary amplitude-modulation components of each pilot carrier, being aided by the AFPC feedback loop including the AFPC generator 68, the real amplitude-modulation components of pilot carriers can be considered by themselves to provide sufficient description of the RMS powers of the pilot carriers. In any case, indications of the RMS powers of the pilot carriers are supplied to the input port of an accumulator 745 that generates a summation of the RMS powers of pilot carriers in each successive COFDM symbol being currently considered, which summation is supplied from an output port of the accumulator 745 to the respective input ports of elements 746-748 of the pilot carriers processor 74 as depicted in FIG. 32.

The total RMS power of pilot carriers in each successive COFDM symbol, as supplied from an output port of the accumulator 745, is supplied to a first of two input ports of a selector 746 of the RMS power measurement to be supplied from an output port of that selector 746. FIG. 32 shows the second input port of the selector 746 connected to receive a zero RMS power measurement, which the selector 746 is to select when impulse noise is detected that would cause the calculation of the total RMS power of pilot carriers in the current COFDM symbol to be erroneous. FIG. 32 indicates that the output port of the selector 746 connects to the input ports of the selectors 81 and 82 of the maximal-ratio code combiner 80 depicted in FIG. 31. The selection of which of the RMS power measurements supplied to the two input ports of the selector 746 is reproduced at its output port is controlled by indications supplied to the selector 746 from the output port of an impulse noise detector 747.

The energy in MMN or impulse noise is wide-spectrum in nature insofar as the 6-MHz-wide to 8-MHz-wide radio-frequency (RF) channel is concerned, containing all frequencies within the channel. The respective phasings of those frequency components are random in nature. Large-energy noise components close in frequency to pilot carriers combine with the pilot carriers to cause the imaginary coordinates ascribed to those pilot carriers by the DFT computer 73 to be greatly increased from their usual low values. Ideally, these imaginary coordinates would be zero-valued, since the binary phase-shift-keying (BPSK) of the pilot carriers is real-only. In actual practice, Johnson noise will cause these imaginary coordinates to have some values that are low compared to the real coordinates ascribed to those pilot carriers by the DFT computer 73. The impulse noise detector 747 generates an indication of MMN or impulse noise only when the summed absolute values of the imaginary coordinates ascribed to each of the pilot carriers in the currently considered COFDM symbol exceeds a threshold value. This threshold value is greater than the summed absolute values of the imaginary coordinates ascribed to each of the pilot carriers in a COFDM symbol when receiving additive white Gaussian noise (AWGN) at the largest levels at which data-slicing of the complex coordinates of the pilot carriers is still valid.

When the impulse noise detector 747 generates an indication that MMN or impulse noise corrupts the current COFDM symbol, this indication conditions the selector 746 to reproduce at its output port the zero RMS power measurement that FIG. 32 shows applied to its second input port. Absent the impulse noise detector 747 generating such indication, the selector 746 is conditioned to reproduce at its output port the RMS power measurement supplied to its first input port from the output port of the accumulator 745. When the selector 746 reproduces the zero RMS power measurement for application to the input ports of the selectors 81 and 82 of the maximal-ratio code combiner 80 depicted in FIG. 31, the complex coordinates of QAM constellations from the current COFDM symbol will be disregarded in the code combining performed by the code combiner 80. Accordingly, the complex coordinates of QAM constellations supplied from the code combiner 80 will not be affected by MMN or impulse noise.

The total RMS power of pilot carriers in each successive COFDM symbol, as supplied from an output port of the accumulator 745, is supplied to the input port of an averager 748 that averages the total RMS power of pilot carriers for a number of COFDM symbols. FIG. 32 indicates that the output port of the averager 748 supplies this averaged total RMS power of pilot carriers to the front-end tuner 67 for use in automatic gain control (AGC) of amplifiers therein. FIG. 32 shows a connection from the impulse noise detector 747 to the averager 748, which connection is used for supplying the averager 748 with indications of the occurrence of MMN or impulse noise. Such indications are used by the averager 748 to exclude the total RMS power of pilot carriers in the current COFDM symbol from being included in its running average of the total RMS power of pilot carriers in number of COFDM symbols. Although not shown in FIG. 32, the impulse noise detector 747 preferably has connections to the AFPC generator 68 and to the calculator 743 for providing them with indications of the occurrence of MMN or impulse noise. These indications allow the AFPC generator 68 and the calculator 743 to modify their respective operations so as to avoid at least in substantial degree adverse effects of MMN or impulse noise on those operations.

Impulse noise accompanying COFDM signals can be detected in the frequency domain by other methods. Hosein Asjadi discloses one such alternative method in U.S. Pat. No. 7,418,026 issued 26 Aug. 2008 and titled "Receiver for a multi-carrier modulated symbol". Hosein Asjadi discloses another alternative method in U. S. Pat. App. US-2010-0246726-A1 published 30 Sep. 2010 and titled "Receiver and method of receiving". Alternatively, impulse noise accompanying COFDM signals can be detected in the time domain, rather than in the frequency domain. Detecting impulse noise can begin with peak detection of intermediate-frequency COFDM signals in the front-end tuner of the DTV receiver.

Figure 33:
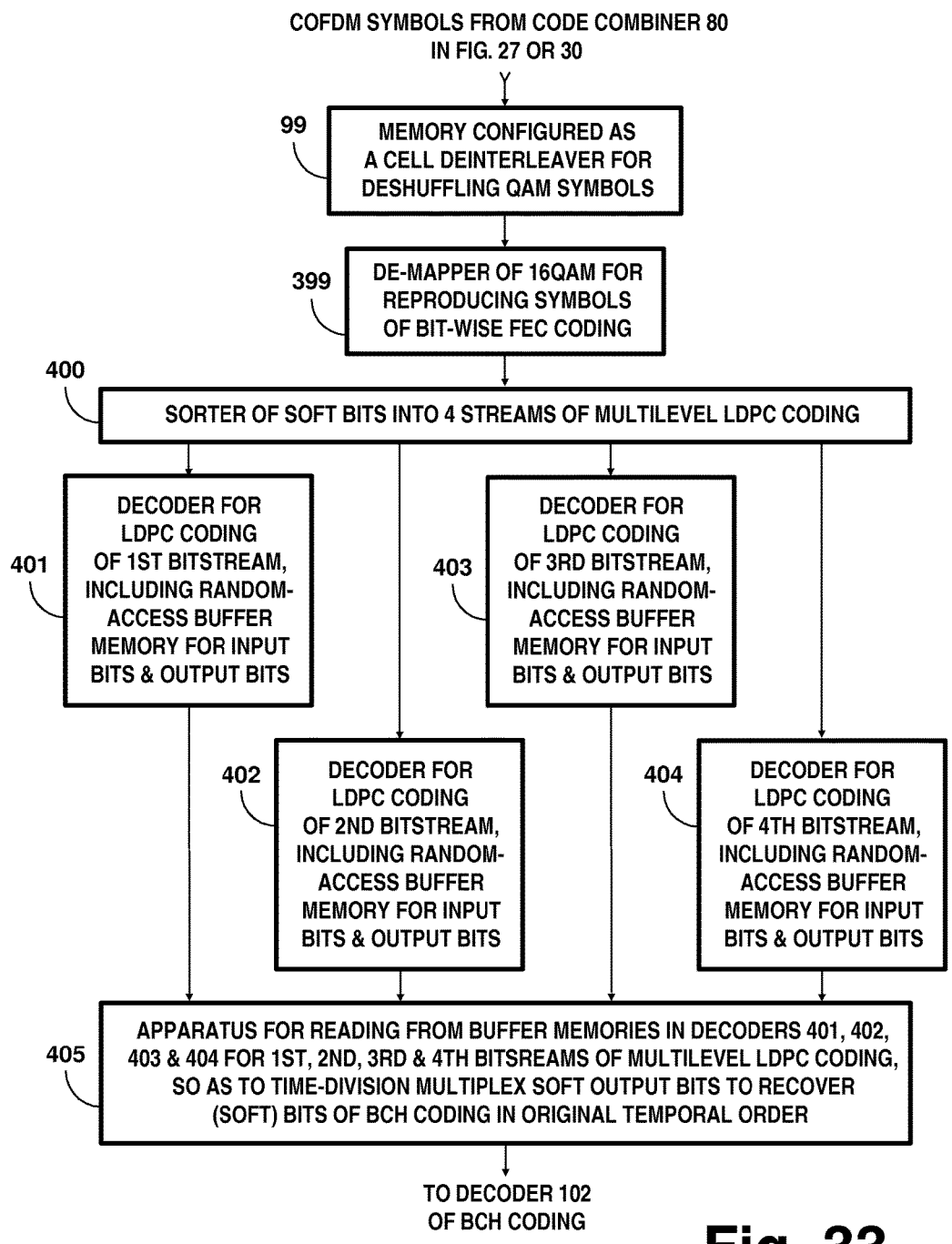
FIG. 33 is a detailed schematic diagram of one embodiment of a part of the FIG. 29 portion of the COFDM receiver apparatus for decoding multilevel LDPC coding recovered by de-mapping 16QAM constellations.

FIG. 33 is a schematic diagram for conceptually illustrating one way in which the decoder 101 is configured for decoding multilevel concatenated LDPC coding recovered by de-mapping 16QAM constellations. A de-mapper 399 recovers this MLC by de-mapping 16QAM symbols read from the memory 99 configured as a cell deinterleaver for de-shuffling 16QAM symbols. FIG. 33 shows the output port of the de-mapper 399 connected to the input port of a sorter 400 of the soft bits of multilevel LDPC coding received from the de-mapper 399 into four bitstreams. I. e., the MLC is of the form illustrated in FIG. 9. FIG. 33 shows the sorter 400 having first, second, third and fourth output ports connected for supplying first, second, third and fourth constituent bitstreams of this MLC to the input port of a decoder 401 for the in-phase first-level constituent code of the LDPC MLC, to the input port of a decoder 402 for the quadrature-phase first-level constituent code of the LDPC MLC, to the input port of a decoder 403 for the in-phase second-level constituent code of the LDPC MLC and to the input port of a decoder 404 for the quadrature-phase second-level constituent code of the LDPC MLC, respectively. Typically the sorter 400 is realized by suitable write and read addressing of the plural-bank memory associated with a microprocessor construction of the decoder 101. A plural-bank memory comprising separate buffer memories for the decoders 401, 402, 403 and 404 facilitates concurrent decoding of the four levels of LDPC MLC.

FIG. 33 shows apparatus 405 for reading from the separate buffer memories for the decoders 401, 402, 403 and 404 to the input port of the decoder 102 for BCH coding after iterative procedures of decoding LDPC are completed. This reading is done to time-division multiplex soft output bits generated by the decoders 401, 402, 403 and 404 so as to reproduce bits of the BCH-coded FEC frame in the same temporal order they had originally in the BCH coding supplied to the input port of the sorter 300 in the portion of the transmitter depicted in FIG. 7. These reproduced bits are supplied to the input port of the decoder 102 for BCH coding, either in soft-bit format or alternatively in hard-bit format.

Figure 34:
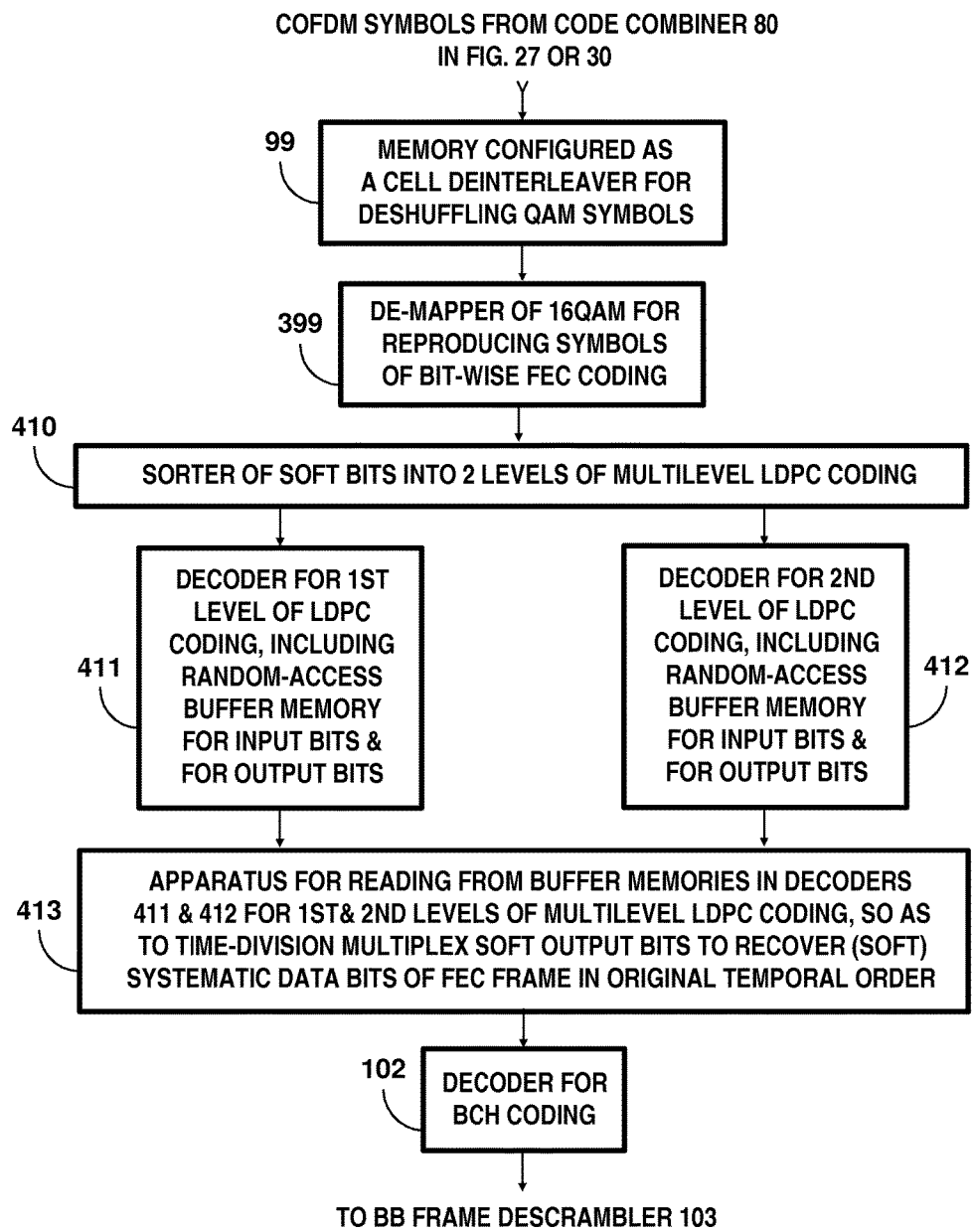
FIG. 34 is a detailed schematic diagram of an alternative embodiment of the part of the FIG. 29 portion of the COFDM receiver apparatus for decoding multilevel LDPC coding recovered by de-mapping 16QAM constellations.
Figure 38:
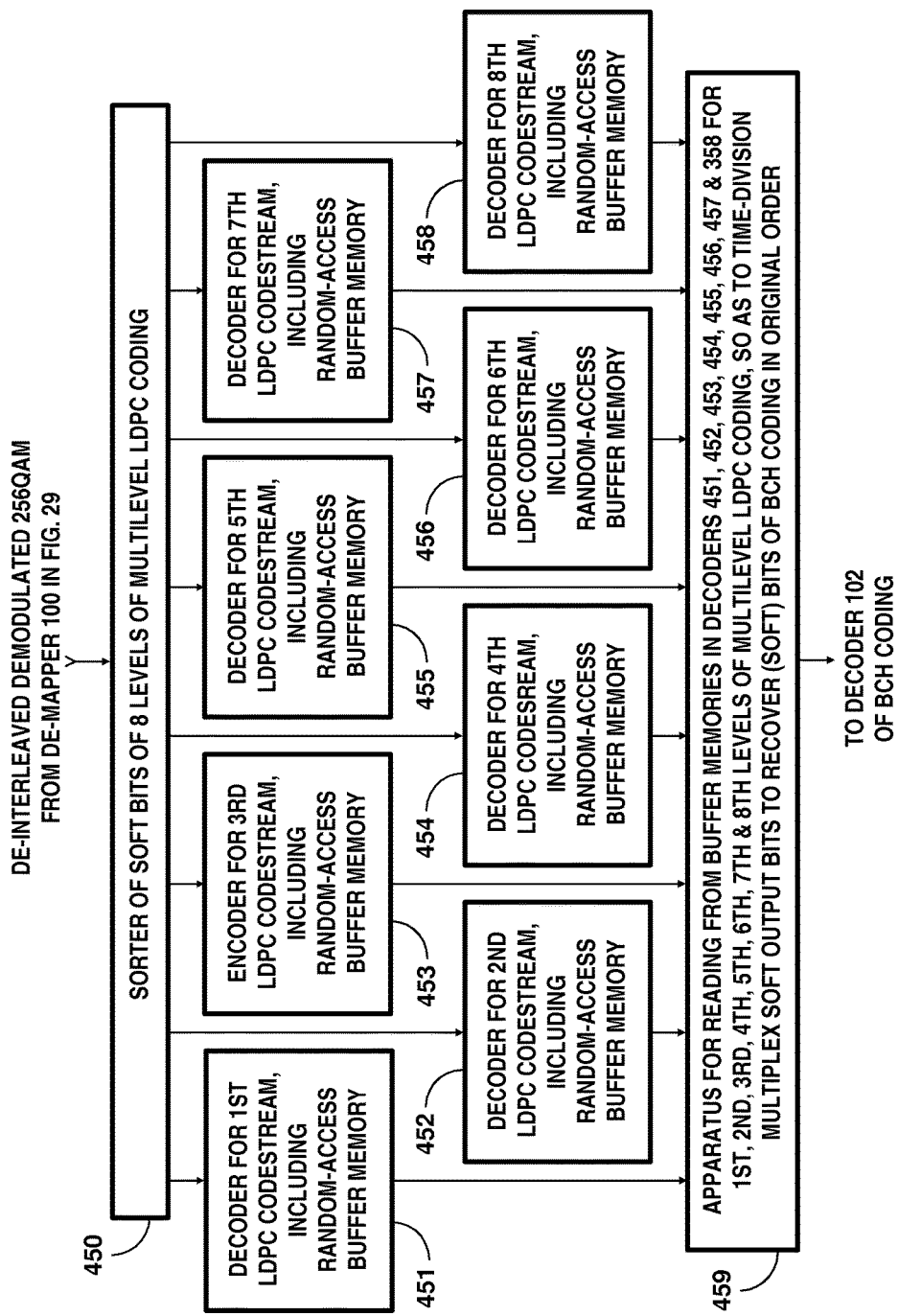
FIG. 38 is a detailed schematic diagram of an embodiment of a part of the FIG. 29 portion of COFDM receiver apparatus for decoding multilevel LDPC coding recovered by de-mapping 256QAM constellations.

FIG. 34 is a schematic diagram for conceptually illustrating another way to configure the decoder 101 for decoding multilevel LDPC coding recovered by de-mapping 16QAM constellations. The de-mapper 399 recovers this MLC by de-mapping 16QAM symbols read from the memory 99 configured as a cell deinterleaver for de-shuffling 16QAM symbols. FIG. 38 shows the output port of the de-mapper 399 connected to the input port of a sorter 410 of the soft bits of multilevel LDPC coding received from the de-mapper 399 into just two bitstreams. I. e., the MLC is of the form illustrated in FIG. 10. FIG. 34 shows the sorter 410 having first and second output ports connected for supplying first and second constituent bitstreams of this MLC to the input port of a decoder 411 for the first-level constituent code of the LDPC MLC and to the input port of a decoder 412 for the second-level constituent code of the LDPC MLC, respectively. Typically the sorter 410 is realized by suitable write and read addressing of the plural-bank memory associated with a microprocessor construction of the decoder 101. A plural-bank memory comprising separate buffer memories for the decoders 411 and 412 facilitates concurrent decoding of the two levels of LDPC MLC.

FIG. 34 shows apparatus 413 for reading from the separate buffer memories for the decoders 411 and 412 to the input port of the decoder 102 for BCH coding after iterative procedures of decoding constituent LDPC codes are completed. This reading is done to time-division multiplex soft output bits generated by the decoders 411 and 412 so as to reproduce bits of the BCH-coded FEC frame in the same temporal order they had originally in the BCH coding supplied to the input port of the sorter 310 in the portion of the transmitter depicted in FIG. 8. These reproduced bits are supplied to the input port of the decoder 102 for BCH coding, either in soft-bit format or alternatively in hard-bit format.

Figure 35:
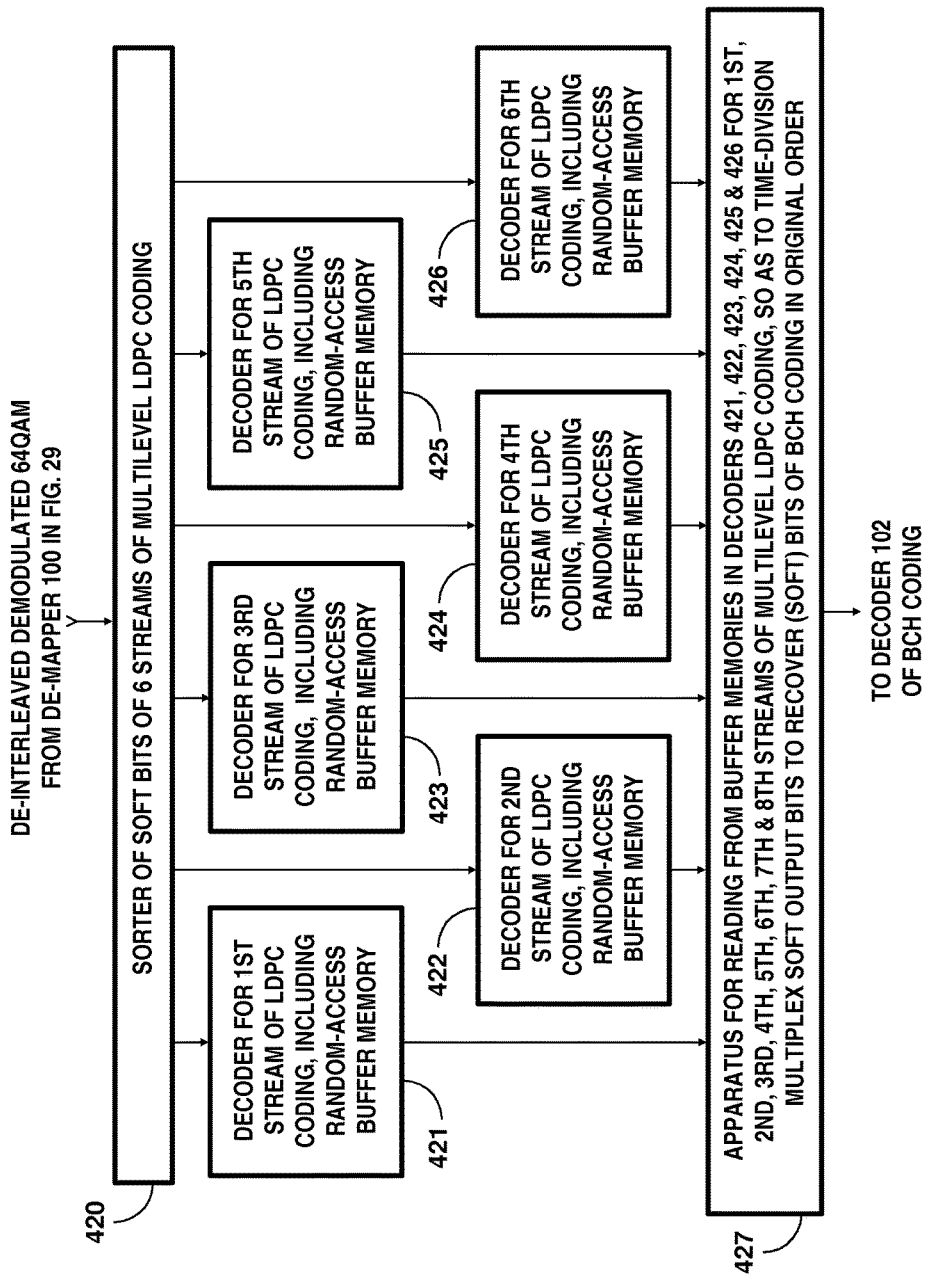
FIG. 35 is a detailed schematic diagram of one embodiment of a part the FIG. 29 portion of the COFDM receiver apparatus for decoding multilevel LDPC coding recovered by de-mapping 64QAM constellations.

FIG. 35 is a schematic diagram for conceptually illustrating one way to configure the decoder 101 for decoding multilevel LDPC coding recovered by de-mapping 64QAM constellations. FIG. 35 shows the input port of a sorter 420 connected for receiving the soft bits of this three-level coding MLC from the de-mapper 100 and separating it into six constituent bitstreams. I. e., the multilevel coding is of the form illustrated in FIG. 16. FIG. 35 shows the sorter 420 having first, second, third, fourth, fifth and sixth output ports connected for supplying the first, second, third, fourth, fifth and sixth constituent bitstreams of the MLC respectively to the input port of a decoder 421 for the in-phase first-level constituent code of the LDPC MLC, to the input port of a decoder 422 for the quadrature-phase first-level constituent code of the LDPC MLC, to the input port of a decoder 423 for the in-phase second-level constituent code of the LDPC MLC, to the input port of a decoder 424 for the quadrature-phase second-level constituent code of the LDPC MLC, to the input port of a decoder 425 for the in-phase third-level constituent code of the LDPC MLC and to the input port of a decoder 426 for the quadrature-phase third-level constituent code of the LDPC MLC. Typically the sorter 420 is realized by suitable write and read addressing of the plural-bank memory associated with a microprocessor construction of the decoder 101. A plural-bank memory comprising separate buffer memories for the decoders 421, 422, 423, 424, 425 and 426 facilitates concurrent decoding of the six constituent bitstreams of the LDPC MLC.

FIG. 35 shows apparatus 427 for reading from the separate buffer memories for the decoders 421, 422, 423, 424, 425 and 426 to the input port of the decoder 102 for BCH coding after iterative procedures of decoding the constituent codes of LDPC MLC are completed. This reading is done to time-division multiplex soft output bits generated by the decoders 421, 422, 423, 424, 425 and 426 so as to reproduce bits of the BCH-coded FEC frame in the same temporal order they had originally in the BCH coding supplied to the input port of the sorter 340 in the portion of the transmitter depicted in FIG. 15. These reproduced bits are supplied to the input port of the decoder 102 for BCH coding, either in soft-bit format or alternatively in hard-bit format.

Figure 36:
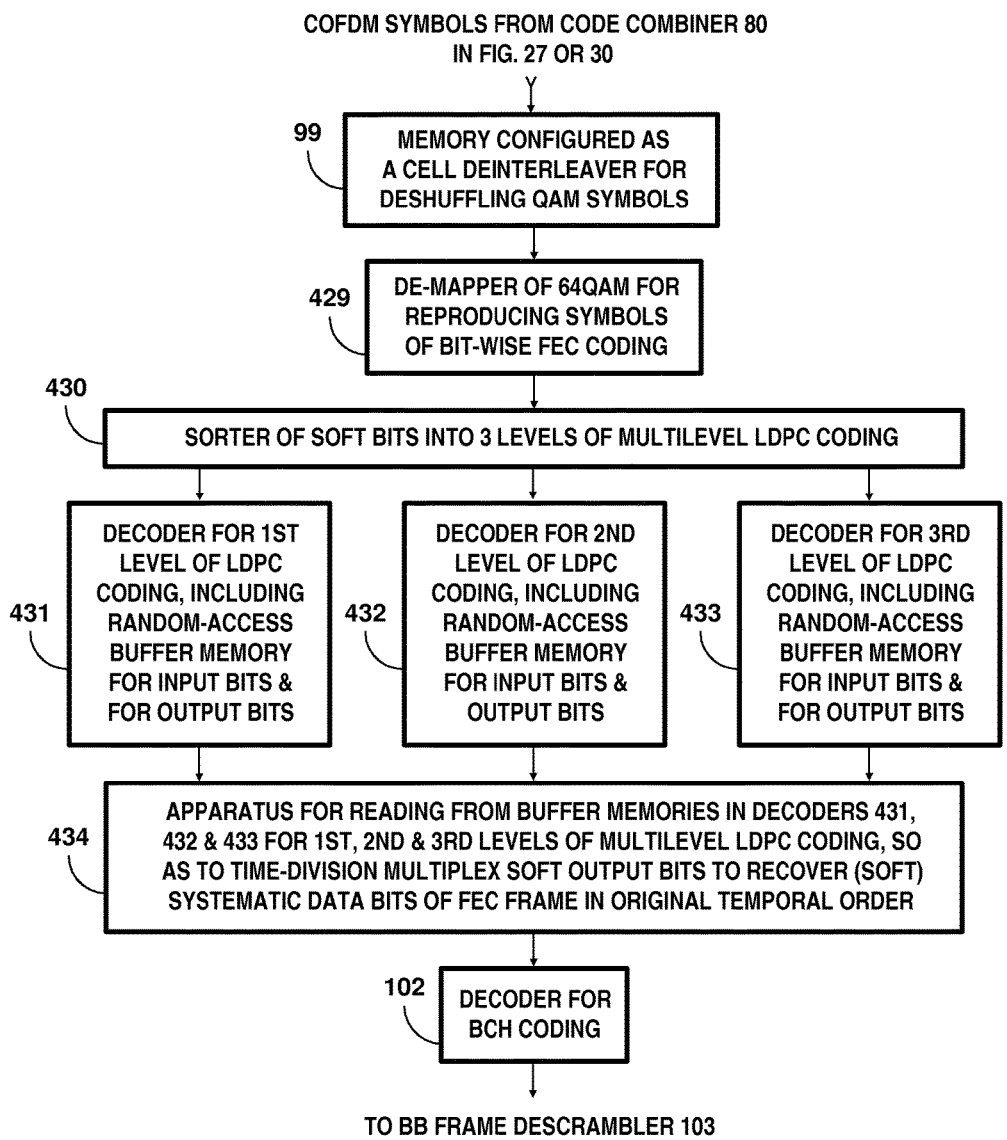
FIG. 36 is a detailed schematic diagram of an alternative embodiment of the part of the FIG. 29 portion of the COFDM receiver apparatus for decoding multilevel LDPC coding recovered by de-mapping 64QAM constellations.

FIG. 36 is a schematic diagram for conceptually illustrating another way to configure the decoder 101 for decoding multilevel LDPC coding recovered by de-mapping 64QAM constellations. A de-mapper 429 recovers this MLC by de-mapping 64QAM symbols read from the memory 99 configured as a cell deinterleaver for de-shuffling 64QAM symbols. FIG. 36 shows the output port of the de-mapper 429 connected to the input port of a sorter 430 of the soft bits of multilevel LDPC coding received from the de-mapper 429 into just three bitstreams. I. e., the MLC is of the form illustrated in FIG. 13. FIG. 36 shows the sorter 430 having first, second and third output ports connected for supplying first, second and third constituent bitstreams of this MLC to the input port of a decoder 431 for the first-level constituent code of the LDPC MLC, to the input port of a decoder 432 for the second-level constituent code of the LDPC MLC and to the input port of a decoder 433 for the third-level constituent code of the LDPC MLC, respectively. Typically the sorter 430 is realized by suitable write and read addressing of the plural-bank memory associated with a microprocessor construction of the decoder 101. A plural-bank memory comprising separate buffer memories for the decoders 431, 432 and 433 facilitates concurrent decoding of the three levels of LDPC MLC.

FIG. 36 shows apparatus 434 for reading from the separate buffer memories for the decoders 431, 432 and 433 to the input port of the decoder 102 for BCH coding after iterative procedures of decoding constituent LDPC codes are completed. This reading is done to time-division multiplex soft output bits generated by the decoders 431, 432 and 433 so as to reproduce bits of the BCH-coded FEC frame in the same temporal order they had originally in the BCH coding supplied to the input port of the sorter 317 in the portion of the transmitter depicted in FIG. 11. These reproduced bits are supplied to the input port of the decoder 102 for BCH coding, either in soft-bit format or alternatively in hard-bit format.

Figure 37:
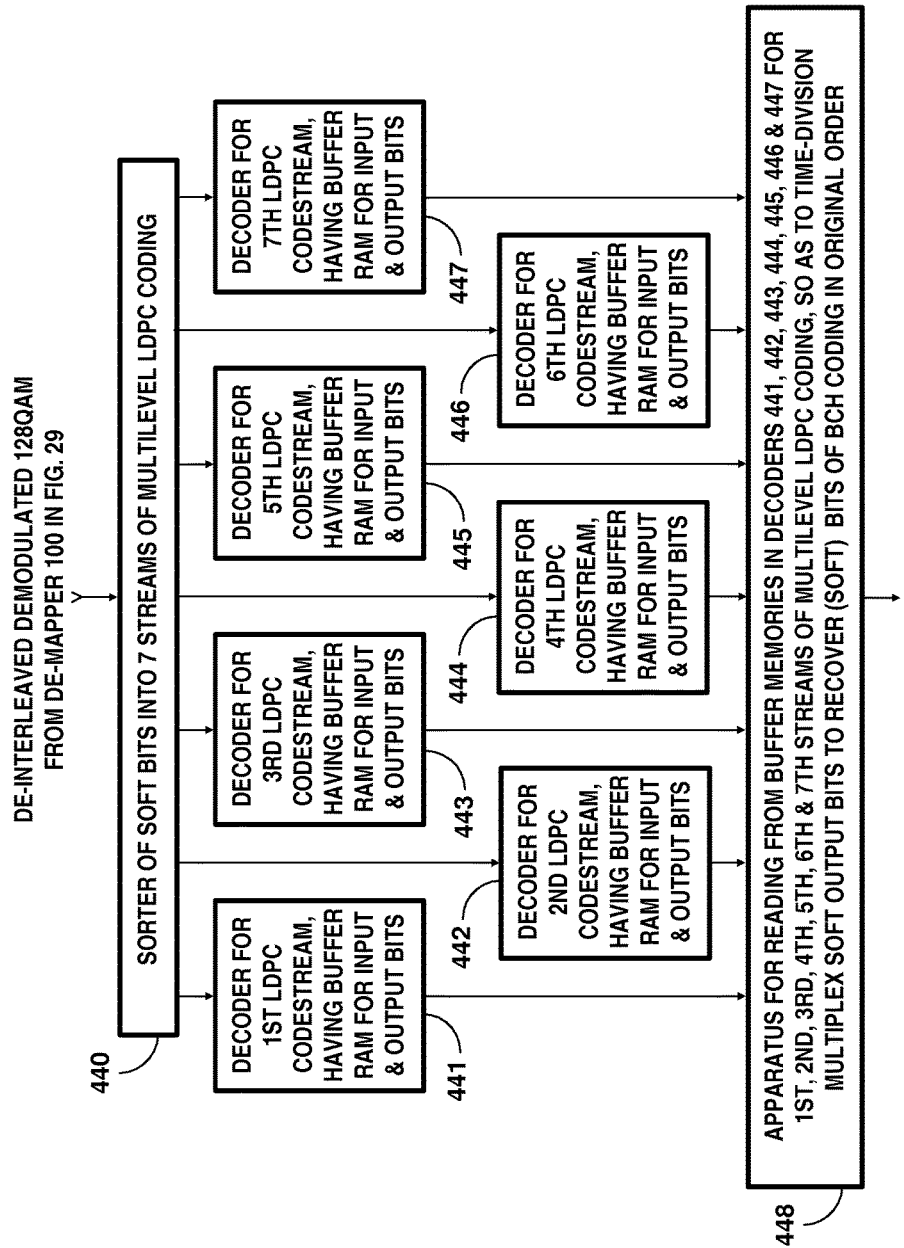
FIG. 37 is a detailed schematic diagram of one embodiment of a part of the FIG. 29 portion of the COFDM receiver apparatus for decoding multilevel LDPC coding recovered by de-mapping 128QAM constellations.

FIG. 37 is a schematic diagram for conceptually illustrating a way to configure the decoder 101 for decoding multilevel LDPC coding recovered by de-mapping 128QAM constellations. FIG. 36 shows the input port of a sorter 440 connected for receiving the soft bits of four-level MLC from the de-mapper 100 and separating it into seven constituent bitstreams. I. e., the multilevel coding is of the form illustrated in FIG. 22. FIG. 36 shows the sorter 440 having first, second, third, fourth, fifth, sixth and seventh output ports connected for supplying the first, second, third, fourth, fifth, sixth and seventh constituent bitstreams of LDPC MLC to the input port of a decoder 441 for the first-level constituent code of the LDPC MLC, to the input port of a decoder 442 for the in-phase second-level constituent code of the LDPC MLC, to the input port of a decoder 443 for the quadrature-phase second-level constituent code of the LDPC MLC, to the input port of a decoder 444 for the in-phase third-level constituent code of the LDPC MLC, to the input port of a decoder 445 for the quadrature-phase third-level constituent code of the LDPC MLC, to the input port of a decoder 446 for the in-phase fourth-level constituent code of the LDPC MLC and to the input port of a decoder 447 for the quadrature-phase fourth-level constituent code of the LDPC MLC, respectively. Typically the sorter 440 is realized by suitable write and read addressing of the plural-bank memory associated with a microprocessor construction of the decoder 101. A plural-bank memory comprising separate buffer memories for the decoders 441, 442, 443, 444, 445, 446 and 447 facilitates concurrent decoding of the seven constituent bitstreams of the LDPC MLC.

FIG. 37 shows apparatus 448 for reading from the separate buffer memories for the decoders 441, 442, 443, 444, 445, 446 and 447 to the input port of the decoder 102 for BCH coding after iterative procedures of decoding the constituent codes of LDPC MLC are completed. This reading is done to time-division multiplex soft output bits generated by the decoders 441, 442, 443, 444, 445, 446 and 447 so as to reproduce bits of the BCH-coded FEC frame in the same temporal order they had originally in the BCH coding supplied to the input port of the sorter 365 in the portion of the transmitter depicted in FIG. 19. These reproduced bits are supplied to the input port of the decoder 102 for BCH coding, either in soft-bit format or alternatively in hard-bit format.

FIG. 38 is a schematic diagram for conceptually illustrating one way to configure the decoder 101 for decoding multilevel LDPC coding recovered by de-mapping 256QAM constellations. FIG. 38 shows the input port of a sorter 450 connected for receiving the soft bits of four-level MLC from the de-mapper 100 and separating it into eight constituent bitstreams. I. e., the multilevel coding is of the form illustrated in FIG. 18. FIG. 38 shows the sorter 450 having first, second, third, fourth, fifth, sixth, seventh and eighth output ports connected for supplying the first, second, third, fourth, fifth, sixth, seventh and eighth constituent bitstreams of LDPC MLC to the input port of a decoder 451 for the in-phase first-level constituent code of the LDPC MLC, to the input port of a decoder 452 for the quadrature-phase first-level constituent code of the LDPC MLC, to the input port of a decoder 453 for the in-phase second-level constituent code of the LDPC MLC, to the input port of a decoder 454 for the quadrature-phase second-level constituent code of the LDPC MLC, to the input port of a decoder 455 for the in-phase third-level constituent code of the LDPC MLC, to the input port of a decoder 456 for the quadrature-phase third-level constituent code of the LDPC MLC, to the input port of a decoder 457 for the in-phase fourth-level constituent code of the LDPC MLC and to the input port of a decoder 458 for the quadrature-phase fourth-level constituent code of the LDPC MLC, respectively. Typically, the sorter 450 is realized by suitable write and read addressing of the plural-bank memory associated with a microprocessor construction of the decoder 101. A plural-bank memory comprising separate buffer memories for the decoders 451, 452, 453, 454, 455, 456, 457 and 458 facilitates concurrent decoding of the eight constituent bitstreams of the LDPC MLC.

FIG. 38 shows apparatus 459 for reading from the separate buffer memories for the decoders 451, 452, 453, 454, 455, 456, 457 and 458 to the input port of the decoder 102 for BCH coding after iterative procedures of decoding the constituent codes of LDPC MLC are completed. This reading is done to time-division multiplex soft output bits generated by the decoders 451, 452, 453, 454, 455, 456, 457 and 458 so as to reproduce bits of the BCH-coded FEC frame in the same temporal order they had originally in the BCH coding supplied to the input port of the supplied to the input port of the sorter 365 in the portion of the transmitter depicted in FIG. 19. These reproduced bits are supplied to the input port of the decoder 102 for BCH coding, either in soft-bit format or alternatively in hard-bit format.

Figure 39:
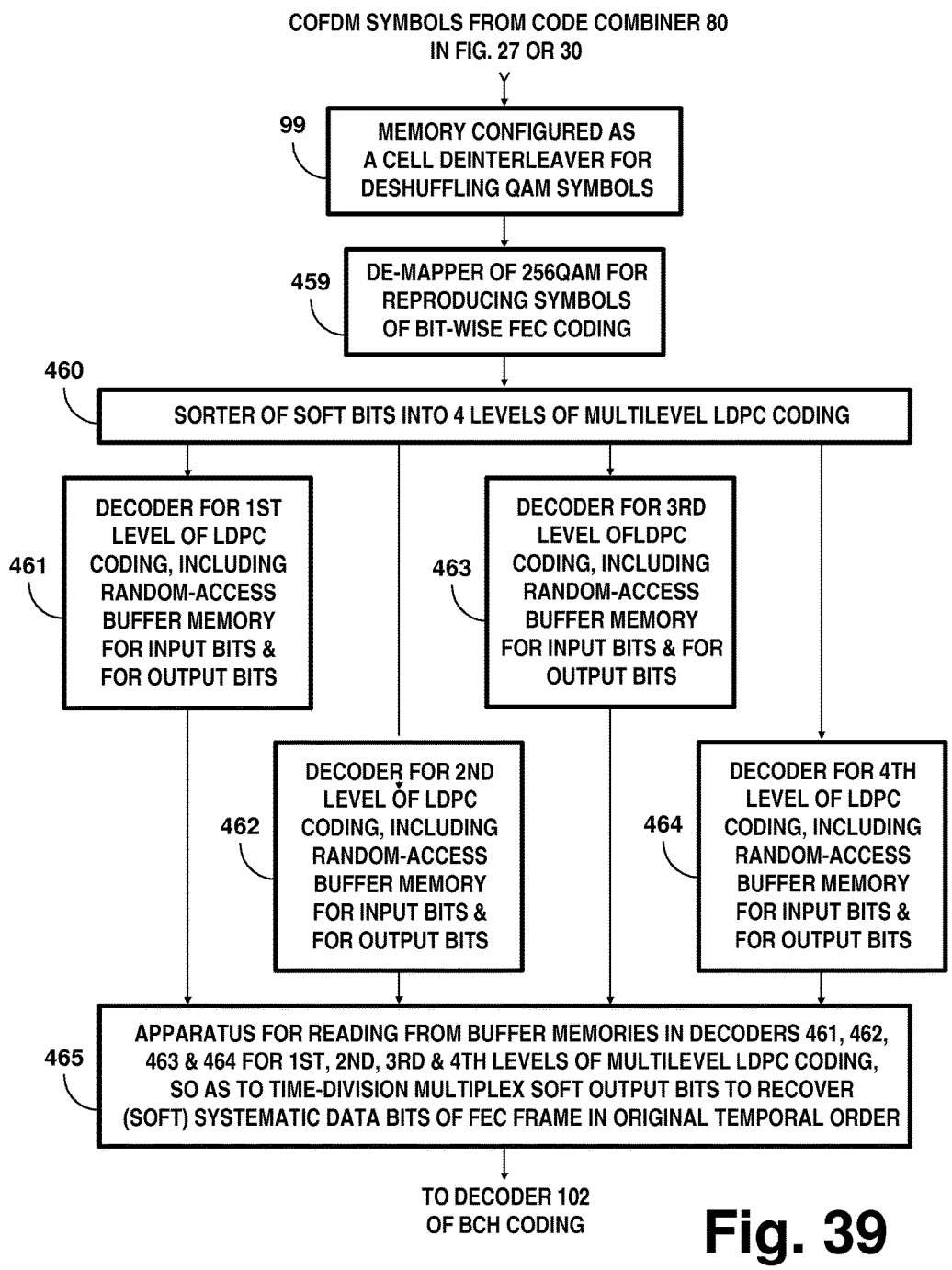
FIG. 39 is a detailed schematic diagram of an alternative embodiment of the part of the FIG. 29 portion of COFDM receiver apparatus for decoding multilevel LDPC coding recovered by de-mapping 256QAM constellations.

FIG. 39 is a schematic diagram for conceptually illustrating another way to configure the decoder 101 for decoding multilevel LDPC coding recovered by de-mapping 256QAM constellations. A de-mapper 459 recovers this MLC by de-mapping 256QAM symbols read from the memory 99 configured as a cell deinterleaver for de-shuffling 256QAM symbols. FIG. 39 shows the output port of the de-mapper 459 connected to the input port of a sorter 460 of the soft bits of multilevel LDPC coding received from the de-mapper 459 into just four bitstreams. I. e., the MLC is of the form illustrated in FIG. 14. FIG. 39 shows the sorter 460 having first, second, third and fourth output ports connected for supplying first, second, third and fourth constituent bitstreams of this MLC to the input port of a decoder 461 for the first-level constituent code of the LDPC MLC, to the input port of a decoder 462 for the second-level constituent code of the LDPC MLC, to the input port of a decoder 463 for the third-level constituent code of the LDPC MLC and to the input port of a decoder 464 for the fourth-level constituent code of the LDPC MLC, respectively. Typically the sorter 460 is realized by suitable write and read addressing of the plural-bank memory associated with a microprocessor construction of the decoder 101. A plural-bank memory comprising separate buffer memories for the decoders 461, 462, 463 and 464 facilitates concurrent decoding of the four levels of LDPC MLC.

FIG. 39 shows apparatus 465 for reading from the separate buffer memories for the decoders 461, 462, 463 and 464 to the input port of the decoder 102 for BCH coding after iterative procedures of decoding constituent LDPC codes are completed. This reading is done to time-division multiplex soft output bits generated by the decoders 461, 462, 463 and 464 so as to reproduce bits of the BCH-coded FEC frame in the same temporal order they had originally in the BCH coding supplied to the input port of the sorter 326 in the portion of the transmitter depicted in FIG. 12. These reproduced bits are supplied to the input port of the decoder 102 for BCH coding, either in soft-bit format or alternatively in hard-bit format.

Figure 40:
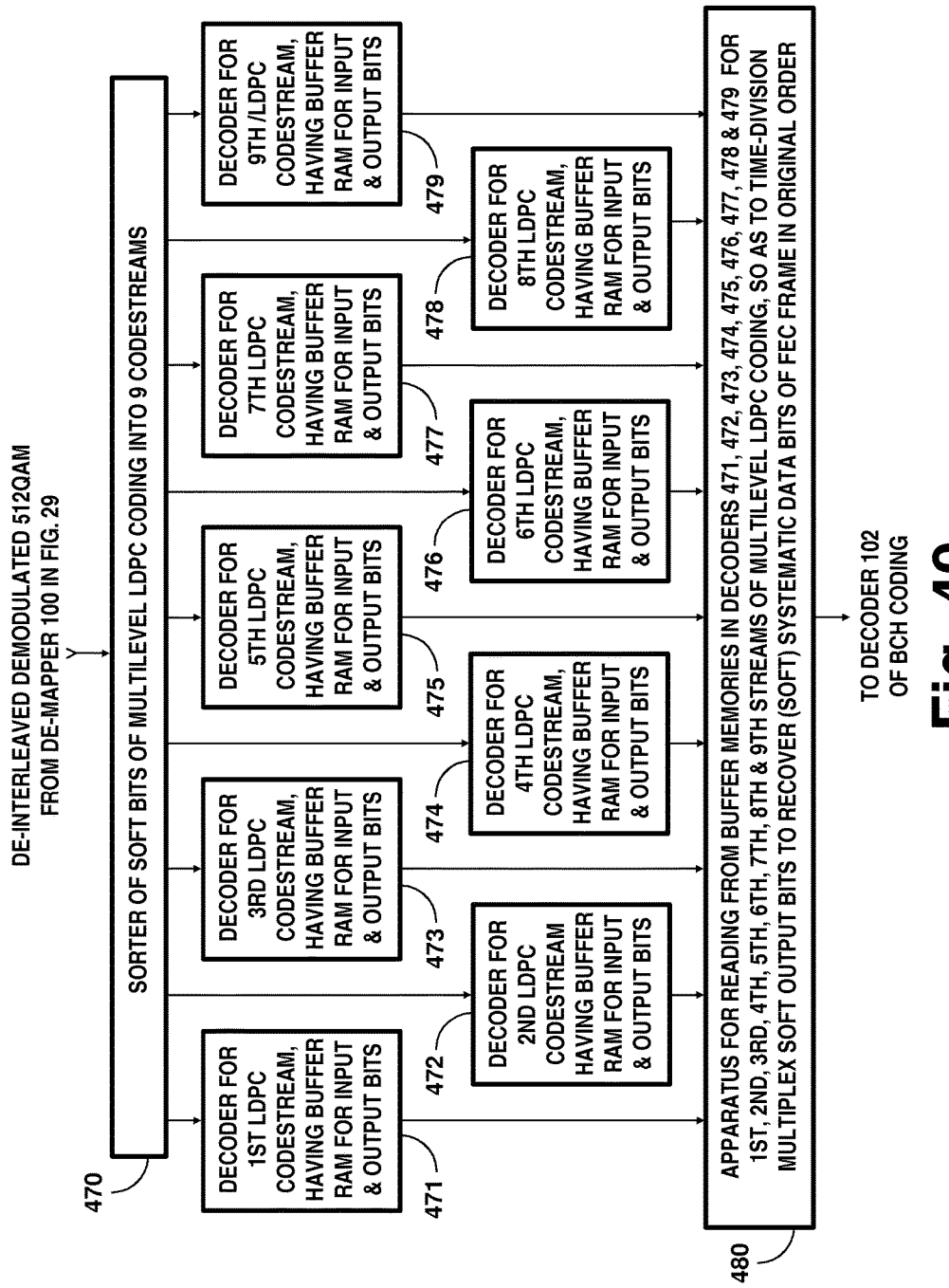
FIG. 40 is a detailed schematic diagram of an embodiment of a part of the FIG. 29 portion of COFDM receiver apparatus for decoding multilevel LDPC coding recovered by de-mapping 512QAM constellations.

FIG. 40 is a schematic diagram for conceptually illustrating a way to configure the decoder 101 for decoding multilevel LDPC coding recovered by de-mapping 512QAM constellations. FIG. 40 shows the input port of a sorter 470 connected for receiving the soft bits of five-level MLC from the de-mapper 100 and separating it into nine constituent bitstreams. I. e., the multilevel coding is of the form illustrated in FIG. 24. FIG. 40 shows the sorter 470 having first, second, third, fourth, fifth, sixth, seventh, eighth and ninth output ports connected for supplying the first, second, third, fourth, fifth, sixth, seventh, eighth and ninth constituent bitstreams of LDPC MLC to the input port of a decoder 471 for the first-level constituent code of the LDPC MLC, to the input port of a decoder 472 for the in-phase second-level constituent code of the LDPC MLC, to the input port of a decoder 473 for the quadrature-phase second-level constituent code of the LDPC MLC, to the input port of a decoder 474 for the in-phase third-level constituent code of the LDPC MLC, to the input port of a decoder 475 for the quadrature-phase third-level constituent code of the LDPC MLC, to the input port of a decoder 476 for the in-phase fourth-level constituent code of the LDPC MLC, to the input port of a decoder 477 for the quadrature-phase fourth-level constituent code of the LDPC MLC, to the input port of a decoder 478 for the in-phase fifth-level constituent code of the LDPC MLC and to the input port of a decoder 479 for the quadrature-phase fifth-level constituent code of the LDPC MLC, respectively. Typically the sorter 470 is realized by suitable write and read addressing of the plural-bank memory associated with a microprocessor construction of the decoder 101. A plural-bank memory comprising separate buffer memories for the decoders 471, 472, 473, 474, 475, 476, 477, 478 and 479 facilitates concurrent decoding of the nine constituent bitstreams of the LDPC MLC.

FIG. 40 shows apparatus 480 for reading from the separate buffer memories for the decoders 471, 472, 473, 474, 475, 476, 477, 478 and 479 to the input port of the decoder 102 for BCH coding after iterative procedures of decoding the constituent codes of LDPC MLC are completed. This reading is done to time-division multiplex soft output bits generated by the decoders 471, 472, 473, 474, 475, 476, 477, 478 and 479 so as to reproduce bits of the BCH-coded FEC frame in the same temporal order they had originally in the BCH coding supplied to the input port of the sorter 370 in the portion of the transmitter depicted in FIG. 23. These reproduced bits are supplied to the input port of the decoder 102 for BCH coding, either in soft-bit format or alternatively in hard-bit format.

Figure 41:
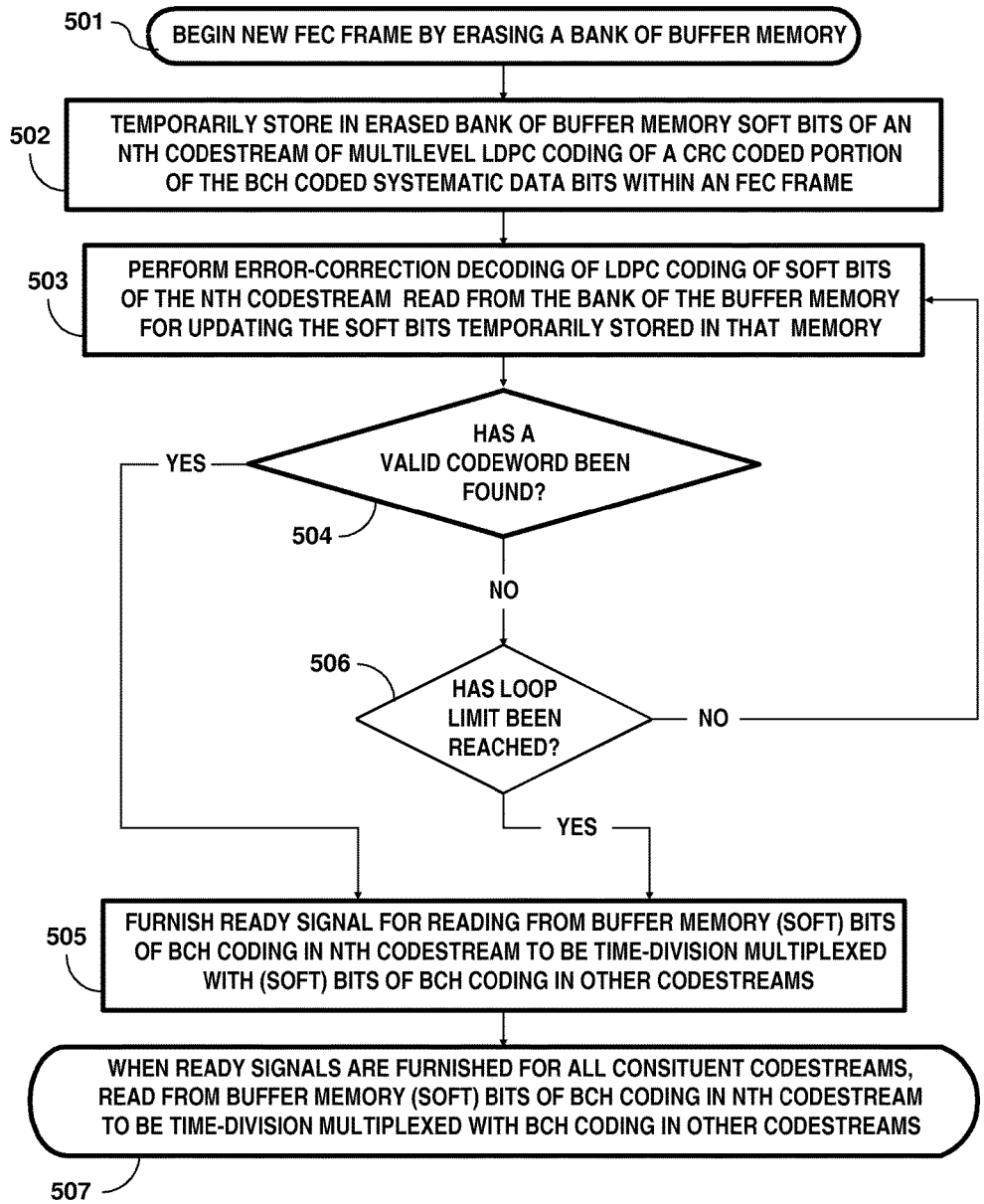
FIG. 41 is a flow chart diagramming the operation of a decoder for a single constituent codestream of the multilevel LDPC coding.

FIG. 41 is a flow chart illustrating operation of one of the decoders for constituent codes of N-level LDPC MLC. Each of the four decoders 401, 402, 403 and 404 depicted in FIG. 33 is preferably configured to operate per the FIG. 41 flow chart. Each of the two decoders 411 and 412 depicted in FIG. 34 is preferably configured to operate per the FIG. 41 flow chart. Each of the six decoders 421, 422, 423, 424, 425 and 426 depicted in FIG. 35 is preferably configured to operate per the FIG. 41 flow chart. Each of the three decoders 431, 432 and 433 depicted in FIG. 36 is preferably configured to operate per the FIG. 41 flow chart. Each of the seven decoders 441, 442, 443, 444, 445, 446 and 447 depicted in FIG. 37 is preferably configured to operate per the FIG. 41 flow chart. Each of the eight decoders 451, 452, 453, 454, 455, 456, 457 and 458 depicted in FIG. 38 is preferably configured to operate per the FIG. 41 flow chart. Each of the four decoders 461, 462, 463 and 464 depicted in FIG. 39 is preferably configured to operate per the FIG. 41 flow chart. Each of the nine decoders 471, 472, 473, 474, 475, 476, 477, 478 and 479 depicted in FIG. 40 is preferably configured to operate per the FIG. 41 flow chart.

Preferably, the buffer memory associated with each decoder for a constituent code of N-level LDPC MLC is divided into two (or more) banks. This allows one of the banks to be loaded with one of the constituent codes of LDPC MLC from a new FEC frame, while the central processing unit (CPU) of the decoder processes the constituent code of LDPC MLC from a prior FEC frame temporarily stored in another bank of the buffer memory. Each cycle of operation of the soft-input/soft-output (SISO) decoder for a constituent code of N-level LDPC MLC starts with a step 501 of beginning a new FEC frame with bulk erasure of a bank of the buffer memory associated with that decoder. In a subsequent step 502 soft bits of the constituent code are written into storage locations in the buffer memory for temporary storage therein.

The step 502 of temporarily storing the constituent code of the LDPC MLC of an FEC frame is followed by a step 503 of decoding the LDPC coding of that constituent code, for updating the soft bits of that constituent code as temporarily stored in the buffer memory. The step 503 of decoding the LDPC coding of the constituent code of the LDPC MLC of an FEC frame is followed by a decision step 504 of deciding whether or not the step 503 of decoding the LDPC coding of that constituent code has generated a valid LDPC codeword. That is, the bits of the decoded LDPC codeword do not contain detectable error.

If the decision in step 504 is that the decoded LDPC codeword is a valid one free from detectable error, the LDPC MLC decoding procedures for the constituent code conclude with the step 505, in which step 505 the LDPC MLC decoder furnishes the apparatus 405, 413, 427, 434, 448, 459, 465 or 480 a signal to indicate that the bits of BCH coding in the constituent code are ready to be read from the buffer memory for the constituent code to the subsequent decoder 102 for BCH coding.

If the decision in step 504 is that the bits of the constituent LDPC codeword generated by the decoding step 103 are in error, this decision is input for a subsequent decision step 506 as to whether a loop limit has been reached in regard to iterative decoding of the constituent code. If the decision in step 506 is that the loop limit has not yet been reached, a subsequent cycle of iterative decoding of the constituent code of LDPC MLC is begun, with operation looping back to a step 503 of decoding the LDPC coding of that constituent code.

A final step 507 is executed when the apparatus 405, 413, 427, 434, 448, 459, 465 or 480 is furnished ready signals to indicate that the bits of BCH coding in all the constituent codes of the multilevel LDPC coding are ready to be read from the buffer memories for them. In step 507 the apparatus 405, 413, 427, 434, 448, 459, 465 or 480 reads from those buffer memories all the bits of BCH coding in original order for application to the input port of the subsequent decoder 102 for BCH coding. FIGS. 33-41 do not explicitly depict the counter arrangements conventionally used for generating write addressing and read addressing for the buffer memories for the decoded constituent LDPC codes. The counting in such counters and the resetting of those counters is controlled by control signals from the timing synchronization apparatus 71, and the polling of respective read outputs from those buffer memories to time-division multiplex them is controlled by further control signals from the timing synchronization apparatus 71. Accordingly, the timing synchronization apparatus 71 includes additional elements beyond just those elements found in the timing synchronization apparatus of a COFDM receiver designed for only receiving BICM (bit-interleaved coded modulation) COFDM signals that are not multi-level coded. Specifically designing arrangements for generating write addressing and read addressing for the buffer memories for the decoded constituent LDPC codes requires considerable effort, but the design of such arrangements can be pedestrian in nature as can the design for polling of respective read outputs of the buffer memories.

A final step 507 is executed when the apparatus 405, 413, 427, 434, 448, 459, 465 or 480 is furnished ready signals to indicate that the bits of BCH coding in all the constituent codes of the multilevel LDPC coding are ready to be read from the buffer memories for them. In step 507 the apparatus 405, 413, 427, 434, 448, 459, 465 or 480 reads from those buffer memories all the bits of BCH coding in original order for application to the input port of the subsequent decoder 102 for BCH coding.

Modifications can be made to the operations illustrated in the FIG. 41 flow chart which sometimes allow the iterative decoding procedure of a multilevel LDPC codeword to be concluded in fewer cycles of decoding. When one or more, but not all, of the decoders of constituent LDPC codes furnish ready signals that respective buffer memories contain successful LDPC coding results the memories may be read each subsequent cycle of decoding. The read-outs from these buffer memories are time-division multiplexed together in an attempt to reproduce a BCH codeword that can be successfully decoded with correction of bits detected as being in error. If such attempt be successful iterative decoding procedure of a multilevel LDPC codeword can be concluded a fewer cycles of decoding earlier.

The DVB-T2 standard prescribes 64,800 bits in the single-level LDPC block coding of a normal FEC Frame and 16,200 bits in the single-level LDPC block coding of a short FEC Frame used for transmissions to mobile receivers. Decoding of FEC Frames of standard normal size and FEC frames of standard small size, as specified by the DVB-T2 standard, is customarily performed using 360 parallel independent decoders or a submultiple of 360 parallel independent decoders for the LDPC block coding. The parity check (H) matrix used for the LDPC block coding in DVB-T2 is designed to be composed of sub-matrices to support respective ones of the 360 parallel independent decoders. If each constituent LDPC code is going to be decoded by a large number of parallelly operated independent decoders anyway, multilevel LDPC coding that uses a single constituent LDPC code for each level of LDPC coding is not particularly advantageous over multilevel LDPC coding that uses separate constituent LDPC codes for the real-axis and imaginary-axis components of each level of LDPC coding.

Multilevel LDPC convolutional coding is more easily accommodated within both the 64,800 bits normal FEC Frame size and the 16,200 bits short FEC Frame size than multilevel LDPC block coding is. LDPC convolutional coding can be decoded using serially concatenated or "pipelined" decoding techniques, rather than having to rely just on parallel independent decoding techniques. Accordingly, LDPC convolutional coding lends itself to being shortened to any length and, if suitably terminated, can perform quite well when corrupted to some degree by AWGN. Performance of LDPC convolutional coding when corrupted to a degree by AWGN can be substantially as good as the performance for the FEC Frame sizes prescribed by DVB-T2 of LDPC block coding corrupted to similar degree by AWGN. Protracted disruptions of the LDPC can render entire LDPC block codewords uncorrectable. However, continuous pipelined serial coding of LDPC convolutional coding can often decode useful information until close to the time a protracted disruption begins and can resume decoding useful information a relatively short while after a protracted disruption concludes.

The 64,800 bits of a normal FEC Frame as specified by the DVB-T2 standard can be divided into four 16,200-bit portions for respective ones of four constituent codes of two levels of LDPC MLC for mapping to 16QAM symbol constellations. The 16,200 bits of a short FEC Frame as specified by the DVB-T2 standard can be divided into four 4,050-bit portions for respective ones of four constituent codes of two levels of LDPC MLC. The four constituent codes of the two-level LDPC MLC can be independently decoded using respective decoders 401, 402, 403 and 404 for LDPC coding in FIG. 33.

FIGS. 42, 43 and 44 illustrate in tabular form a normal FEC frame for each of three representative types of two-level LDPC MLC that can be decoded using the FIG. 33 decoder configuration. Note that the 5/6 LDPC code rate is common to constituent codes in two of the types of two-level LDPC MLC, reducing the number of different LDPC convolutional codes that have to be designed to implement a DTV receiver capable of receiving several types of LDPC MLC having different code rates from each other. The same decoders can be used to decode 5/6 code rate constituent LDPC convolutional codes for more than one LDPC MLC.

The 64,800 bits of a normal FEC Frame as specified by the DVB-T2 standard can be divided into six 10,800-bit portions for respective ones of six constituent codes of three levels of LDPC MLC for mapping to 64QAM symbol constellations. The 16,200 bits of a short FEC Frame as specified by the DVB-T2 standard can be divided into six 2,700-bit portions for respective ones of six constituent codes of three levels of LDPC MLC. The six constituent codes of LDPC MLC are independently decoded using respective decoders 421, 422, 423, 424, 425 and 426 for LDPC coding in FIG. 35.

FIGS. 45, 46 and 47 illustrate in tabular form a normal FEC frame for each of three representative types of three-level LDPC MLC that can be decoded using the FIG. 35 decoder configuration consisting of six component decoders for LDPC coding. Note that the 5/6 LDPC code rate is common to constituent codes in the two types of three-level LDPC MLC illustrated in FIGS. 46 and 47, reducing the number of different LDPC convolutional codes that have to be designed to implement a DTV receiver capable of receiving several types of LDPC MLC having different code rates from each other. The same decoders can be used to decode 5/6 rate constituent LDPCC codes for more than two types of three-level LDPC MLC. The constituent codes with 5/6 code rate are only 10,800 bits long apiece for all three types of three-level LDPC MLC as compared to 16,200 bits long apiece for the two types of two-level LDPC MLC illustrated in FIGS. 42 and 43 that also comprise 5/6 rate constituent LDPC codes. This requires different 5/6 code rate LDPC block codes be designed. Different 5/6 code rate LDPC convolutional codes need not be designed. The 5/6 code rate LDPC convolutional codes each 10,800 bits long can be generated using the same techniques used to generate 5/6 code rate LDPC convolutional codes each 16,200 bits long.

Note that the 11/12 LDPC code rate is common to constituent codes in the types of three-level LDPC MLC illustrated in FIGS. 46 and 47. The same decoders can be used to decode 11/12 rate constituent LDPC convolutional codes for both of these two types of three-level LDPC MLC. The constituent codes with 11/12 code rate are each only 10,800 bits long for each three-level LDPC MLC as compared to 16,200 bits long each for the two-level LDPC MLC with 11/12 code rate illustrated in FIG. 43. This requires different LDPC block codes be designed. Different LDPC convolutional codes need not be designed. The 11/12 code rate LDPC convolutional codes each 10,800 bits long can be generated using the same techniques used to generate 11/12 code rate LDPC convolutional codes each 16,200 bits long.

A 2/3 LDPC code rate is common to constituent codes in the three-level LDPC MLC illustrated in FIG. 46 and in the two-level LDPC MLC illustrated in FIG. 42. The constituent codes with 2/3 code rate are only 10,800 bits long for each three-level LDPC MLC as compared to 16,200 bits long for the two-level LDPC MLC with 2/3 code rate illustrated in FIG. 42. This requires different LDPC block codes be designed. Different LDPC convolutional codes need not be designed. The 2/3 code rate LDPC convolutional codes 10,800 bits long can be generated using the same techniques used to generate 2/3 code rate LDPC convolutional codes 16,200 bits long.

FIGS. 48, 49 and 50 illustrate in tabular form a normal FEC frame for each of three representative types of four-level LDPC MLC that can be decoded using the FIG. 37 decoder configuration consisting of seven component decoders for LDPC coding. To permit division of the normal FEC Frame into seven equal-length constituent codes, the normal FEC Frame is reduced to 64,764 bits from the 64,800 bits prescribed by the DVB-T2 standard. The seven constituent codes of four-level LDPC MLC are then each 9,252 bits long. To permit division of the short FEC Frame into seven equal-length constituent codes, the short FEC Frame will be reduced to 16,191 bits from the 16,200 bits prescribed by the DVB-T2 standard. The seven constituent codes of four-level LDPC MLC are then each 2,313 bits long. The seven constituent codes of LDPC MLC are independently decoded using respective decoders 441, 442, 443, 444, 445, 446 and 447 for LDPC coding in FIG. 37.

The types of four-level LDPC MLC depicted in FIGS. 48, 49 and 50 each comprise 5/6 code rate constituent LDPC codes that are each 9,252 bits long. If these LDPC codes are LDPC convolutional codes, they can be generated using the same techniques used to generate 5/6 code rate LDPC convolutional codes each 16,200 bits long and 10,800 bits long. The types of four-level LDPC MLC depicted in FIGS. 49 and 50 each comprise 11/12 code rate constituent LDPC codes that are each 9,252 bits long. If these LDPC codes are LDPC convolutional codes, they can be generated using the same techniques used to generate 11/12 code rate LDPC convolutional codes each 16,200 bits long or 10,800 bits long.

The four-level LDPC MLC depicted in FIG. 48 comprises 3/4 code rate constituent LDPC codes that are each 9,252 bits long. If these LDPC codes are LDPC convolutional codes, they can be generated using the same techniques used to generate 3/4 code rate LDPC convolutional codes each 10,800 bits long as tabulated in FIG. 45. The four-level LDPC MLC depicted in FIG. 48 comprises 1//2 code rate constituent LDPC codes that are each 9,252 bits long. If these LDPC codes are LDPC convolutional codes, they can be generated using the same techniques used to generate 1/2 code rate LDPC convolutional codes each 10,800 bits long as tabulated in FIG. 45.

The four-level LDPC MLC depicted in FIG. 49 comprises 2/3 code rate constituent LDPC codes that are each 9,252 bits long. If these LDPC codes are LDPC convolutional codes, they can be generated using the same techniques used to generate 2/3 code rate LDPC convolutional codes 16,200 bits long apiece as tabulated in FIG. 42 and 10,800 bits long apiece as tabulated in FIG. 46.

FIGS. 51, 52 and 53 illustrate in tabular form a normal FEC frame for each of three representative types of four-level LDPC MLC that can be decoded using the FIG. 38 decoder configuration consisting of eight component decoders for LDPC coding. The normal FEC Frame is the 64,800 bits prescribed by the DVB-T2 standard and is divided into eight constituent LDPC codes each 8,100 bits long. (The short FEC Frame may be adjusted somewhat from the 16,200 bits prescribed by the DVB-T2 standard to accommodate the 19/20 code rate for certain of the LDPC constituent codes tabulated in FIG. 53.) The eight constituent codes of LDPC MLC are independently decoded using respective decoders 451, 452, 453, 454, 455, 456, 457 and 458 for LDPC coding in FIG. 38.

The types of four-level LDPC MLC depicted in FIGS. 51, 52 and 53 each comprise 11/12 code rate constituent LDPC codes that are each 8,100 bits long. If these LDPC codes are LDPC convolutional codes, they can be generated using the same techniques used to generate 11/12 code rate LDPC convolutional codes 16,200 bits long apiece and 10,800 bits long apiece. The types of four-level LDPC MLC depicted in FIGS. 51, 52 and 53 each comprise 5/6 code rate constituent LDPC codes that are each 8,100 bits long. If these LDPC codes are LDPC convolutional codes, they can be generated using the same techniques used to generate 5/6 code rate LDPC convolutional codes 16,200 bits long apiece and 10,800 bits long apiece.

The types of four-level LDPC MLC depicted in FIGS. 52 and 53 each comprise 2/3 code rate constituent LDPC codes that are each 8,100 bits long. If these LDPC codes are LDPC convolutional codes, they can be generated using the same techniques used to generate 2/3 code rate LDPC convolutional codes 16,200 bits long apiece and 10,800 bits long apiece.

The four-level LDPC MLC depicted in FIG. 52 comprises 3/4 code rate constituent LDPC codes that are each 8,100 bits long. If these LDPC codes are LDPC convolutional codes, they can be generated using the same techniques used to generate 3/4 code rate LDPC convolutional codes each 10,800 bits long as tabulated in FIG. 45. The four-level LDPC MLC depicted in FIG. 52 comprises 1//2 code rate constituent LDPC codes that are each 8,100 bits long. If these LDPC codes are LDPC convolutional codes, they can be generated using the same techniques used to generate 1/2 code rate LDPC convolutional codes each 10,800 bits long as tabulated in FIG. 45.

FIGS. 54, 55 and 56 illustrate in tabular form a normal FEC frame for each of three representative types of five-level LDPC MLC that can be decoded using the FIG. 40 decoder configuration consisting of nine component decoders for LDPC coding. The normal FEC Frame is the 64,800 bits prescribed by the DVB-T2 standard and is divided into nine constituent LDPC codes each 7,200 bits long. The 16,200 bits of a short FEC Frame as specified by the DVB-T2 standard can be divided into nine 1,800-bit portions for respective ones of nine constituent codes of five levels of LDPC MLC. The nine constituent codes of LDPC MLC are independently decoded using respective decoders 471, 472, 473, 474, 475, 476, 477, 478 and 479 for LDPC coding in FIG. 40.

The types of five-level LDPC MLC depicted in FIGS. 54 and 56 each comprise 11/12 code rate constituent LDPC codes that are each 7,200 bits long. If these LDPC codes are LDPC convolutional codes, they can be generated using the same techniques used to generate 11/12 code rate LDPC convolutional codes 16,200 bits long, 10,800 bits long and 8,100 bits long apiece. The types of five-level LDPC MLC depicted in FIGS. 54 and 56 each comprise 5/6 code rate constituent LDPC codes that are each 7,200 bits long. If these LDPC codes are LDPC convolutional codes, they can be generated using the same techniques used to generate 5/6 code rate LDPC convolutional codes 16,200 bits long, 10,800 bits long and 8,100 bits long apiece. The types of five-level LDPC MLC depicted in FIGS. 54 and 56 each comprise 2/3 code rate constituent LDPC codes that are each 7,200 bits long. If these LDPC codes are LDPC convolutional codes, they can be generated using the same techniques used to generate 2/3 code rate LDPC convolutional codes 16,200 bits long, 10,800 bits long and 8,100 bits long apiece.

A 1/3 LDPC code rate is common to constituent codes in the five-level LDPC MLC illustrated in FIG. 54 and in the four-level LDPC MLC illustrated in FIG. 51. The constituent codes with 1/3 code rate are only 7,200 bits long apiece for each five-level LDPC MLC as compared to 8,100 bits long apiece for the four-level LDPC MLC with 1/3 code rate illustrated in FIG. 51. The 1/3 code rate LDPC convolutional codes ech 7,200 bits long can be generated using the same techniques used to generate 1/3 code rate LDPC convolutional codes each 8,100 bits long.

A 23/24 code rate is common to constituent codes in the FIG. 47 three-level LDPC MLC and to constituent codes in the FIG. 55 and FIG. 56 types of five-level LDPC MLC. The constituent codes with 23/24 code rate are only 7,200 bits long apiece for each five-level LDPC MLC as compared to 10,800 bits long apiece for the three-level LDPC MLC with 23/24 code rate illustrated in FIG. 47. The 23/24 code rate LDPC convolutional codes each 7,200 bits long can be generated using the same techniques used to generate the 23/24 code rate LDPC convolutional codes each 10,800 bits long.

A 7/8 LDPC code rate is common to constituent codes in the five-level LDPC MLC illustrated in FIG. 55 and in the three-level LDPC MLC illustrated in FIG. 45. The constituent codes with 7/8 code rate are only 7,200 bits long apiece for each five-level LDPC MLC as compared to 10,800 bits long apiece for the three-level LDPC MLC with 7/8 code rate illustrated in FIG. 45. The 7/8 code rate LDPC convolutional codes each 7,200 bits long can be generated using the same techniques used to generate 7/8 code rate LDPC convolutional codes each 10,800 bits long.

The five-level LDPC MLC depicted in FIG. 55 comprises 3/4 code rate constituent LDPC codes that are each 7,200 bits long. If these LDPC codes are LDPC convolutional codes, they can be generated using the same techniques used to generate 3/4 code rate LDPC convolutional codes 10,800 bits long apiece as tabulated in FIG. 45 and 8,100 bits long apiece as tabulated in FIG. 52. The five-level LDPC MLC depicted in FIG. 55 comprises 1//2 code rate constituent LDPC codes that are each 7,200 bits long. If these LDPC codes are LDPC convolutional codes, they can be generated using the same techniques used to generate 1/2 code rate LDPC convolutional codes 10,800 bits long apiece as tabulated in FIG. 45 and 8,100 bits long apiece as tabulated in FIG. 52.

FIG. 57 tabulates respective LDPC codes for two levels of LDPC-MLC with 3/4 average code rate in a 64,800-bit FEC Frame to be decoded in apparatus of the sort depicted in FIG. 34. The lattice-point labels from the de-mapper 399 of 16QAM are sorted into just two levels of LDPC-MLC for decoding in respective decoders 411 and 412, rather than being sorted further into four constituent codes for decoding in apparatus of the sort depicted in FIG. 33. The code rates of the LDPC codes for the first and second levels are 5/6 and 2/3 respectively just as they were in the two-level LDPC-MLC tabulated in FIG. 42 for decoding in apparatus of the sort depicted in FIG. 33. LDPC code blocks are 32,400 bits long—i. e., twice the length as in each of the separate in-phase and quadrature-phase components of a single level of the two-level LDPC-MLC tabulated in FIG. 42. However, if these LDPC codes are LDPC convolutional codes, they can be generated using the same techniques used to generate the 5/6 and 2/3 code rate LDPC convolutional codes tabulated in FIG. 42.

FIG. 58 tabulates respective LDPC codes for two levels of LDPC-MLC with 7/8 average code rate in a 64,800-bit FEC Frame to be decoded in apparatus of the sort depicted in FIG. 38. The lattice-point labels from the de-mapper 399 of 16QAM are sorted into just two levels of LDPC-MLC for decoding in respective decoders 411 and 412, rather than being sorted further into four constituent codes for decoding in apparatus of the sort depicted in FIG. 33. The code rates of the LDPC codes for the first and second levels are 11/12 and 5/6 respectively just as they were in the two-level LDPC-MLC tabulated in FIG. 43 for decoding in apparatus of the sort depicted in FIG. 33. LDPC code blocks are 32,400 bits long apiece. If these LDPC codes are LDPC convolutional codes, they can be generated using the same techniques used to generate the 11/12 and 5/6 code rate LDPC convolutional codes tabulated in FIG. 43.

FIG. 59 tabulates respective LDPC codes for three levels of LDPC-MLC with 0.708 average code rate in a 64,800-bit FEC Frame to be decoded in apparatus of the sort depicted in FIG. 36. The lattice-point labels from the de-mapper 429 of 64QAM are sorted into just three levels of LDPC-MLC for decoding in respective decoders 431 432 and 433, rather than being sorted further into six constituent codes for decoding in apparatus of the sort depicted in FIG. 35. The code rates of the LDPC codes for the first, second and third levels are 7/8, 3/4 and 1/2 respectively just as they were in the three-level LDPC-MLC tabulated in FIG. 45 for decoding in apparatus of the sort depicted in FIG. 35. LDPC code blocks are 21, 600 bits long apiece—i. e., twice the length as in each of the separate in-phase and quadrature-phase components of a single level of the three-level LDPC-MLC tabulated in FIG. 45. If these LDPC codes are LDPC convolutional codes, they can be generated using the same techniques used to generate the 7/8, 3/4 and 1/2 code rate LDPC convolutional codes tabulated in FIG. 45.

FIG. 60 tabulates respective LDPC codes for three levels of LDPC-MLC with 0.806 average code rate in a 64,800-bit FEC Frame to be decoded in apparatus of the sort depicted in FIG. 36. The lattice-point labels from the de-mapper 429 of 64QAM are sorted into just three levels of LDPC-MLC for decoding in respective decoders 431, 432 and 433. The code rates of the LDPC codes for the first, second and third levels are 11/12, 5/6 and 2/3 respectively just as they were in the three-level LDPC-MLC tabulated in FIG. 49 for decoding in apparatus of the sort depicted in FIG. 37. LDPC code blocks are 21,600 bits long apiece. If these LDPC codes are LDPC convolutional codes, they can be generated using the same techniques used to generate the 11/12, 5/6 and 2/3 code rate LDPC convolutional codes tabulated in FIG. 49.

FIG. 61 tabulates respective LDPC codes for three levels of LDPC-MLC with 0.903 average code rate in a 64,800-bit FEC Frame to be decoded in apparatus of the sort depicted in FIG. 36. The lattice-point labels from the de-mapper 429 of 64QAM are sorted into just three levels of LDPC-MLC for decoding in respective decoders 431, 432 and 433. The code rates of the LDPC codes for the first, second and third levels are 23/24, 11/12 and 5/6 respectively just as they were in the three-level LDPC-MLC tabulated in FIG. 47 for decoding in apparatus of the sort depicted in FIG. 35. LDPC code blocks are 21,600 bits long apiece. If these LDPC codes are LDPC convolutional codes, they can be generated using the same techniques used to generate the 23/24, 11/12 and 5/6 code rate LDPC convolutional codes tabulated in FIG. 47.

FIG. 62 tabulates respective LDPC codes for four levels of LDPC-MLC with 0.688 average code rate in a 64,800-bit FEC Frame to be decoded in apparatus of the sort depicted in FIG. 39. The lattice-point labels from the de-mapper 459 of 256QAM are sorted into just four levels of LDPC-MLC for decoding in respective decoders 461, 462, 463 and 464, rather than being sorted further into eight constituent codes for decoding in apparatus of the sort depicted in FIG. 38. The code rates of the LDPC codes for the first, second, third and fourth levels are 11/12, 5/6, 2/3 and 1/3 respectively just as they were in the four-level LDPC-MLC tabulated in FIG. 51 for decoding in apparatus of the sort depicted in FIG. 38. LDPC code blocks are 16,200 bits long apiece—i. e., twice the length as in each of the separate in-phase and quadrature-phase components of a single level of the four-level LDPC-MLC tabulated in FIG. 51. If these LDPC codes are LDPC convolutional codes, they can be generated using the same techniques used to generate the 11/12, 5/6, 2/3 and 1/3 code rate LDPC convolutional codes tabulated in FIG. 51.

FIG. 63 tabulates respective LDPC codes for four levels of LDPC-MLC with 0.760 average code rate in a 64,800-bit FEC Frame to be decoded in apparatus of the sort depicted in FIG. 39. The lattice-point labels from the de-mapper 459 of 256QAM are sorted into just four levels of LDPC-MLC for decoding in respective decoders 461, 462, 463 and 464. LDPC code blocks are 16,200 bits long apiece. The code rates of the LDPC codes for the first, third and fourth levels are 11/12, 3/4 and 1/2 respectively just as they were in the four-level LDPC-MLC tabulated in FIG. 52 for decoding in apparatus of the sort depicted in FIG. 38. If these LDPC codes are LDPC convolutional codes, they can be generated using the same techniques used to generate the 11/12, 3/4 and 1/2 code rate LDPC convolutional codes tabulated in FIG. 52. The code rate of the LDPC code for the second level is 7/8 and can be generated using the same techniques used to generate the 7/8 code rate LDPC convolutional codes tabulated in FIGS. 45, 55 and 59.

FIG. 64 tabulates respective LDPC codes for four levels of LDPC-MLC with 0.844 average code rate in a 64,800-bit FEC Frame to be decoded in apparatus of the sort depicted in FIG. 39. The lattice-point labels from the de-mapper 459 of 256QAM are sorted into just four levels of LDPC-MLC for decoding in respective decoders 461, 462, 463 and 464. The code rates of the LDPC codes for the second, third and fourth levels are 11/12, 5/6 and 2/3 respectively just as they were in the four-level LDPC-MLC tabulated in FIG. 50 for decoding in apparatus of the sort depicted in FIG. 38. LDPC code blocks are 16,200 bits long apiece. If these LDPC codes are LDPC convolutional codes, they can be generated using the same techniques used to generate the 23/24, 11/12, 5/6 and 2/3 code rate LDPC convolutional codes tabulated in FIG. 50. The code rate of the LDPC code for the first level is 23/24 and can be generated using the same techniques used to generate the 23/24 code rate LDPC convolutional codes tabulated in FIGS. 47, 55, 56 and 61.

The foregoing illustrations of possible LDPC multilevel codes reveal the substantial advantage that constituent LDPC convolutional coding has over constituent LDPC block coding in a COFDM broadcasting system that uses a variety of code rates and quadrature-amplitude-modulates its OFDM carriers in more than one way. Many fewer individual constituent code designs are required for constituent LDPC convolutional coding than for constituent LDPC block coding. The MLC decoding apparatus required in a DTV receiver is accordingly reduced, which is the principal advantage constituent LDPC convolutional coding has over constituent LDPC block coding. There is no need for different LDPC convolutional codes for normal and short sizes of FEC frame.

FIGS. 64, 28 and 65 combine to form a schematic diagram of COFDM receiver apparatus configured for iterative-diversity reception of COFDM signals. The FIG. 64 portion of this receiver apparatus is configured for choosing correct IP packets from initial transmissions of COFDM signals and from final transmissions of COFDM signals. Elements 66-76 and 109 in the FIG. 64 portion of this COFDM receiver apparatus are similar in their structure and operation to correspondingly numbered elements in the FIG. 30 portion of the receiver apparatus depicted in FIGS. 30, 28 and 29, which receiver apparatus is described supra in this specification. FIG. 64 shows the output port of the bank 76 of parallel-to-serial converters connected for supplying a succession of complex coordinates of modulation symbol constellations to the input port of a tri-state buffer amplifier 111 and to the input ports of the de-mappers 91 and 94 in FIG. 28. FIG. 64 further shows the output port of the bank 109 of parallel-to-serial converters connected for supplying a succession of complex coordinates of modulation symbol constellations to the input port of another tri-state buffer amplifier 112. The tri-state buffer amplifiers 111 and 112 are configured to cooperate for providing a time-division multiplexer, their output ports connecting to a common juncture point and thence to and to the write input port of the memory 99 in FIG. 65. The tri-state buffer amplifier 111 is configured for applying successions of complex coordinates of modulation symbol constellations from the final transmissions for iterative-diversity reception and from single-time transmissions to that common juncture point from a relatively low source impedance, so as to be forwarded to the write input port of the memory 99 in FIG. 65. The tri-state buffer amplifier 112 is configured for applying successions of complex coordinates of modulation symbol constellations from the initial transmissions for iterative-diversity reception to that common juncture point from a relatively low source impedance, so as to be forwarded to the write input port of the memory 99 in FIG. 65.

FIG. 65 depicts elements 99-103 configured similarly to the way in which correspondingly numbered elements are configured in FIG. 29. The memory 99 is configured to provide cell de-interleaving and is read to supply the QAM de-mapper 100 the complex coordinates of QAM constellations. The de-mapper 100 responds to them to supply soft bits of FEC coding from its output port to the input port of the decoder 101 for LDPC MLC. The output port of the decoder 101 is connected for supplying soft bits of BCH coding to the input port of the decoder 102 for BCH coding. The output port of the decoder 102 is connected for supplying scrambled systematic data to the input port of the BBFRAME descrambler 103.

FIG. 65 shows the output port of the BBFRAME descrambler 103 connected to the respective input ports of selectors 113 and 114. The selector 113 is configured for selectively reproducing from its output port the BBFRAMEs from the final transmissions for iterative-diversity reception and from single-time transmissions, which BBFRAMEs are supplied to its input port from the output port of the BBFRAME descrambler 103. The selector 114 is configured for selectively reproducing from its output port the BBFRAMEs from the initial transmissions for iterative-diversity reception, which BBFRAMEs are supplied to its input port from the output port of the BBFRAME descrambler 103. The output port of the selector 114 connects to the write-input port of a delay memory 115. The delay memory 115 is configured for supplying from its read-output port a response composed of delayed BBFRAMEs from the initial transmissions for iterative-diversity reception, which delayed BBFRAMEs are concurrent with BBFRAMEs from the final transmissions for iterative-diversity reception supplied from the output port of the selector 113.

FIG. 65 shows the output port of an internet-protocol packet chooser 120 connected for supplying IP packets to the input port of the packet sorter 105 for sorting them according to their PIDs. FIG. 14 shows a first output port of the IP packet sorter 105 connected for supplying video data packets to the input port of apparatus 106 for utilizing video data packets, a second output port of the IP packet sorter 105 connected for supplying audio data packets to the input port of apparatus 107 for utilizing audio data packets, and a third output port of the IP packet sorter 105 connected for supplying ancillary data packets to the input port of apparatus 108 for utilizing ancillary data packets.

The BBFRAMEs from single-time transmissions and from the final transmissions for iterative-diversity reception supplied from the output port of the selector 113 are applied to the input port of a first parser 116 for internet-protocol (IP) packets, the output port of which connects to the input port of a decoder 117 for the CRC-8 coding of the IP packets supplied from the output port of the parser 116. After a delay for as much time as to complete decoding of the CRC-8 coding of the longest permissible IP packet in the BBFRAMEs, the CRC-8 decoder 117 reproduces from a first output port thereof those BBFRAMEs for application to a first of two IP-packet-input ports of the IP packet chooser 120. FIG. 65 also shows a connection from a second output port of the CRC-8 decoder 117 to a first of two error-indicia-input ports of the IP packet chooser 120. This connection conveys an indication as to whether CRC-8 decoding determined that the IP packet currently supplied from the first output port of the CRC-8 decoder 117 is correct or is in error.

The delayed BBFRAMEs from the initial transmissions for iterative-diversity reception, supplied from the read-output port of the delay memory 115 are supplied to the input port of a second parser 118 for internet-protocol (IP) packets, the output port of which connects to the input port of a decoder 119 for the CRC-8 coding of the IP packets supplied from the output port of the parser 118. After further delay for as much time as needed to complete decoding of the CRC-8 coding of the longest permissible IP packet in the delayed BBFRAMEs, the CRC-8 decoder 119 reproduces from a first output port thereof those delayed BBFRAMEs for application to the second IP-packet-input port of the IP packet chooser 120. FIG. 65 also shows a connection from a second output port of the CRC-8 decoder 119 to the second of the error-indicia-input ports of the IP packet chooser 120. This connection conveys an indication as to whether CRC-8 decoding determined that the IP packet currently supplied from the first output port of the CRC-8 decoder 119 is correct or is in error.

If the error indicia that the CRC-8 decoders 117 and 119 supply the IP packet chooser 120 indicate that only one of the IP packets that the CRC-8 decoders 117 and 119 concurrently supply to the IP packet chooser 120 has been determined to be correct, the IP packet chooser 120 is conditioned by these error indicia inputs to reproduce from its output port that IP packet determined to be correct. If the error indicia that the CRC-8 decoders 117 and 119 supply the IP packet chooser 120 indicate that both of the IP packets that the CRC-8 decoders 117 and 119 concurrently supply to the IP packet chooser 120 have been determined to be correct, the IP packet chooser 120 is conditioned by these error indicia inputs to reproduce from its output port an arbitrarily selected one of the IP packets determined to be correct. If the error indicia that the CRC-8 decoders 117 and 119 supply the IP packet chooser 120 indicate that neither of the IP packets that the CRC-8 decoders 117 and 119 concurrently supply to the IP packet chooser 120 has been determined to be correct, the IP packet chooser 120 is conditioned by these error indicia inputs to reproduce from its output port one of the IP packets. This IP packet can be arbitrarily selected.

Alternatively, one or more other conditions is taken into account by the IP packet chooser 120 for determining the choice between the two incorrect IP packets. Pilot carriers energy information in regard to the two incorrect IP packets is apt to be helpful in deciding which of the two incorrect IP packets is to be forwarded to the packet sorter 105. I. e., an incorrect IP packet associated with an apparently normal level of energy of pilot carriers from the selector 748 in the FIG. 32 pilot energy assessment arrangement is chosen, rather than an incorrect IP packet associated with an abnormally low level of energy of pilot carriers.

The contemporaneous operation of the two IP packet parsers 116 and 118 facilitates exchange of information between them concerning when IP packets start. FIG. 65 shows a connection 121 from the IP packet parser 116 to the IP packet parser 118 through which connection 121 the parser 116 can transmit to the parser 118 information concerning when IP packets start. This information is useful to the IP packet parser 118 if a BBFRAME header read thereto from the delay memory 115 has been corrupted so as to destroy indication of the start of the initial IP packet in that BBFRAME, presuming that such indication remains intact in the BBFRAME header supplied to the IP packet parser 116 from the selector 113. Information from the IP packet parser 116 concerning the start of subsequent IP packets in an BBFRAME is useful to the IP packet parser 118 when its daisy-chain computation of the start of a subsequent IP packet in the BBFRAME is disrupted by the header of the preceding IP packet read thereto from the delay memory 115 having been corrupted so as to destroy indication of the start.

FIG. 65 further shows a connection 122 from the IP packet parser 118 to the IP packet parser 116 through which connection 122 the parser 118 can transmit to the parser 116 information concerning when IP packets start. This information is useful to the IP packet parser 116 if a BBFRAME header supplied thereto via the selector 113 has been corrupted so as to destroy indication of the start of the initial IP packet in that BBFRAME, presuming that such indication remains intact in the BBFRAME header read to the IP packet parser 118 from the delay memory 115. Information from the IP packet parser 118 concerning the start of subsequent IP packets in an BBFRAME is useful to the IP packet parser 116 when its daisy-chain computation of the start of a subsequent IP packet in the BBFRAME is disrupted by the header of the preceding IP packet supplied thereto via the selector 113 having been corrupted so as to destroy indication of the start.

Code combining the respective soft complex coordinates of QAM constellations from the two transmissions of the same coded data before channel equalization tends to "fill in" nulls in the transmissions attributable to frequency-selective fading. Accordingly, there is less tendency for noise to be boosted by channel equalization than if the respective soft complex coordinates of QAM constellations from the two transmissions of the same coded data are code combined after channel equalization. The avoidance of noise being boosted in the soft complex coordinates of QAM constellations tends to reduce error in the two-dimensional data-slicing of those coordinates that is part of the procedure for de-mapping those QAM constellations. Receiver configurations in which code combining is done before channel equalization are preferred for somewhat better performance when frequency selective fading affects DTV signal reception. However, receiver configurations in which code combining is done after channel equalization are simpler to implement and may impose slightly less drain on battery power.

The foregoing description has described the complex coordinates of modulation symbol constellations being processed in a single bit stream that alternates in-phase coordinates with quadrature-phase coordinates. In practice, alternative embodiments of the DTV receiver apparatus are apt to be used that process the in-phase coordinates and quadrature-phase coordinates of two-dimensional modulation symbol constellations in parallel in respective bit streams. These alternative embodiments of DTV receiver apparatus are to be considered as embodying aspects of the invention disclosed herein. Also, alternative embodiments of the DTV transmitter are apt to be used that process the in-phase coordinates and quadrature-phase coordinates of two-dimensional modulation symbol constellations in parallel in respective bit streams. These alternative embodiments of DTV transmitter are to be considered as embodying aspects of the invention disclosed herein. These alternative embodiments are to be considered to be equivalents included within the scopes of claims accompanying this specification in accordance with the court-established doctrine of equivalency.

The QPSK, 16QAM, 64QAM, 128QAM, 256QAM and 512AM symbol constellations are representative of two-dimensional modulation symbol constellations that can be used in DTV systems embodying the invention. Over time, only certain ones of these types of modulation symbol constellations may find widespread usage. Other modulation symbol constellations might also be used, such as 1024QAM, 2048QAM or possibly 32 QAM. High-order PSK modulation symbol constellations that employ plural rings of lattice points are also feasible.

The DTV systems described supra may be modified to include further error correction coding. Less preferred DTV systems that embody some of the aspects of the invention modify the DTV systems described supra to omit rotation of the DFT of COFDM symbols during single-time retransmissions. Such modifications sacrifice capability to overcome severe frequency-selective fading, but preserve capability to overcome man-made-noise (MMN) and drop-outs in received signal strength that span the full frequency spectrum of the RF channel. Persons skilled in the art of designing DTV systems are apt to discern that various other modifications and variations can be made in the specifically described apparatus without departing from the spirit or scope of the invention in some of its aspects. Accordingly, it is intended that these modifications and variations of the specifically described apparatus be considered to result in further embodiments of the invention, which are included within the scope of the appended claims and their equivalents.

In the appended claims, the word "said" rather than the word "the" is used to indicate the existence of an antecedent basis for a term being provided earlier in the claims. The word "the" is used for purposes other than to indicate the existence of an antecedent basis for a term appearing earlier in the claims, the usage of the word "the" for other purposes being consistent with customary grammar in the American English language.

The invention claimed is:

1. A method for conveying a bitstream of systematic data from COFDM transmitter apparatus to COFDM receiver appparatus via a plurality of radio-frequency (RF) coded orthogonal frequency-division-multiplexed (COFDM) carrier waves, said method comprising steps of:
   (a) outer coding said bitstream of systematic data to generate successive outer codewords;
   (b) separating each of said successive outer codewords into plural component bitstreams of outer coding, each said component bitstream designed for inclusion in a respective constituent low-density parity-check (LDPC) code of a multilevel code (MLC) designed for quadrature amplitude modulation (QAM) of ones of said RF COFDM carrier waves;
   (c) low-density parity-check coding each said outer-coded component bitstream to generate one of said respective constituent LDPC codes of said MLC;
   (d) mapping interleaved said respective constituent LDPC codes of said MLC to each of successive QAM symbols;
   (e) shuffling the order of the complex coordinates of said successive QAM symbols;
   (f) inverse Fourier transforming said shuffled QAM symbols to baseband COFDM carrier waves;
   (g) converting said baseband COFDM carrier waves upward in frequency to generate said RF COFDM carrier waves;
   (h) broadcasting said RF COFDM carrier waves from said COFDM transmitter apparatus;
   (i) receiving said RF COFDM carrier waves with said COFDM receiver apparatus;
   (j) converting said RF COFDM carrier waves downward in frequency to reproduce said baseband COFDM carrier waves;
   (k) Fourier transforming the reproduced said baseband COFDM carrier waves to reproduce said shuffled QAM symbols;
   (l) deshuffling the reproduced shuffled QAM symbols to reproduce said successive QAM symbols in their original order;
   (m) de-mapping the reproduced said successive QAM symbols in their original order to reproduce said respective constituent LDPC codes of said MLC;
   (n) iteratively decoding each reproduced one of said respective constituent LDPC codes of said MLC to reproduce a respective one of plural component bitstreams of outer coding;
   (o) time-division multiplexing said plural component bitstreams of outer coding as so reproduced to reproduce said successive outer codewords; and
   (p) decoding each said successive outer codewords as so reproduced to reproduce said bitstream of systematic data as originally supplied.

2. A method as set forth in claim 1, wherein said outer coding of said bitstream of systematic data comprises Bose-Chaudhuri-Hocquenghem (BCH) coding.

3. A method as set forth in claim 1, wherein said low-density parity-check coding of each constituent LDPC code of said MLC is low-density parity-check convolutional (LDPCC) coding.

4. A method as set forth in claim 1, wherein said low-density parity-check coding of each constituent LDPC code of said MLC is low-density parity-check block (LDPCB) coding.

5. Coded orthogonal frequency-division-multiplex (COFDM) transmitter apparatus comprising in each of a number at least one of physical layer pipelines:
a respective encoder for outer coding internet-protocol (IP) packets of digital information;
a respective encoder for multilevel LDPC coding of said outer coding in that said physical layer pipeline, said multilevel LDPC coding encoding each level of LDPC coding in accordance with the likelihood of error in mapping to QAM constellations and subsequently demapping said QAM constellations as affected by additive white Gaussian noise; and
a respective mapper for mapping the results of multilevel LDPC coding of said outer coding in that said physical layer pipeline to complex coordinates of each of said QAM constellations in that said physical layer pipeline;
said COFDM transmitter apparatus further comprising:
an assembler for assembling a serial stream of COFDM symbols from said complex coordinates of said QAM constellations, as supplied from the respective mapper in each of said number of physical layer pipelines; and
an OFDM modulator for inverse Fourier transforming said serial stream of COFDM symbols to generate said baseband COFDM carrier waves.

6. COFDM transmitter apparatus as set forth in claim 5, wherein each of said physical layer pipelines further comprises:
a respective cell interleaver for shuffling the order of QAM symbols from said respective mapper for application to said assembler as a respective input signal thereto.

7. COFDM transmitter apparatus as set forth in claim 5, wherein said respective encoder for multilevel LDPC coding within a first of said number of physical layer pipelines generates a respective level of multilevel LDPC coding for each bit place in labeling of lattice points in QAM constellations to which the results of multilevel LDPC coding are mapped by said respective mapper within said first of said number of physical layer pipelines.

8. COFDM transmitter apparatus as set forth in claim 5, wherein said respective encoder for multilevel LDPC coding within a first of said number of physical layer pipelines generates fewer levels of multilevel LDPC coding than bit places in labeling of lattice points in QAM constellations to which the results of multilevel LDPC coding are mapped by said respective mapper within said first of said number of physical layer pipelines.

9. COFDM transmitter apparatus as set forth in claim 5, wherein said respective encoder for multilevel LDPC coding within a first of said number of physical layer pipelines generates half as many levels of multilevel LDPC coding as bit places in Gray labeling of lattice points in square QAM constellations to which the results of multilevel LDPC coding are mapped by said respective mapper within said first of said number of physical layer pipelines.

10. COFDM transmitter apparatus as set forth in claim 5, further comprising in each of said number of physical layer pipelines:
a respective interleaver for shuffling the order of QAM symbols as supplied from said respective mapper in each of said number of physical layer pipelines to said assembler for assembling a serial stream of COFDM symbols.

11. COFDM transmitter apparatus as set forth in claim 5, further comprising in each of said number of physical layer pipelines:
a respective interleaver for shuffling the order of QAM symbols as supplied from said respective mapper in each of said number of physical layer pipelines; and
memory for temporarily storing a number of successive COFDM symbols comprising QAM symbols in shuffled order, said memory configured for supplying said successive COFDM symbols at respective first times to said assembler for assembling a serial stream of COFDM symbols, said memory configured also for supplying said assembler said successive COFDM symbols again at respective second times sequentially interleaved with said first times.

12. Coded orthogonal frequency-division-multiplex (COFDM) receiver apparatus capable of usefully receiving COFDM signals employing multilevel LDPC coding of component carriers to convey a bitstream of systemic data, said COFDM receiver apparatus comprising:
a tuner for receiving and demodulating a selected one of said modulated radio-frequency carrier waves to generate a baseband digitized COFDM signal;
a guard interval remover connected for removing the guard interval from said baseband digitized COFDM signal;
a computer for computing the discrete Fourier transform (DFT) of said baseband digitized COFDM signal from which said guard interval thereof has been removed;
a frequency-domain channel equalizer connected for equalizing components of said DFT to counteract irregularities in the response of the transmission channel to these respective components, thus to generate complex coordinates of QAM symbol constellations;
a de-mapper responsive to said complex coordinates of QAM symbol constellations to recover from an input signal thereto constituent codestreams of said multilevel LDPC coding; and
a decoder for iteratively decoding said constituent codestreams of said multilevel LDPC coding and combining them to recover said bitstream of systemic data.

13. COFDM receiver apparatus as set forth in claim 12, said COFDM receiver apparatus further comprising:
a cell de-interleaver for changing the order of said complex coordinates of QAM symbol constellations supplied from said frequency-domain channel equalizer for application as said input signal to said de-mapper.

14. COFDM receiver apparatus as set forth in claim 12 wherein said digital television information comprises systematic data bits and parity bits of BCH coding in an original order, said COFDM receiver apparatus further comprising:
a decoder responsive to said parity bits of BCH coding for correcting remnant bit errors in said systematic data bits.

15. COFDM receiver apparatus as set forth in claim 12, further comprising:
apparatus for combining initial and final COFDM transmissions of QAM subcarriers conveying multilevel LDPC coding of the same digital television information, thus to generate said complex coordinates of QAM symbol constellations to which said de-mapper is responsive.

16. COFDM receiver apparatus capable of usefully receiving COFDM signals employing multilevel LDPC coding of component carriers to convey a bitstream of systemic data, said COFDM receiver apparatus comprising:
- a tuner for receiving and demodulating a selected one of said modulated radio-frequency carrier waves to generate a baseband digitized COFDM signal;
- a guard interval remover connected for removing the guard interval from said baseband digitized COFDM signal;
- a computer for computing the discrete Fourier transform (DFT) of said baseband digitized COFDM signal from which said guard interval thereof has been removed;
- a frequency-domain channel equalizer connected for equalizing components of said DFT to counteract irregularities in the response of the transmission channel to these respective components, thus to generate complex coordinates of QAM symbol constellations;
- a de-mapper responsive to said complex coordinates of QAM symbol constellations to recover from an input signal thereto constituent codestreams of said multilevel LDPC coding;
- respective decoders for iteratively decoding each constituent codestream of said multilevel LDPC coding to supply a respective decoding result; and
- apparatus for time-division multiplexing said respective decoding results from said respective decoders for decoding each constituent codestream of said multilevel LDPC coding, thus to recover said bitstream of systemic data.

17. COFDM receiver apparatus as set forth in claim 16 wherein said respective decoders for iteratively decoding each constituent codestream of said multilevel LDPC coding are each configured for iteratively decoding LDPC convolutional coding.

18. COFDM receiver apparatus as set forth in claim 16 wherein said respective decoders for iteratively decoding each constituent codestream of said multilevel LDPC coding are each configured for iteratively decoding LDPC block coding.

19. COFDM receiver apparatus as set forth in claim 16 wherein said respective decoders for iteratively decoding each constituent codestream of said multilevel LDPC coding are each configured to halt iterative decoding after a valid codeword LDPC codeword is found or after a prescribed maximum number of soft decoding procedures, whichever first obtains.

20. COFDM receiver apparatus as set forth in claim 16, wherein each said respective decoder for decoding each constituent codestream of said multilevel LDPC coding comprises:
- a respective plurality of parallel independent decoders employing respective parity check matrices that are sub-matrices of the parity check matrix for the constituent LDPC coding of that particular said constituent codestream of said multilevel LDPC coding.

21. COFDM receiver apparatus as set forth in claim 16, said COFDM receiver apparatus further comprising:
- a cell de-interleaver for changing the order of said complex coordinates of QAM symbol constellations supplied from said frequency-domain channel equalizer for application as said input signal to said de-mapper.

* * * * *